(12) United States Patent
Ishikawa et al.

(10) Patent No.: US 11,360,386 B2
(45) Date of Patent: Jun. 14, 2022

(54) ORGANIC EL DISPLAY DEVICE

(71) Applicant: TORAY INDUSTRIES, INC., Tokyo (JP)

(72) Inventors: Akihiro Ishikawa, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 606 days.

(21) Appl. No.: 16/465,939

(22) PCT Filed: Dec. 15, 2017

(86) PCT No.: PCT/JP2017/045150
§ 371 (c)(1),
(2) Date: May 31, 2019

(87) PCT Pub. No.: WO2018/116988
PCT Pub. Date: Jun. 28, 2018

(65) Prior Publication Data
US 2020/0081344 A1    Mar. 12, 2020

(30) Foreign Application Priority Data

Dec. 22, 2016 (JP) .............................. JP2016-248629

(51) Int. Cl.
*H01L 51/00*    (2006.01)
*G03F 7/037*    (2006.01)

(52) U.S. Cl.
CPC .......... *G03F 7/037* (2013.01); *H01L 51/0072* (2013.01)

(58) Field of Classification Search
CPC ............................ G03F 7/037; H01L 51/0072
See application file for complete search history.

(56) References Cited

U.S. PATENT DOCUMENTS

| | | | | |
|---|---|---|---|---|
| 5,851,709 A | * | 12/1998 | Grande | G02B 5/201 430/7 |
| 8,692,256 B2 | | 4/2014 | Noda et al. | |
| 2003/0040559 A1 | | 2/2003 | Hashimoto et al. | |

FOREIGN PATENT DOCUMENTS

| | | |
|---|---|---|
| JP | 9-302265 A | 11/1997 |
| JP | 2008-233751 A | 10/2008 |
| JP | 2013-30293 A | 2/2013 |
| JP | 2013-53274 A | 3/2013 |
| JP | 2013-207124 A | 10/2013 |
| TW | 201540759 A | 11/2015 |
| WO | WO 02/051943 A1 | 7/2002 |
| WO | WO 2016/047483 A1 | 3/2016 |
| WO | WO 2016/143740 A1 | 9/2016 |
| WO | WO 2016/158863 A1 | 10/2016 |

OTHER PUBLICATIONS

International Search Report (PCT/ISA/210) issued in PCT/JP2017/045150, dated Mar. 20, 2018.
Written Opinion (PCT/ISA/237) issued in PCT/JP2017/045150, dated Mar. 20, 2018.

* cited by examiner

*Primary Examiner* — Kuo Liang Peng
(74) *Attorney, Agent, or Firm* — Birch, Stewart, Kolasch & Birch, LLP

(57) ABSTRACT

An organic EL display device having excellent light-emitting reliability while it has pixel division layer (8) and/or planarization layer (4) having excellent optical properties is provided.

An organic EL display device comprising first electrode (10), the pixel division layer (8), light emitting pixel (9), second electrode (5), the planarization layer (4), and substrate (6) wherein the pixel division layer (8) and/or the planarization layer (4) contains a yellow pigment having the benzimidazolone structure represented by the structural formula (1):

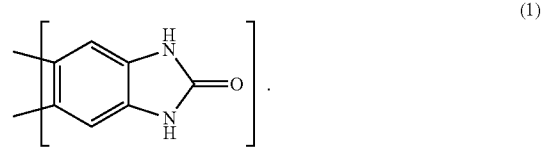

(1)

11 Claims, 4 Drawing Sheets

ORGANIC EL DISPLAY DEVICE

TECHNICAL FIELD

The present invention relates to an organic EL display device.

BACKGROUND ART

For display devices having a thin display such as smart phone, tablet PC, and TV, many products having an organic electroluminescence (EL) display have been developed.

An organic EL display device is a spontaneous light emitting display device wherein the light is emitted by using recombination energy of electron injected from the cathode and the electron hole injected from the anode. The organic light-emitting material used in the light emitting pixel of the organic EL display device is known to have poor resistance to gas components and moisture, and the organic EL display device is known to exhibit poor light-emitting reliability when the device is exposed to such gas components or moisture. In order to improve the light-emitting reliability, it is necessary to not only improve durability of the organic light-emitting material itself but also improve the property of the materials constituting the members surrounding the light-emitting device such as pixel division layer formed on the electrode and planarization layer covering the driver circuit electrode, and there is disclosed an organic EL having the pixel division layer and the planarization layer with a sulfur atom/carbon atom ratio of a particular range (see, for example, Patent Document 1).

Recently, an attempt has been made to improve visibility and contrast of the organic EL display device by imparting light-shielding properties with the pixel division layer and/or the planarization layer to reduce reflection of exterior light such as sun beam. For example, there is disclosed an organic EL display device having a blackened pixel division layer (see, for example, Patent Document 2).

Examples of the composition for forming the blackening pixel division layer of the organic EL display device include a photosensitive composition prepared by mixing pigments having different hues for pseudo blackening, for example, a photosensitive composition containing a red pigment and a blue pigment as the light-shielding material (see, for example Patent Document 3). In the meanwhile, in the field of black matrix in the liquid crystal display device wherein the function of reducing the reflection of the exterior light is required, technique of pseudo blackening by mixing organic pigments is proposed as a technique for substituting carbon black which is a black pigment exhibiting poor insulation properties and high permittivity, and exemplary such techniques that have been disclosed include photosensitive compositions wherein a plurality of pigments comprising a combination of a yellow pigment, blue pigment, and violet pigment or a combination of a yellow pigment, red pigment, and blue pigment is included as the light-shielding material (see, for example Patent Document 4).

PRIOR ART DOCUMENTS

Patent Documents

[Patent Document 1] WO 2016/047483
[Patent Document 2] Japanese Unexamined Patent Publication (Kokai) No. 2013-30293
[Patent Document 3] Japanese Unexamined Patent Publication (Kokai) No. 2013-207124
[Patent Document 4] Japanese Unexamined Patent Publication (Kokai) No. H9-302265

SUMMARY OF THE INVENTION

Problems to be Solved by the Invention

However, when the cured film obtained by photolithographically patterning a photosensitive composition which has been subjected to the pseudo blackening is used for the pixel division layer and/or the planarization layer of an organic EL display device, there has been a problem that at least one of the optical properties of the finally obtained pixel division layer and/or the planarization layer and the light-emitting reliability of the organic EL display device was insufficient. In view of the situation as described above, there has been a strong demand for an organic EL display device which has excellent light-emitting reliability and which also has a pixel division layer and/or a planarization layer exhibiting excellent optical properties.

Means for Solving the Problem

The organic EL display device of the present invention is an organic EL display device comprising a first electrode, a pixel division layer, a light emitting pixel, a second electrode, a planarization layer, and a substrate, wherein the pixel division layer and/or the planarization layer has a yellow pigment having a benzimidazolone structure represented by the following structural formula (1):

[Chemical formula 1]

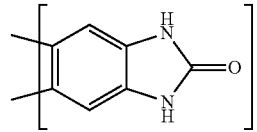

(1)

MERITS OF THE INVENTION

The organic EL display device of the present invention has a pixel division layer and/or a planarization layer having excellent optical properties, and accordingly, a good visibility and high contrast as well as excellent light-emitting reliability are realized.

EMBODIMENTS FOR CARRYING OUT THE INVENTION

Figure 1:
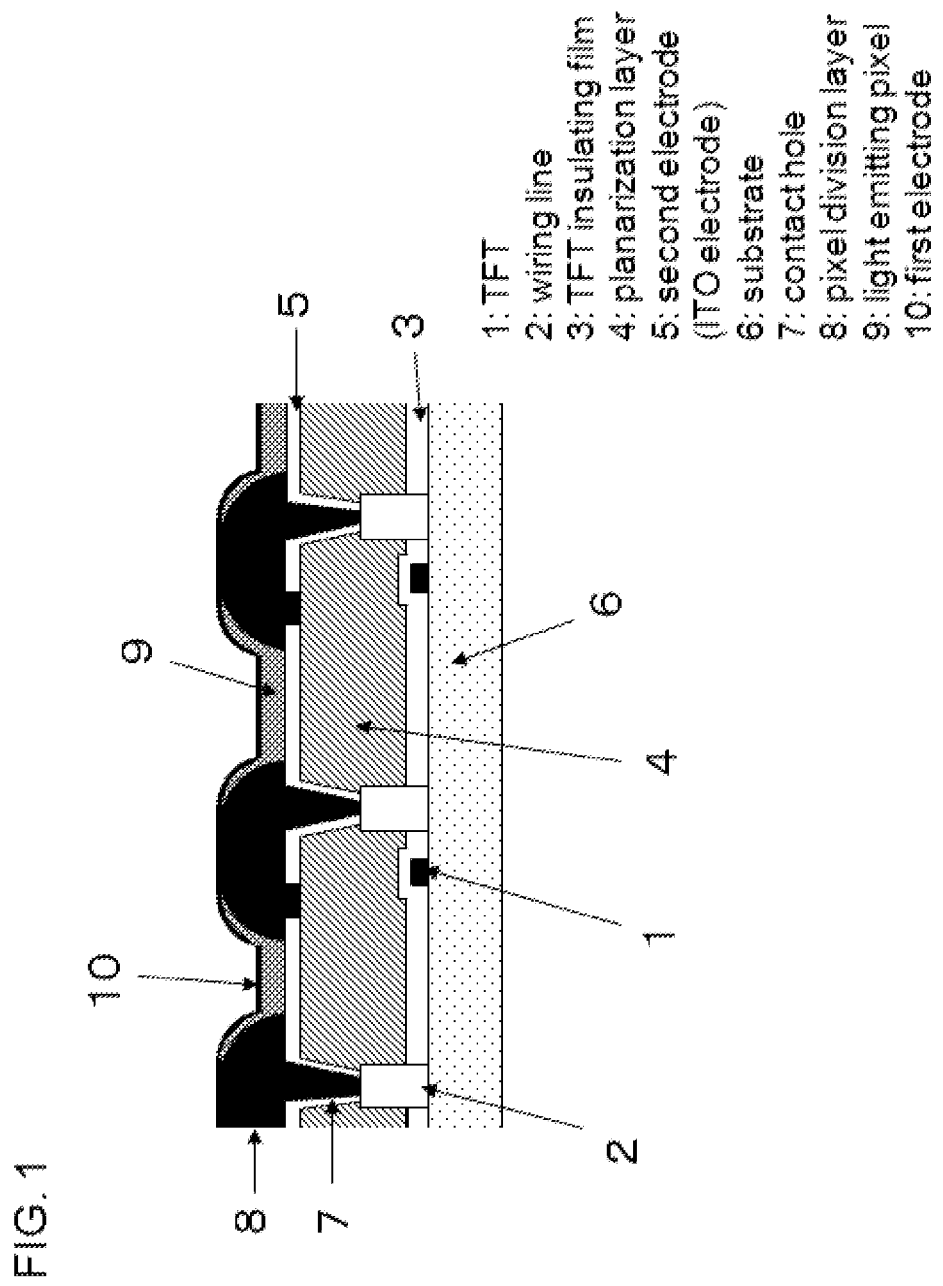
FIG. 1 is a cross sectional view of the TFT substrate of an organic EL display device according to an embodiment of the present invention.

Next, the present invention is described in detail. It is to be noted that, in the description, the value range represented by using "to" is the range including the values before and after the "to" as its minimum and maximum values. In the description, "pixel division layer" is the pixel division layer for the organic EL display device, and the "planarization layer" is the planarization layer for the organic EL display device. The "organic EL display device" includes both rigid organic EL display device which can not be bent and flexible organic EL display device which can be bent. The "light-shielding properties" is an index showing the degree of shielding the light in the wavelength region of 380 to 780 nm which is the visible light region, and higher light-shielding properties correspond to lower light transmittance. The "C.I." used for designating the colorant is the abbreviation for "Colour Index Generic Name", and this "Colour Index Generic Name" indicates chemical structure and crystal form of the pigment or the dye for the colorants registered in the Color Index based on the Colour Index issued by The Society of Dyers and Colourists. In the description, "alkaline developer" designates an organic alkaline aqueous solution unless otherwise noted.

A light-shielding material is a compound which has the function of absorbing the light having a wavelength which is at least a part of visible light wavelength region, and more specifically, a light-shielding material is a pigment or a dye not including the photosensitizer. The name of each type of the light-shielding material is not the one visually evaluated by the inventors of the present invention, and for example, a yellow pigment is a pigment belonging to "C.I. Pigment Yellow" or a pigment derivative derived from such pigment, a blue pigment is a pigment belonging to "C. I. Pigment Blue" or a pigment derivative derived from such pigment, a red pigment is a pigment belonging to "C.I. Pigment Red" or a pigment derivative derived from such pigment, a violet pigment is a pigment belonging to "C. I. Pigment Violet" or a pigment derivative derived from such pigment, and the same applies to orange pigment, brown pigment, green pigment, black pigment, and the like.

After conducing fundamental examination of the problems as described above, the inventors of the present invention found that durability of the light-shielding material (a) incorporated in the photosensitive composition used for the formation of the black pixel division layer and/or planarization layer had influence on the light-emitting reliability of the finally obtained organic EL display device. The decrease of the light-emitting reliability is the phenomenon of the decrease in the light-emitting area of the light-emitting device with the increase in the "ON" time compared to the initial period of the "ON" time when the organic EL display device is continuously kept "ON", and this decrease is associated with the decrease in the brightness, and the value of the display device will decrease with the decrease in the light-emitting reliability. More specifically, the inventors clarified that, when the pseudo blackening is accomplished by mixing two or more types of organic pigments, insufficiency of at least one of the heat resistance and the alkali resistance of the light-shielding material used for realizing the light-shielding properties in the wavelength region of 380 to 450 nm will be the cause of the decrease in the light-emitting reliability. If the light-shielding properties in the wavelength region of 380 to 450 nm is not imparted with the pixel division layer to prevent loss of the light-emitting reliability, the effect of reducing the bluishness of reflected light will be reduced, and also, since the silver/magnesium alloy film which is deposited as the first electrode on the pixel division layer and the planarization layer exhibits higher light transmittance on the shorter wavelength side of the visible light region, the user will feel the bluishness of the reflected light, and this will damage the value of the display device. While the technology of pseudo blackening using two or more pigments with different hues has been markedly advantageous compared to the case prepared by using the black pigment of single type in imparting the desired optical properties with the pixel division layer and/or the planarization layer in view of freely regulating the optical properties of each wavelength region, the optical properties and the light-emitting reliability were in trade-off relationship and their simultaneous realization has been difficult since the light-shielding material suitable for regulating the light-shielding properties in the wavelength region of 380 to 450 nm of the pixel division layer and/or the planarization layer of the organic EL display device has not been found.

In view of the situation as described above, the inventors of the present invention made an intensive study and found that, in an organic EL display device having the first electrode, the pixel division layer, the light emitting pixel, the second electrode, the planarization layer, and the substrate, excellent optical properties and excellent light-emitting reliability can be simultaneously realized when the pixel division layer and/or the planarization layer contains a yellow pigment having the benzimidazolone structure represented by the structural formula (1). The present invention has been completed on the basis of such finding.

To the surprise of the inventors, the problems of the present invention could not be obviated by the sole use of the organic yellow pigments such as C.I. Pigment Yellow 138, 139, and 150 which are pigments that had been well accepted by those skilled in the art to have high heat resistance, light resistance, and chemical resistance and which have long been used in the field of liquid crystal display devices, and it was the yellow pigment having the benzimidazolone structure represented by the structural formula (1) which have been accepted to be inadequate in the field of display devices that proved to be effective. The inventors also found that the light-emitting reliability of the organic EL display device will be maximized by the use of C.I. Pigment Yellow 192 which is a pigment that has so far found limited use only in the kneading-coloring of plastic articles in an utterly different technical field.

In the meanwhile, orange pigments were also candidates of the main component for realizing the light-shielding properties in the wavelength region of 380 to 450 nm besides the yellow pigment. The problems of the present invention, however, could not be obviated by the sole use of an orange pigment having the benzimidazolone structure represented by the structural formula (1). For example, in the case of C.I. Pigment Orange 64 which is a benzimidazolone orange pigment commonly known to exhibit heat resistance under high temperature condition of at least 250° C., this orange pigment became liquid by partial decomposition upon contact with an alkaline developer, and this resulted not only in a decrease of the light-shielding properties in the wavelength region of 380 to 450 nm during the development step but also in the failure in realizing sufficient light-emitting reliability.

In view of the situation as described above, the inventors arrived at the conclusion that selection of the yellow pigment having the benzimidazolone structure represented by the structural formula (1) has dramatic significance in solving the problems of the invention, and completed the invention of an organic EL display device having the pixel division layer and/or the planarization layer containing such a yellow pigment.

The organic EL display device of the present invention has a first electrode, a pixel division layer, a light emitting pixel, a second electrode, a planarization layer, and a substrate. FIG. 1 is a cross sectional view of the TFT substrate in the organic EL display device according to an embodiment of the present invention.

Bottom-gate or top-gate TFTs (1) (thin film transistors) are arranged along lines on the surface of the substrate (6), and a TFT insulating layer (3) is formed so that it covers the TFT (1) and a wiring line (2) connected to the TFT (1). On the surface of the TFT insulating layer (3), a planarization layer (4) is formed, and a contact hole (7) for opening the wiring line (2) is formed in the planarization layer (4). On the surface of the planarization layer (4), a second electrode (5) is formed in a pattern, and this second electrode (5) is connected to the wiring line (2). A pixel division layer (8) is formed to surround the periphery of the pattern of the second electrode (5). The pixel division layer (8) is formed with an opening, and this opening is formed with a light emitting pixel (9) containing an organic EL light-emitting material, and the first electrode (10) is deposited so that it covers the pixel division layer (8) and the light emitting pixel (9). After potting the TFT substrate having the layered constitution as described above under vacuum, a voltage may be directly applied to the light emitting pixel part so that the organic EL display device will emit light.

The light emitting pixel (9) may be an arrangement of pixels of different types having respective light-emitting peak wavelengths in red, blue, or green regions which are the primary colors of light, namely, red, blue, and green or a combination of white light-emitting pixels covering the entire surface with red, blue, and green color filters constituting different laminate members. The peak wavelength of the red region generally displayed is 560 to 700 nm, the peak wavelength of the blue region generally displayed is 420 to 500 nm, and the peak wavelength of the green region generally displayed is 500 to 550 nm, and type of the light emitting pixel is not particularly limited in the organic EL display device of the present invention, and the emitted light may have any peak wavelength. While the second electrode (5) may preferably include a transparent film including ITO (indium tin oxide) and the first electrode (10) may preferably include a film of an alloy such as silver/magnesium, these electrodes may include any substance as long as they function as electrodes. Preferable examples of the organic EL light-emitting material constituting the light emitting pixel include a material obtained by combining a light-emitting layer with a hole transport layer and/or an electron transport layer.

The direction to which the light is taken out of the organic EL display device of the present invention is not particularly limited, and the organic EL display device may be either a bottom-emission-type organic EL display device wherein the light from the light emitting pixel is taken out to the substrate side through the substrate (6) or a top-emission-type organic EL display device wherein the light is taken out to the side opposite to the substrate (6) through the first electrode. If necessary, a metal reflective layer may be further provided between the planarization layer (4) and the second electrode (5) to improve the efficiency of taking the light in one direction. A rigid-type organic EL display device which cannot be bent will be produced by using a hard plate-shaped substrate such as glass substrate while a flexible-type organic EL display device which can be bent will be produced by using a substrate including a highly flexible resin film such as a polyimide film.

The pixel division layer and/or the planarization layer of the organic EL display device of the present invention preferably exhibits minimized difference in the light transmittance for the lights of the visible light region having various wavelengths, namely, minimized wavelength dependency for the light-shielding properties in order to maximize the function of suppressing the exterior light reflection, and the light-shielding material (a) in the pixel division layer and/or the planarization layer preferably contains (a-1) a yellow pigment, a blue pigment, and a red pigment or (a-2) a yellow pigment and a violet pigment. It is to be noted that when the light-shielding material (a) contains a yellow pigment and a violet pigment, its color combination is, by definition, the color combination of (a-2) (a yellow pigment and a violet pigment) even if the combination further contains a light-shielding material for another color.

When the light-shielding material (a) is the combination of (a-1), the yellow pigment is incorporated as a component for shielding the light in the wavelength region of 380 to 450 nm, the blue pigment is incorporated as a component for shielding the light in the wavelength region of 550 to 780 nm, and the red pigment is incorporated as a component for shielding the light in the wavelength region of 450 to 600 nm. The mixing ratio is determined so that desired optical properties are realized in each wavelength region, and pseudo blackening can be accomplished by subtractive mixture.

On the other hand, when the light-shielding material (a) is the combination of (a-2), the yellow pigment is incorporated as a component for shielding the light in the wavelength region of 380 to 450 nm, and the violet pigment is incorporated as a component for shielding the light in the wavelength region 450 to 650 nm. The mixing ratio is determined so that desired optical properties are realized in each wavelength region, and pseudo blackening can be accomplished by subtractive mixture. In this combination of (a-2), a component for shielding the light in the wavelength region of 650 to 780 nm may be further incorporated.

The pixel division layer and/or the planarization layer in the organic EL display device of the present invention contains a yellow pigment having the benzimidazolone structure represented by the following structural formula (1) as the yellow pigment component in the light-shielding material (a). The pixel division layer and/or the planarization layer can be formed by using a photosensitive composition, and when a yellow pigment having the benzimidazolone structure represented by the following structural formula (1) is present as a light-shielding material (a) in the photosensitive composition, a yellow pigment having the benzimidazolone structure represented by the following structural formula (1) will be filled in the film of pixel division layer and/or the planarization layer, and the film will be provided with the light-shielding properties for the light in the wavelength region of 380 to 450 nm.

[Chemical formula 2]

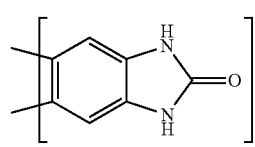

(1)

The yellow pigment having the benzimidazolone structure represented by the structural formula (1) is C.I. Pigment Yellow 120 represented by the following structural formula (2), C.I. Pigment Yellow 151 represented by the following structural formula (3), C.I. Pigment Yellow 154 represented by the following structural formula (30), C.I. Pigment Yellow 175 represented by the following structural formula (4), C.I. Pigment Yellow 180 represented by the following structural formula (5), C.I. Pigment Yellow 181 represented by the following structural formula (6), C.I. Pigment Yellow 192 represented by the following structural formula (7), C.I. Pigment Yellow 194 represented by the following structural formula (8), or a pigment derivative derived from such pigments.

[Chemical formula 3]

(2)

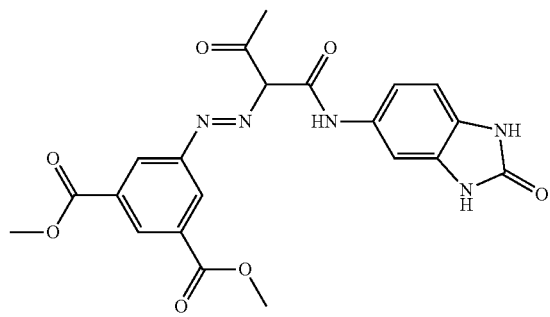

(3)

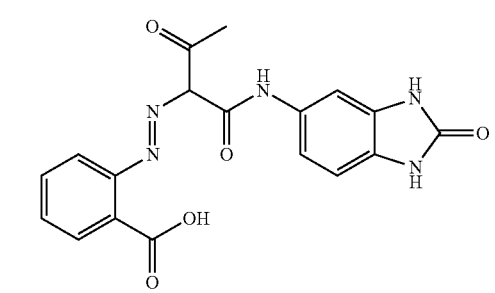

(4)

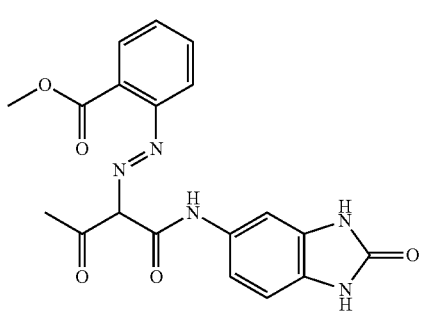

[Chemical formula 4]

(5)

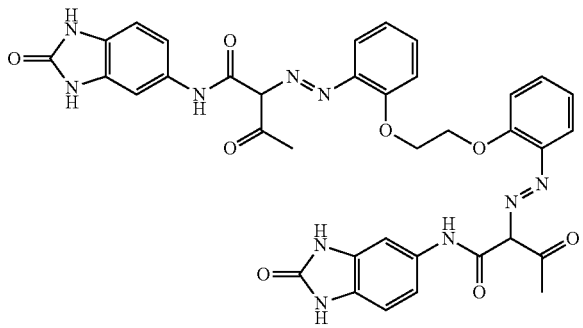

(6)

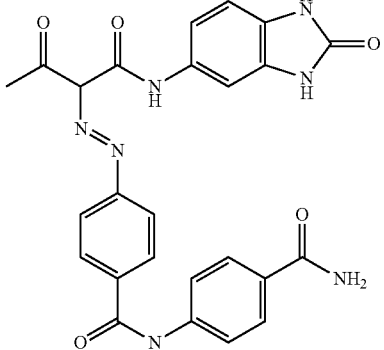

[Chemical formula 5]

(7)

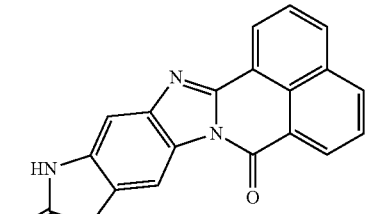

(8)

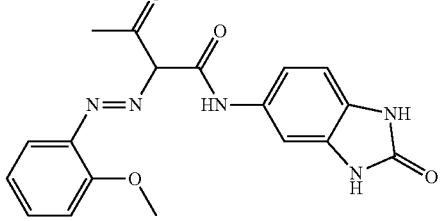

Of these, the more preferred are C.I. Pigment Yellow 120, C.I. Pigment Yellow 181, C.I. Pigment Yellow 192, and C.I. Pigment Yellow 194 in view of the excellent heat resistance and alkali resistance, and the still more preferred is C.I. Pigment Yellow 192. Such yellow pigments having the benzimidazolone structure represented by the structural formula (1) may be used alone or in combination of two or more.

The "heat resistance of the pigment" as used herein corresponds to the degree of the thermal decomposition and/or sublimation when the pigment which is already under the chemical burden by the contact with the alkaline developer is further subjected to the heat treatment in the development step as will be described below, and the higher heat resistance corresponds to the reduced amount of the thermal decomposition product/sublimation product of the pigment generated. Since the dissolution product and/or the decomposition product of the pigment generated by the contact of the pigment with the alkaline is associated in complicated manner with the influence of the heat resistance of the pigment to the light-emitting reliability, the "heat resistance of the pigment" as used herein is different from the heat resistance index of the pigment alone in powder conditions which is common to those skilled in the art without association of the alkaline developer.

The heat resistance temperature required for the pixel division layer and/or the planarization layer of the organic EL display device is preferably at least 200° C., more preferably at least 230° C., and still more preferably at least 250° C., and the gas generation from the pixel division layer and/or the planarization layer in high temperature conditions is preferably minimized in view of improving the light-emitting reliability.

The "alkali resistance of the pigment" as used herein is degree of dissolution and decomposition of the pigment in 2.38% by weight aqueous solution of tetramethylammonium hydroxide which is the alkaline developer used in the development step as will be described below under the conditions of atmospheric pressure and 15° C. to 150° C. The resistance under the conditions of atmospheric pressure and 15° C. to 150° C. is used for the index because the alkaline developer remaining on the surface and/or in the interior of the developed film will have a higher pigment dissolution ability and/or pigment decomposition ability as the developed film is heated in the curing step as will be described below. Accordingly, the "alkali resistance" as used herein includes not only the alkali resistance at normal temperature but also the alkali resistance under heated conditions.

For the index of the alkali resistance of the pigment or the film containing a pigment, use of aqueous solution of an inorganic alkali such as 1 to 10% by weight aqueous solution of sodium hydroxide or 1 to 10% by weight aqueous solution of sodium carbonate under the conditions of atmospheric pressure and 10° C. to 30° C. would be common to those skilled in the art in the light of their common technical knowledge. In the present invention, however, resistance to 2.38% by weight aqueous solution of the tetramethylammonium hydroxide which is a high concentration organic alkaline developer suitable for the formation of the pixel division layer and/or the planarization layer is used for the evaluation standard, and the higher alkali resistance of the pigment corresponds to the reduced generation of the pigment dissolution or decomposition product. It is to be noted that an organic pigment generally exhibits lower resistance to the aqueous solution of an organic alkali compared to resistance to the aqueous solution of an inorganic alkali irrespective of the pH of the aqueous solution.

The yellow pigment having the benzimidazolone structure represented by the structural formula (1) has a rigid crystal structure due to the increased intermolecular interaction by the hydrogen bond of the benzimidazolone structure which results in the strong association of the molecules, and accordingly, it has not only high heat resistance but also high alkali resistance suitable for the light-shielding material (a) used in the pixel division layer and/or the planarization layer of the organic EL display device, and excellent optical properties will be realized without sacrificing the light-emitting reliability. The most characteristic features of the yellow pigment having the benzimidazolone structure represented by the structural formula (1) are that, thanks to the very high durability to the aqueous solution of the organic alkali, it will exhibit the high heat resistance inherent to the pigment species even after contacting with the aqueous solution of an organic alkali in the development step, that it is less likely to promote the deterioration of the organic EL light-emitting material, and that it can improve the light-emitting reliability. In addition, while C.I. Pigment Yellow 120, 151, 175, 180, 181, 192, and 194 and pigment derivatives derived therefrom have molecular structures which are free from the halogen atom or the metal complex structure except for C.I. Pigment Yellow 154, they will sufficiently express the heat resistance required for the pixel division layer and/or the planarization layer, and such feature is also advantageous for improving the light-emitting reliability. With regard to such resistance to aqueous solution of an organic alkali and the elements constituting the pigment molecule, the yellow pigment having the benzimidazolone structure represented by the structural formula (1) is significantly superior for the intended application compared to the organic yellow pigments generally known to have a high heat resistance such as C.I. Pigment Yellow 138 containing many chlorine atoms as the halogen atom or C.I. Pigment Yellow 150 having nickel complex structure for the purpose of improving the durability inherent to the pigment.

More specifically, when the alkaline developer contacts with and penetrates into the film containing the yellow pigment having the benzimidazolone structure represented by the structural formula (1) in the development step during the formation of the pixel division layer and/or the planarization layer, dissolution and/or decomposition of the pigment is suppressed, and the remaining of the dissolution and/or decomposition product derived from the pigment in the interior of the pixel division layer and/or the planarization layer is suppressed, and as a result, light-emitting reliability is improved. In addition, since excessive penetration of the developer into the developed film as will be described below will be suppressed and the film strength in the development step will be maintained at a high level, local peeling of the developed film which results in the generation of development residue on the opening will be reduced and the light-emitting reliability will be further improved. The opening in the pixel division layer is the site which will be the light emitting pixel part in the organic EL display device of the present invention, and this part is directly related to the display quality, and therefore, the development residue should be minimized in the formation of the pixel division layer.

The phenomena of dissolution and/or decomposition induced by the exterior burden such as heat and/or alkali is caused by the breakage of its crystalline structure and/or molecular structure, and such phenomena will be associated with an inconsistent discoloration and fading in the in-plane direction in the process of forming the pixel division layer and/or the planarization layer, and accordingly, the pigment in the light-shielding material (a) preferably has a higher alkali resistance in view of realizing the desired optical properties in a productive and stable manner.

An exemplary method used for introducing the benzimidazolone structure represented by the structural formula (1) in the synthesis of the yellow pigment is a method wherein a pigment intermediate having the benzimidazolone structure is used as a part of the starting materials for the synthesis. For example, reaction with various diazonium salt may be conducted by using 5-acetoacetylamino benzimidazolone represented by the following structural formula (9) for the pigment intermediate to synthesize a pigment crude, and C.I. Pigment Yellow 120, C.I. Pigment Yellow 151, C.I.

Pigment Yellow 154, C.I. Pigment Yellow 175, C.I. Pigment Yellow 180, C.I. Pigment Yellow 181, and C.I. Pigment Yellow 194 as described above may be obtained by the following pigment production step including washing with water, pulverization, and classification. If a pigment synthesized by the azo coupling is selected from such pigments, the pigment is preferably one having the halogen impurities from the diazonium salt removed to the maximum extent.

[Chemical formula 6]

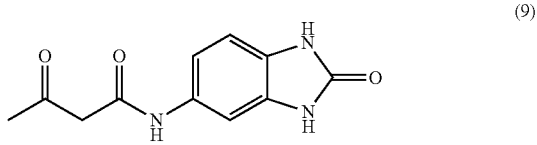

(9)

Alternatively, 5,6-diaminobenzimidazolone represented by the following structural formula (10) may be used for the pigment intermediate to synthesize the pigment crude, and then, a pigment production step may be conducted to obtain C.I. Pigment Yellow 192 represented by the structural formula (7). The C.I. Pigment Yellow 192 has a rigid condensed polycyclic structure having the structure derived from the 1,8-naphthalenedicarboxylic anhydride represented by the following structural formula (11) and benzimidazolone structure, and therefore, it has very high heat resistance and alkali resistance.

[Chemical formula 7]

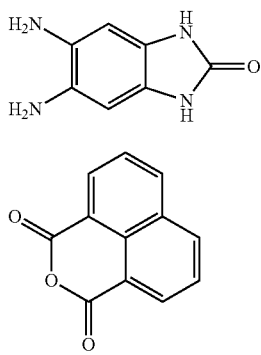

(10)

(11)

Content of the yellow pigment is preferably at least 10% by weight and more preferably at least 15% by weight in all pigments of the photosensitive composition for forming the pixel division layer and/or the planarization layer irrespective of whether the combination is the combination of (a-1) or the combination of (a-2) in order to realize sufficient light-shielding properties in the wavelength region of 380 to 450 nm. In the meanwhile, content of the yellow pigment is preferably up to 40% by weight and more preferably up to 35% by weight in all pigments of the photosensitive composition in view of suppressing generation of non-light-emitting sites in the light emitting pixel part when the organic EL display device of the present invention is driven by avoiding breakage of the electrode deposited on the pixel division layer by suppressing the pattern edge peeling in the formation of the pixel division layer and/or the planarization layer and reducing the taper of the pattern edge.

Content of the yellow pigment having the benzimidazolone structure represented by the structural formula (1) is preferably at least 50% by weight, more preferably at least 80% by weight, and still more preferably 100% by weight in all yellow pigments of the photosensitive composition in view of the light-emitting reliability.

Examples of the yellow pigment not having the benzimidazolone structure represented by the structural formula (1) include C.I. Pigment Yellow 12, 13, 17, 20, 24, 74, 83, 86, 93, 95, 109, 110, 117, 125, 129, 137, 138, 139, 147, 148, 150, 153, 155, 166, 168, 185, 191, 193, and 199, and these yellow pigments may be used alone or in combination of two or more, if desired, and an adequate amount may be used to the extent not adversely affecting the light-emitting reliability.

The yellow pigment having the benzimidazolone structure represented by the structural formula (1) in the pixel division layer and/or the planarization layer in the organic EL display device of the present invention may also be a pigment derivative represented by the following general formula (12), and such a pigment derivative may be incorporated as a part or as a dispersion aid of the light-shielding material (a).

[Chemical formula 8]

(12)

(In the general formula (12), Bz represents a residue of the pigment belonging to the "C.I. Pigment Yellow" of the organic pigments having the benzimidazolone structure represented by the structural formula (1). The substituent Y containing sulfur atom and/or nitrogen atom represents sulfonate group, metal salt of sulfonate group, ammonium salt of sulfonate group, sulfonamide group, and/or phthalimide alkyl group which is not limited for the position where it is bonded to Bz. The number of substituents, n, is an integer which is 1 or 2.)

The pigment derivative represented by the general formula (12) may be synthesized, for example, by a known derivatization treatment such as sulfonation, neutralization, sulfonamidation, or phthalimide alkylation by using C.I. Pigment Yellow 120, 151, 175, 180, 181, 192, or 194 for the starting material. Examples of the preferable pigment derivatives represented by the general formula (12) include the monosulfonation product represented by the following structural formula (13) obtained by sulfonation using C.I. Pigment Yellow 194 for the starting material and the monosulfonation product represented by the following structural formula (14) obtained by sulfonation using C.I. Pigment Yellow 192 for the starting material. It is to be noted that, in the general formula (12), "the substituent Y containing sulfur atom and/or nitrogen atom is not limited for the position where it is bonded to Bz" includes the case wherein the substituent Y is directly bonded to the carbon atom in the aromatic ring and/or the nitrogen atom in the heterocycle of the benzimidazolone structure represented by the structural formula (1) and the case wherein a plurality of molecules each having different bonding position are mixed.

[Chemical formula 9]

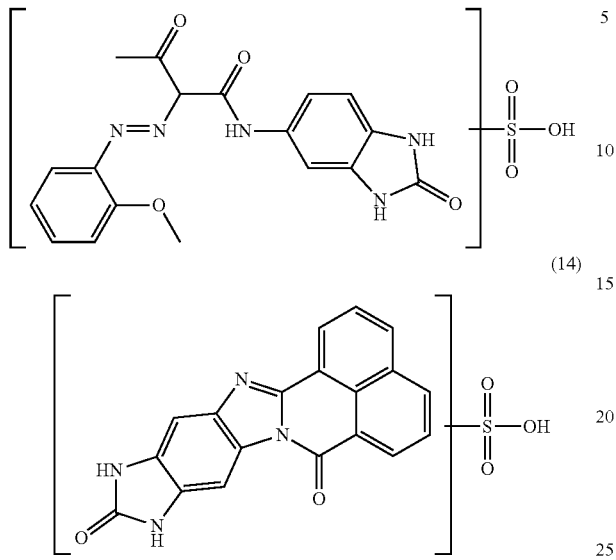

The pigment derivative represented by the general formula (12) may be used by adding and kneading in the course of wet pulverization treatment such as solvent salt milling as will be described below for preliminarily loading the pigment derivative on the surface of the non-derivatized organic pigment or by adding in the course of wet media dispersion treatment as will be described below for use as a dispersion aid. It is to be noted that, since the pigment derivative represented by the general formula (12) does not lose the light-shielding properties inherent in the pigment by the derivatization, it can function as the component contributing to the improvement in the light-shielding properties.

When a pigment other than the yellow pigment is further incorporated as a light-shielding material (a) in the photosensitive composition for forming the pixel division layer and/or the planarization layer of the organic EL display device of the present invention, a pigment other than the yellow pigment will be added to the film of the pixel division layer and/or the planarization layer and this contributes to the improvement in the light-shielding properties.

When the light-shielding material (a) contains the combination of (a-2), namely, a yellow pigment, a blue pigment, and a red pigment, the blue pigment used may be an organic blue pigment or an inorganic blue pigment, and use of an organic blue pigment is preferable in view of the low permittivity. Examples include C.I. Pigment Blues 15:1, 15:2, 15:3, 15:4, 15:6, 16, 60, 64, 65, 75, 79, and 80, which may be used alone or in combination of two or more. Of these, the blue pigment is preferably at least one member selected from the group consisting of the blue pigment represented by the following structural formula (15), C.I. Pigment Blue 15:3 and 15:4 which are β copper phthalocyanine blue, C.I. Pigment Blue 15:6 which is ε copper phthalocyanine blue, and the blue pigment represented by the following structural formula (16), and C.I. Pigment Blue 60 which is a indanthrone blue in view of the high heat resistance and high alkali resistance. It is to be noted that the blue pigment preferably contains at least 50% by weight of C.I. Pigment Blue 60 in view of the high light transmittance in the region of exposure light and improving the sensitivity in the exposure step as will be described below.

[Chemical formula 10]

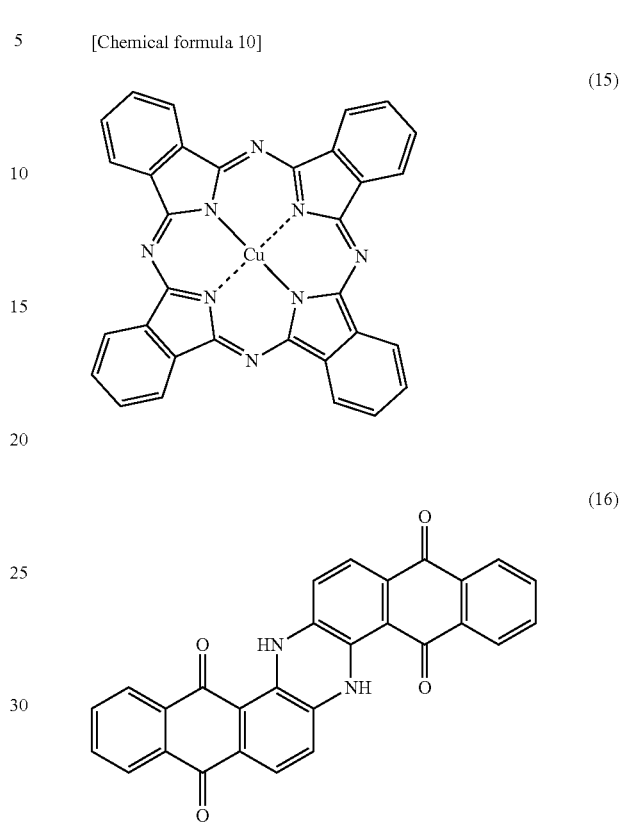

Content of the blue pigment is preferably at least 15% by weight and more preferably at least 30% by weight of all pigments in the photosensitive composition when the light-shielding material (a) includes the combination of (a-1) in view of sufficiently shielding the light in the wavelength region of 550 to 780 nm. The content is preferably up to 70% by weight and more preferably up to 60% by weight in view of the sensitivity in the exposure step.

In addition, the blue pigment in the light-shielding material (a) may contain a pigment derivative derived from a blue pigment.

The red pigment used may be an organic red pigment or an inorganic red pigment, and the preferred is the organic red pigment in view of the low permittivity. Examples include C.I. Pigment Red 9, 48, 97, 122, 123, 144, 148, 149, 166, 168, 177, 179, 180, 190, 192, 196, 202, 209, 215, 216, 217, 220, 223, 224, 226, 227, 228, 240, and 254, which may be used alone or in combination of two or more. Of these, the red pigment is preferably at least one member selected from the group consisting of C.I. Pigment Red 123 which is a perylene red pigment represented by the following structural formula (17), C.I. Pigment Red 149 which is a perylene red pigment represented by the following structural formula (18), C.I. Pigment Red 177 which is an anthraquinone red pigment represented by the following structural formula (19), C.I. Pigment Red 179 which is a perylene red pigment represented by the following structural formula (20), and C.I. Pigment Red 190 which is a perylene red pigment represented by the following structural formula (21) in view of the high heat resistance, high alkali resistance, and absence in the structure of the halogen atom which would be the cause of the decrease in the light-emitting reliability. It is to be noted that the red pigment preferably contains at least 50% by weight of C.I. Pigment Red 179 and/or 190 in view of the high coloring ability and improving the light-shielding properties per unit content.

[Chemical formula 11]

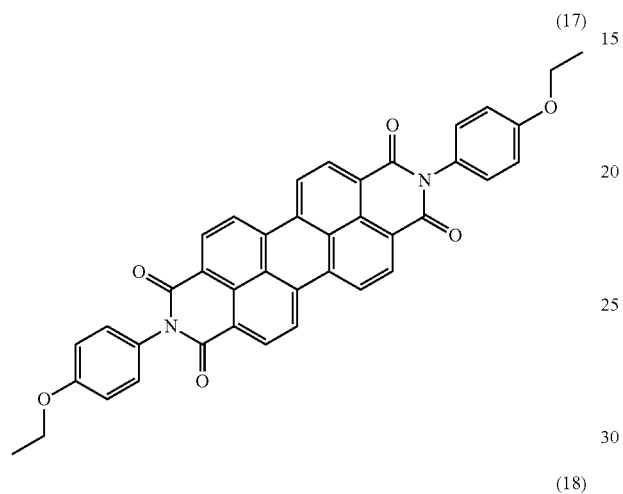

(17)

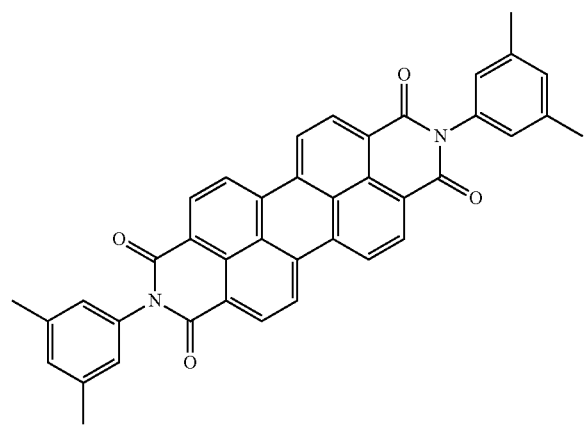

(18)

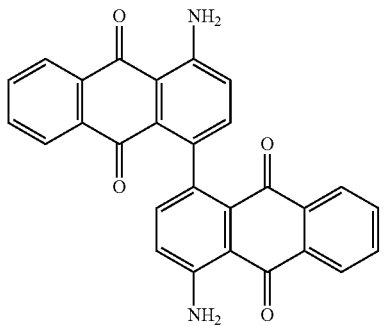

[Chemical formula 12]

(19)

[Chemical formula 13]

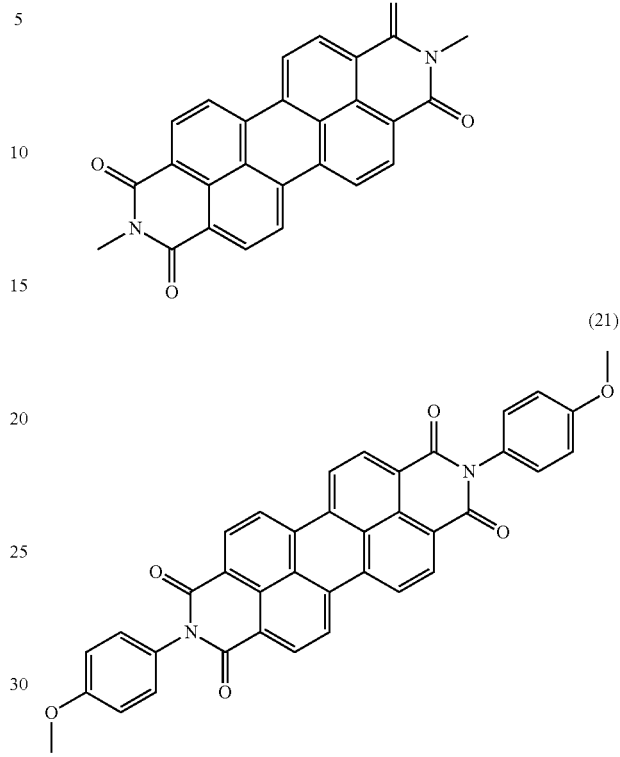

(20)

(21)

Content of the red pigment is preferably at least 10% by weight and more preferably at least 20% by weight of all pigments in the photosensitive composition when the light-shielding material (a) include the combination of (a-1) in view of sufficiently shielding the light in the wavelength region of 450 to 600 nm. The content is preferably up to 60% by weight and more preferably up to 50% by weight in view of the optical density as will be described below. In addition, the red pigment in the light-shielding material (a) may contain a pigment derivative derived from a red pigment.

When the (a) light-shielding material contains the combination of (a-2), namely, a yellow pigment and a violet pigment, the violet pigment used may be an organic violet pigment or an inorganic violet pigment, and use of an organic violet pigment is preferable in view of the low permittivity. Examples include C.I. Pigment Violet 19, 23, 29, 30, 32, 37, 40, and 50, which may be used alone or in combination of two or more. Of these, the violet pigment is preferably at least one member selected from the group consisting of C.I. Pigment Violet 19 which is a quinacridone violet pigment represented by the following structural formula (22), C.I. Pigment Violet 29 which is a perylene violet pigment represented by the following structural formula (23), and C.I. Pigment Violet 37 which is a dioxazine violet pigment represented by the following structural formula (24) in view of the high heat resistance, high alkali resistance, and absence in the structure of the halogen atom which would be the cause of the decrease in the light-emitting reliability. In addition, the violet pigment preferably contains at least 50% by weight of C.I. Pigment Violet 19 and/or 29 in view of the high dispersibility. The C.I. Pigment Violet 19 as used herein is preferably a β crystal having violet hue with strong blueness or a mixed crystal containing at least 50% by weight of β crystal.

[Chemical formula 14]

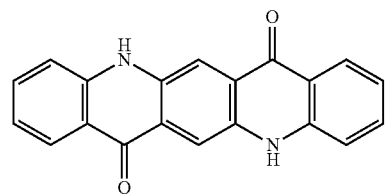

(22)

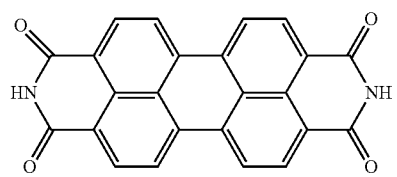

(23)

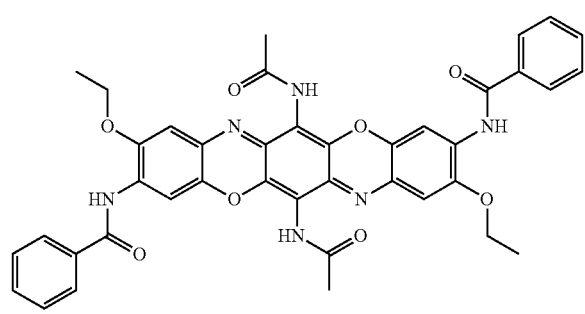

(24)

Content of the violet pigment is preferably at least 30% by weight, and more preferably at least 40% by weight of all pigments in the photosensitive composition in view of sufficiently shielding the light in the wavelength region of 450 to 650 nm. The content is preferably up to 90% by weight, and more preferably up to 80% by weight in view of the balance with the light-shielding material component shielding the light other than the wavelength region of 450 to 650 nm and realizing excellent optical properties. In addition, the violet pigment in the light-shielding material (a) may contain a pigment derivative derived from a violet pigment.

For the combination of (a-2), the light shielding properties at the wavelength in the range of 650 to 780 nm may be improved by simultaneously using a blue pigment. The blue pigment used in such a case is preferably at least one organic blue pigment selected from the group consisting of C.I. Pigment Blue 15:3, 15:4, 15:6, and 60.

The optical properties of the pixel division layer may be finely adjusted by also incorporating a pigment other than the yellow pigment, blue pigment, red pigment, and violet pigment as described above and/or dyes having various hues as the light-shielding material (a). Preferred is use of a pigment for the high coloring property and the high light-shielding properties per unit weight, and the more preferred is an organic pigment for the low permittivity and high insulation properties. However, the total number of the pigments incorporated is preferably up to 6, more preferably up to 5, and still more preferably up to 4 in view of stabilizing storage stability and optical properties of the photosensitive composition irrespective of whether the light-shielding material (a) is a combination of (a-1) or the combination of (a-2).

Examples of the organic black pigment include C.I. Pigment Black 7, 31, and 32, and examples of the organic orange pigment include C.I. Pigment Orange 36, 43, 71, and 73. Examples of the organic green pigment include C.I. Pigment Green 7, 36, 58, and 59, and examples of the organic brown pigment include C.I. Pigment Brown 25, 26, and 28. Examples of the inorganic black pigment include titanium blacks such as titanium nitride and titanium oxynitride. Examples of the carbon black corresponding to C.I. Pigment Black 7 include lamp black, acetylene black, thermal black, channel black, and furnace black which are classified by the production method.

Exemplary black dyes include C.I. Solvent Black 5 and 7, and C.I. Acid Black 2, and exemplary yellow dyes include C.I. Solvent Yellow 114, Direct Yellow 33, 34, 35, 39, 50, 54, 69, and 70, and C.I. Acid Yellow 3. Exemplary blue dyes include C.I. Solvent Blue 122, C.I. Direct Blue 77, 90, 93, 94, 95, 100, 101, 150, 153, 187, and 189, C.I. Basic Blue 1, 5, 7, and 8, and C.I. Acid Blue 59 and 102, and exemplary red dyes include C.I. Solvent Red 88 and C.I. Direct Red 82, 83, 84, 98, 99, 106, 107, 172, 176, and 181. Exemplary violet dyes include C.I. Direct Violet 47, 52, 54, and 60 and C.I. Basic Violet 1, 2, 3, 4, 7, 10, 13, 14, 15, 16, and 20 and exemplary green dye include C.I. Direct Green 27, 34, and 65 and C.I. Basic Green 1 and 4.

Content of the light-shielding material (a) in the pixel division layer and/or the planarization layer of the organic EL display device of the present invention is preferably at least 5% by weight and more preferably at least 10% by weight of the entire solid content in view of realizing sufficient light-shielding properties in the visible light region. The content is also preferably up to 70% by weight and more preferably up to 50% by weight in view of guaranteeing sufficient storage stability of the photosensitive composition for forming the pixel division layer and/or the planarization layer, and realizing sufficient sensitivity to the exposure and sufficient developability.

The pigment, the pigment derivatives, and the dye incorporated as light-shielding materials (a) contained in the pixel division layer and/or the planarization layer in the organic EL display device of the present invention or in the photosensitive composition used for the formation thereof may be identified in terms of its chemical structure and crystal form, and hence, Color Index number by the combination of NMR, ICP mass spectrometry, infrared absorption spectrum, time-of-flight mass spectrometry (TOF-MS), and powder X-ray diffraction by CuKα ray. When the direct analysis of the pigment component is difficult, precision of the analysis can be improved by a pretreatment wherein centrifugation, filtration, and washing of the composition are repeated to prepare a pigment concentrate.

Average primary particle diameter of each of the yellow pigment, the blue pigment, the red pigment, and the violet pigment incorporated as the light shielding material (a) is preferably at least 30 nm in view of improving the light-shielding properties of the pixel division layer and/or the planarization layer and also preferably up to 150 nm in view of improving the pattern straightness. The "average primary particle diameter" as used herein is the average of the primary particle diameters calculated by particle diameter measuring method using an image analysis particle diameter distribution analyzer. A transmission electron microscope (TEM) may be used for taking the image, and average primary particle diameter may be calculated from an image wherein at least 100 pigment primary particles are taken at the magnification of 50000. When the light-shielding material (a) is not spherical particles, the average of the major axis and minor axis may be used for the primary particle diameter. The image analysis may be conducted by using an image analyzing particle diameter distribution analyzer software Mac-View manufactured by MOUNTECH. The primary particle diameter of the pigment in the pixel division layer and/or the planarization layer may be determined by cutting out the pixel division layer and/or the planarization layer with the substrate, embedding in the thermosetting resin, and polishing and observing the fractured cross-sectional surface.

When there is a need to reduce the average primary particle diameter or to form a narrower particle diameter distribution by milling coarse particles, a pretreatment may be conducted by wet kneading treatment such as solvent salt milling to adjust the average primary particle diameter of the pigment to the desired range, and the pigment may be dispersed and incorporated in the photosensitive composition to form the pixel division layer and/or the planarization layer by using such a photosensitive composition. The solvent salt milling is a method wherein a mixture of the pigment, a water-soluble inorganic salt functioning as a milling material, and a water-soluble solvent is heated to an elevated temperature, and the mixture is kneaded in the state of high viscosity paste. Examples of the water-soluble inorganic salt include sodium chloride and potassium chloride, and examples of the water-soluble solvent include alcohol solvents and glycol solvents, and use of sodium chloride or diethylene glycol is typical. The kneading treatment may be accomplished, for example, by using a kneader (manufactured by INOUE MFG., INC.), and the kneading conditions such as pigment concentration, kneading speed, temperature, and time may be adequately determined so that the desired particle diameter is attained by adjusting the balance between the crystal growth speed and the fragmentation speed.

Alternatively, the pigment may be dried after the kneading and dry pulverization may be optionally conducted to control the particle diameter distribution of the secondary aggregate. If coarse particles are removed to preliminarily control the secondary aggregate particle diameter distribution to the desired range, the dispersion time required for attaining the target particle diameter after the dispersion in the subsequent wet dispersion treatment may be dramatically reduced in some cases. The dry pulverization may be carried out, for example, by using "Nano Jetmizer" (Registered Trademark) (manufactured by Aishin Nanotech Co. JP) or "Spiral Jet Mill" (Registered Trademark) (manufactured by Hosokawa Micron Corporation).

The components other than the light-shielding material (a) used in forming the pixel division layer and/or the planarization layer of the organic EL display device of the present invention are as described below.

The photosensitive composition can accomplish the high resolution pattern formation by the photolithography including the exposure step and the development step described later since the photosensitive composition contains the photosensitizer (b). While the photosensitive composition may be a negative photosensitive composition for use in the so-called negative photolithography wherein solubility in alkali of the film in the exposed part is reduced by patterned exposure through an exposure mask and the film in the unexposed part is removed by an alkaline developer to form the pattern, or a positive photosensitive composition for use in the so-called positive photolithography wherein solubility in alkali of the film in the exposed part is increased relative to the solubility in alkali of the film in the unexposed part by patterned exposure through an exposure mask and the film in the exposed part is removed by an alkaline developer to form the pattern, the photosensitive composition is preferably a negative photosensitive composition in view of the good patterning that can be realized even with a minute amount of exposure and the possibility of improving the light-shielding properties of the finally obtained pixel division layer and/or the planarization layer. Since the pixel division layer and the planarization layer are both required to have the function as an insulating film in view of the operation principle of the organic EL display device, the photosensitive composition for forming the pixel division layer and the photosensitive composition for forming the planarization layer may be the same or different. In addition, the negative or positive photosensitivity of the photosensitive composition for forming these layers may also be the same or different.

When the photosensitive composition is a negative photosensitive composition, the photosensitizer (b) contains a compound having 2 or more radical-polymerizable groups and a photoinitiator. Combined use of the compound having 2 or more radical-polymerizable groups with the photoinitiator as described below enables photo-curing by radical polymerization during the exposure and patterning by the removal of the unexposed part using an alkaline developer after the photo-curing. It is to be noted that the cured product of the compound having 2 or more radical-polymerizable groups will be components to remain to form the pixel division layer and/or the planarization layer of the organic EL display device of the present invention.

The radical polymerizable groups are preferably (meth) acryl groups in view of improving the sensitivity in the exposure and hardness of the cured film. The "(meth)acryl group" as used herein is a methacryl group or an acryl group. Examples of the compound having 2 or more (meth)acryl groups include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, didimethylol-tricyclodecane di(meth)acrylate, ethoxylated glycerin tri(meth) acrylate, pentaerythritol tri(meth)acrylate, pentaerythritol tetra(meth)acrylate, ethoxylated pentaerythritol tri(meth) acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona (meth)acrylate, tetrapentaerythritol deca(meth)acrylate, ε-caprolactone-added (meth)acrylate of dipentaerythritol, ethoxylated bisphenol A di(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, 9,9-bis(4-(meth)acryloxyphenyl)fluorene, and acid-modified products thereof, ethylene oxide-modified products thereof, and propylene oxide-modified products thereof, which may be used alone or in combination of two or more.

Content of the compound having 2 or more radical-polymerizable groups is preferably at least 5 parts by weight and more preferably at least 15 parts by weight relative to 100 parts by weight of the total of the alkali-soluble resin as described below and the compound having 2 or more radical-polymerizable groups in view of improving the sensitivity to the exposure. In the meanwhile, the content of the compound having 2 or more radical-polymerizable groups is preferably up to 80 parts by weight and more preferably up to 60 parts by weight relative to 100 parts by weight of the total of the alkali-soluble resin as described below and the compound having 2 or more radical-polymerizable groups in view of reflow property in the curing step as described below.

A photoinitiator is a compound which generates radicals by undergoing cleavage of the bonding and/or reaction upon the exposure. When a photoinitiator is included, the compound having 2 or more radical-polymerizable groups will be photo-cured by the exposure and patterning by the removal of the unexposed part with an alkaline developer will become possible.

Exemplary photoinitiators include carbazole photoinitiators such as "ADEKA OPTOMER" (Registered Trademark) N-1818 and N-1919 and "ADEKA ARKLS" (Registered Trademark) NCI-831 (all of these manufactured by ADEKA); acylphosphine oxide photoinitiators such as 4,6-trimethylbenzoyl-diphenyl-phosphine oxide ("IRGACURE" (Registered Trademark) TPO manufactured by BASF); oxime ester photoinitiators such as 1,2-octanedione, 1-[4-(phenylthio)-,2-(O-benzoyloxime)] ("IRGACURE" (Registered Trademark) OXE01 manufactured by BASF), ethanone, and 1-[9-ethyl-6-(2-methylbenzoyl)-9H-carbazole-3-yl]-,1-(O-acetyl oxime) ("IRGACURE" (Registered Trademark) OXE02 manufactured by BASF); and α-aminoalkylphenone photoinitiators such as 2-methyl-1-(4-methylthiophenylphenyl)-2-morpholinopropane-1-one ("IRGACURE" (Registered Trademark) 907 manufactured by BASF), 2-benzyl-2-dimethylamino-1-(4-morpholinophenyl)-butanone-1 ("IRGACURE" (Registered Trademark) 369 manufactured by BASF), and 2-(dimethylamino)-2-[(4-methylphenyl)methyl]-1-[4-(4-morpholinyl)phenyl]-1-butanone ("IRGACURE" (Registered Trademark) 379EG manufactured by BASF); which may be used alone or in combination of two or more. Of these, the more preferred are carbazole photoinitiators and oxime ester photoinitiators in view of the high sensitivity to the mixed ray comprising j-line (313 nm), i-line (365 nm), h-line (405 nm), and g-line (436 nm) in the exposure step as will be described below.

Content of the photoinitiator when the photosensitive composition has negative photosensitivity is preferably at least 5 parts by weight and more preferably at least 10 parts by weight relative to 100 parts by weight of the compound having two or more radical-polymerizable group in view of improving the sensitivity to the exposure. In the meanwhile, the content of the photoinitiator is preferably up to 60 parts by weight and more preferably up to 40 parts by weight relative to 100 parts by weight of the compound having two or more radical-polymerizable group in view of the depth curability to the exposure. It is to be noted that the photoinitiator is preferably removed by volatilization in the curing step as will be described below, and the residual content in the pixel division layer and/or the planarization layer in the organic EL display device of the present invention is preferably minimized.

When the photosensitive composition is a positive photosensitive composition, the photosensitizer (b) contains a photo acid generator. When the photo acid generator is present, solubility to alkali of the exposed part will be relatively higher than the unexposed part after the exposure, and this enables patterning by removal of the exposed part with an alkaline developer.

The photo acid generator is preferably a quinone diazide compound. An example of the preferable quinone diazide compound is a reaction product obtained by esterifying a compound having phenolic hydroxy group with a quinone diazide sulfonyl chloride.

Examples of the compound having phenolic hydroxy group include Bis-Z, BisP-EZ, TekP-4HBPA, TrisP-HAP, TrisP-PA, TrisP-PHBA, BisOCHP-Z, BisP-MZ, BisP-PZ, BisP-IPZ, BisOCP-IPZ, BisP-CP, BisRS-2P, BisRS-3P, BisP-OCHP, methylene tris-p-CR, methylene tetra-p-CR, BisRS-26X, and Bis-PFP-PC (all of these manufactured by Honshu Chemical Industry) and BIR-OC, BIP-PC, BIR-PC, BIR-PTBP, BIR-PCHP, BIP-BIOC-F, 4PC, BIR-BIPC-F, and TEP-BIP-A (all of these manufactured by Asahi Yukizai Kogyo).

Examples of the quinone diazide sulfonyl acid chloride include 4-naphthoquinone diazide sulfonyl acid chloride and 5-naphthoquinone diazide sulfonyl acid chloride. Such quinone diazide compound is preferable since they have high sensitivity for a mixed ray comprising j-line (313 nm), i-line (365 nm), h-line (405 nm), and g-line (436 nm) in the exposure step as described below.

Amount of such quinone diazide compound added is preferably 1 to 50 parts by weight relative to 100 parts by weight of alkali-soluble resin as described below in view of the pattern workability and heat resistance of the resulting pixel division layer. When there is a need to improve alkali solubility of the photosensitive composition, a part of the phenolic hydroxy group in the compound having phenolic hydroxy group may be intentionally left without the esterification.

The photosensitive composition preferably contains an alkali-soluble resin to facilitate formation of the pixel division layer and/or the planarization layer by the patterning using negative or positive photolithography. It is to be noted that, cured product of the alkali-soluble resin will be a constituent of the pixel division layer and/or the planarization layer in the organic EL display device of the present invention.

The "alkali-soluble resin" as used herein is a resin having hydroxy group and/or carboxyl group as an alkali-soluble group, and having an acid value of at least 10 mg KOH/g and a weight average molecular weight (Mw) of at least 500 and up to 150,000. The "weight average molecular weight (Mw)" as used herein is the value determined by the analysis with gel permeation chromatography using tetrahydrofuran for the carrier and conversion of the value by the calibration curve obtained with the standard polystyrene.

The dissolution speed by the alkali of the alkali-soluble resin is preferably 50 nm and more preferably at least 100 nm in view of realizing a high resolution, and also, preferably up to 10,000 nm and more preferably up to 8,000 n in view of suppressing excessive thinning or pattern peeling by the development. The "dissolution speed by the alkali" is the thickness of the film dissolved by the alkaline developer per minute, and more specifically, a value obtained by coating a solution of an alkali-soluble resin in γ-butyrolactone on a silicon wafer substrate, prebaking the coated substrate for 4 minutes on a hot plate set at an actual temperature of 120° C. to obtain a prebaked film having a thickness of 12 μm±0.5 μm, developing the prebaked film for 1 minute with 2.38% by weight aqueous solution of tetramethylammonium hydroxide at a temperature of 23±1° C. and rinsing the film with water for 30 seconds to obtain the developed film, and subtracting the thickness of the developed film from the thickness of the prebaked film.

Examples of the alkali-soluble resin include cardo resin, acrylic resin, novolac resin, polyimide resin, polyimide precursor, polybenzoxazole resin, polybenzoxazole precursor, polyamide resin, and siloxane resin, and incorporation of a resin with reduced amount of outgassing (gas generation) at high temperature is preferable for improving the light-emitting reliability.

When the photosensitive composition is a negative photosensitive composition, the composition preferably contains a cardo resin and/or a polyimide resin in view of the pattern workability and the light-emitting reliability, and in view of the light-emitting reliability and stability in dispersion of the photosensitive composition, a polyimide resin is preferably incorporated in the composition.

In the meanwhile, when the photosensitive composition is a positive photosensitive composition, the composition preferably contains at least one alkali-soluble resin selected from polyimide resin, polyimide precursor, polybenzoxazole resin, polybenzoxazole precursor, and siloxane resin in view of the pattern workability and the light-emitting reliability, and in view of the pattern workability, a polyimide resin and/or a polyimide precursor is preferably incorporated in the composition.

A cardo resin is a resin having cardo skeleton, and the cardo skeleton is a skeleton wherein 2 aromatic groups are connected by single bond to the quaternary carbon atom which is a ring carbon atom constituting the cyclic structure. Examples of the "cyclic structure" as used herein include fluorene skeleton, 1-phenyl-2,3-dihydro-1H-indene skeleton, and N-phenylphenolphthalein skeleton, examples of the aromatic group include phenyl group, and examples of the cardo skeleton include the skeleton wherein 2 phenyl groups are respectively connected by carbon-carbon single bond to the quaternary carbon atom in fluorene skeleton, 1-phenyl-2,3-dihydro-1H-indene skeleton, or N-phenylphenolphthalein skeleton. Such cardo resin may be synthesized from a compound having fluorene skeleton, 1-phenyl-2,3-dihydro-1H-indene skeleton, and/or N-phenylphenolphthalein skeleton and 2 aromatic groups having either one of hydroxy group and epoxy group in the molecule. When the photosensitive composition is a negative photosensitive composition, use of a cardo resin having a radical-polymerizable group is preferable.

Preferable examples of the cardo resin include a cardo resin having fluorene skeleton which has the structural unit represented by the following general formula (25) and a radical-polymerizable group, a cardo resin having 1-phenyl-2,3-dihydro-1H-indene skeleton which has the structural unit represented by the following general formula (26) and a radical-polymerizable group, and a cardo resin having N-phenylphenolphthalein skeleton which has the structural unit represented by the following general formula (27) and a radical-polymerizable group.

[Chemical formula 15]

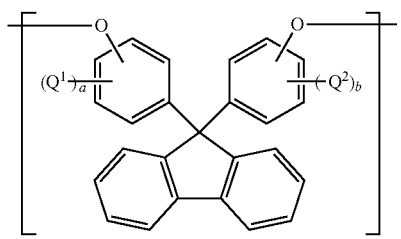

(25)

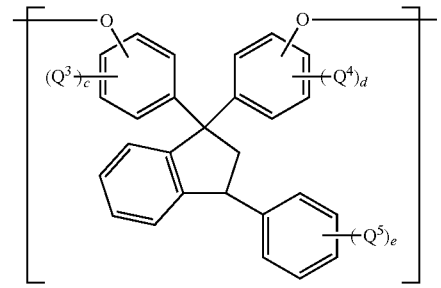

(26)

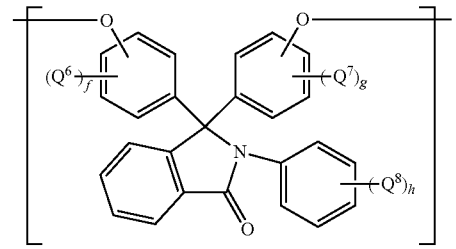

(27)

(in the general formula (25), (26), and (27), $Q^1$ to $Q^8$ independently represent an atom or a substituent directly bonded to the benzene ring which is hydrogen atom, an alkyl group containing 1 to 6 carbon atoms, or an alkoxy group containing 1 to 6 carbon atoms, a to h independently represent the number of substituents in the alkyl group containing 1 to 6 carbon atoms and/or alkoxy group containing 1 to 6 carbon atoms, which is 1 or 2).

The cardo resin may preferably have an acid value of at least 10 mg KOH/g and more preferably at least 50 mg KOH/g in view of improving the developability during the formation of the pixel division layer and/or the planarization layer. In the meanwhile, the acid value is preferably up to 300 mg KOH/g and more preferably up to 250 mg KOH/g in view of suppressing the peeling at the pattern edges.

The cardo resin may preferably have a weight average molecular weight of at least 2,000 and more preferably at least 3,000 in view of suppressing the peeling of the pattern edges. In the meanwhile, the weight average molecular weight is preferably up to 40,000 and more preferably up to 20,000 in view of suppressing gelation during the polymerization of the cardo resin and generation of the development residue in the development step. The weight average molecular weight (Mw) as used herein is the one obtained by the analysis with gel permeation chromatography using tetrahydrofuran for the carrier, and converting the value with the calibration curve prepared by using standard polystyrene.

The cardo resin used may be a commercially available product. Examples of such commercially available product include "ADEKA ARKLS" (Registered Trademark) WR-301 (manufactured by ADEKA) and "OGSOL" (Registered Trademark) CR-TR1, CR-TR2, CR-TR3, CR-TR4, CR-TR5, and CR-TR6 (all of these manufactured by Osaka Gas Chemicals Co., Ltd.

The polyimide resin used preferably contains a polyimide resin component having the structural unit represented by the following general formula (28).

[Chemical formula 16]

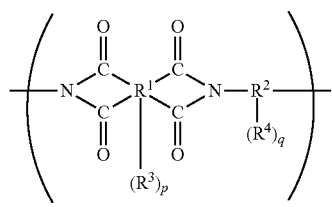

(in the general formula (28), $R^1$ represents a tetravalent to decavalent organic group, $R^2$ represents a divalent to octavalent organic group, $R^3$ and $R^4$ independently represent phenolic hydroxy group, sulfonate group, or thiol group, and p and q independently represent a number in the range of 0 to 6.).

In the general formula (28), $R^1$-$(R^3)p$ represents a residue of acid dianhydride. $R^1$ is preferably an organic group containing 5 to 40 carbon atoms having an aromatic ring or a cyclic aliphatic group.

Examples of the acid dianhydride include tetracarboxylic dianhydrides having an aromatic ring such as pyromellitic dianhydride, 3,3',4,4'-biphenyltetracarboxylic dianhydride, 3,3',4,4'-benzophenonetetra carboxylic dianhydride, bis(3,4-dicarboxyphenyl)sulfone dianhydride, bis(3,4-dicarboxyphenyl)ether dianhydride, and tetracarboxylic dianhydrides having an aliphatic group such as 2,2-bis(3,4-dicarboxyphenyl)hexafluoropropane dianhydride and butanetetracarboxylic dianhydride, and tetracarboxylic dianhydrides having a cyclic aliphatic group such as 1,2,3,4-cyclopentanetetracarboxylic dianhydride, bicyclo[2.2.2]oct-7-ene-tetracarboxylic dianhydride, and bicyclo[2.2.2]octanetetracarboxylic dianhydride.

In the general formula (28), $R^2$-$(R^4)q$ represents a residue of diamine. $R^2$ is preferably an organic group containing 5 to 40 carbon atoms having an aromatic ring or a cyclic aliphatic group.

Exemplary diamines include diamines having an aromatic ring such as m-phenylenediamine, p-phenylenediamine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(4-aminophenoxy)phenyl]propane, bis[4-(4-aminophenoxy)phenyl]hexafluoropropane, bis[4-(3-aminophenoxy)phenyl]sulfone, 9,9-bis(4-aminophenyl)fluorene, diaminodiphenyl ether, diaminodiphenylsulfone, diaminodiphenylmethane, diaminodiphenylpropane, diaminodiphenylhexafluoropropane, diaminodiphenyl thioether, benzidine, 2,2'-bistrifluorobenzidine, and 2,2'-bistrifluorobenzidine and diamines having a cyclic aliphatic group such as 2,5-bis(aminomethyl)bicyclo[2.2.1]heptane and 2,6-bis(aminomethyl)bicyclo[2.2.1]heptane.

The polyimide resin having the structural unit represented by the general formula (28) may preferably have carboxyl group, phenolic hydroxy group, sulfonate group, and/or thiol group at the end of its backbone. By end-capping the end of the polyimide resin with an end-capping agent having carboxyl group, phenolic hydroxy group, sulfonate group, and/or thiol group, such group may be introduced to the end of the backbone. Examples of the end-capping agent include monoamine, acid anhydride, monocarboxylic acid, mono-acid chloride compound, and mono-active ester compound.

The polyimide resin may preferably have an acid value of at least 10 mg KOH/g and more preferably 50 mg KOH/g in view of improving the developability. In the meanwhile, the acid value is more preferably up to 300 mg KOH/g in view of suppressing the peeling of the pattern edge of the pixel division layer and/or the planarization layer.

The polyimide resin may preferably have a weight average molecular weight of at least 5,000 and more preferably at least 10,000 in view of improving the hardness of the pixel division layer. In the meanwhile, the weight average molecular weight is preferably up to 100,000 and more preferably up to 70,000 in view of the solubility to the alkaline developer. The weight average molecular weight (Mw) as used herein is the one obtained by the analysis with gel permeation chromatography using tetrahydrofuran for the carrier, and converting the value with the calibration curve prepared by using standard polystyrene.

The photosensitive composition may contain a dispersant. A dispersant is the one having both a group having affinity for the pigment which can be chemically bonded to or adsorbed on the pigment surface and a polymer chain or group having affinity for the solvent. With regard to the action mechanism of the dispersant, not only acid-base interaction but hydrogen bond, van-der-Waals forces, and like are involved in complicated manner, and the effect of stabilizing the dispersed condition by promoting disaggregation of the secondary aggregate of the pigment and suppressing re-aggregation is realized by improving the wettability of the organic pigment surface to the dispersion medium in the wet media dispersion treatment carried out in the preparation of the pigment dispersion liquid as described below, and improving the steric repulsion effects and/or the electrostatic repulsion effects between the organic pigments by the polymer chain.

Exemplary preferable dispersants include dispersants having a basic adsorbent group, dispersants having an acidic group, and nonionic dispersants. Exemplary dispersants having a basic adsorbent group include DisperBYK-142, 145, 164, 167, 182, 187, 2001, 2008, 2009, 2010, 2013, 2020, 2025, 9076, and 9077 and BYK-LP N6919, BYK-LP N21116, and BYK-JET9152 (all of these manufactured by BYK-Chemie), "Solsperse" (Registered Trademark) 9000, 11200, 13650, 20000, 24000, 24000SC, 24000GR, 32000, 32500, 32550, 326000, 33000, 34750, 35100, 35200, 37500, 39000, 56000, and 76500 (all of these manufactured by The Lubrizol Corporation), and Efka-PX4310, 4320, and 4710 (all of these manufactured by BASF) and exemplary dispersants having an acidic group include "Tego dispers" (Registered Trademark) 655 (manufactured by Evonik) and DisperBYK-102, 118, 174, and 2096 (all of these manufactured by BYK-Chemie). Exemplary nonionic dispersants include "SOLSPERSE" (Registered Trademark) 54000 (manufactured by The Lubrizol Corporation), "Tego dispers" (Registered Trademark) 650, 652, and 740W (all of these manufactured by Evonik). These dispersants may be adequately used alone or in combination of two or more while considering surface properties inherent to the pigment and average primary particle diameter of the pigment in the light-shielding material (a) so that the average dispersion particle size as described below will be realized.

Content of the dispersant is preferably at least 10 parts by weight and more preferably at least 20 parts by weight relative to 100 parts by weight of the pigments in the light-shielding material (a) in view of realizing sufficient disaggregation in the wet media dispersion treatment as will be described below and suppressing the re-aggregation after the dispersion treatment. In the meanwhile, the content is preferably up to 100 parts by weight and more preferably up to 60 parts by weight relative to 100 parts by weight of the pigments in the light-shielding material (a) in view of suppressing the re-aggregation tendency by the excessive pigment dispersion.

The photosensitive composition may contain a solvent. When the solvent is present, adjustment of the viscosity, coating properties, and storage stability will be possible, and the film thickness consistency of the resulting pixel division layer and/or the planarization layer can be improved by selecting an adequate solvent.

Examples of the solvent include ether solvents, acetate solvents, ester solvents, ketone solvents, aromatic hydrocarbon solvents, alcohol solvents, and the like which may be used in combination of two or more. Exemplary ethers include ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, dipropylene glycol dimethyl ether, dipropylene glycol methyl-n-butyl ether, tripropylene glycol monomethyl ether, tripropylene glycol monoethyl ether, diethylene glycol dimethyl ether, diethylene glycol methyl ethyl ether, diethylene glycol diethyl ether, and tetrahydrofuran. Exemplary acetates include butyl acetate, ethylene glycol monomethyl ether acetate, ethylene glycol monoethyl ether acetate, propylene glycol monomethyl ether acetate (hereinafter referred to as "PGMEA"), 3-methoxy butyl acetate (hereinafter referred to as "MBA"), ethylene glycol monobutyl ether acetate, diethylene glycol monomethyl ether acetate, diethylene glycol monoethyl ether acetate, diethylene glycol monobutyl ether acetate, cyclohexanol acetate, propylene glycol diacetate, dipropylene glycol methyl ether acetate, 3-methoxy-3-methyl-1-butyl acetate, 1,4-butanediol diacetate, 1,3-butylene glycol diacetate, and 1,6-hexanediol diacetate. Exemplary esters include alkyl lactate esters such as 2-hydroxymethylpropionate and 2-hydroxyethyl propionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methyl butanoate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butylate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate. Exemplary ketones include methyl ethyl ketone, cyclohexanone, 2-heptanone, and 3-heptanone. Exemplary aromatic hydrocarbons include toluene, and xylene, and exemplary alcohols include isopropyl alcohol, butyl alcohol, isobutyl alcohol, pentanol, 4-methyl-2-pentanol, 3-methyl-2-butanol, 3-methyl-3-methoxy butanol, and diacetone alcohol. With regard to the distinction between the pigment and the dye, while the pigment is generally referred to be a colorant that is insoluble in the solvent, the pigment may dissolve in the solvent at a certain degree of dissolution depending on the combination of the type of pigment and the type of solvent. In the photosensitive composition for forming the pixel division layer and/or the planarization layer of the organic EL display device of the present invention, content of the acetate solvent in all solvents is preferably at least 50% by weight and more preferably at least 70% by weight in view of suppressing the dissolution of the pigment in the light-shielding material (a) and improving the dispersion stability and the light-emitting reliability.

Content of the solvent in the photosensitive composition is preferably at least 50% by weight and more preferably at least 70% by weight in view of the film thickness consistency of the coated film in the coating step. In the meanwhile, the content of the solvent is preferably up to 95% by weight and more preferably up to 90% by weight in view of suppressing the precipitation of the pigment.

The photosensitive composition may contain a thermal crosslinking agent. When a thermal crosslinking agent is present, the finally obtained pixel division layer and/or planarization layer will have improved film strength. Examples of the thermal crosslinking agent include a compound having at least 2 alkoxymethyl groups and/or methylol groups in the molecule and a compound having 2 or more epoxy groups.

Examples of the compound having at least 2 alkoxymethyl groups and/or methylol groups include NIKALAC (Registered Trademark) MW-100LM, MX-270, MX-280, and MX-290 (manufactured by Sanwa Chemical Co., Ltd.) and DML-PC (manufactured by Honshu Chemical Industry Co., Ltd.).

Examples of the compound having 2 or more epoxy groups include "EPOLIGHT" (Registered Trademark) 40E, 100E, 200E, 400E, 70P, 200P, 400P, 4000, and 3002(N) (all of these manufactured by KYOEISHA CHEMICAL Co., LTD.), "jER" (Registered Trademark) 828, 1002, 1750, 1007, YX8100-BH30, E1256, E4250, and E4275 (manufactured by Mitsubishi Chemical Corporation), "TECHMORE" (Registered Trademark) VG-3101L (manufactured by Printec Corporation), and "TEPIC" (Registered Trademark) S, G, P, and L (all of these manufactured by Nissan Chemical Corporation).

The photosensitive composition may contain a levelling agent to improve coating properties and surface smoothness of the coated film, and to also improve film thickness consistency of the finally obtained pixel division layer and/or the planarization layer. Examples of the levelling agent include anionic surfactants such as ammonium lauryl sulfate and polyoxyethylene alkylether triethanolamine sulfate, cationic surfactants such as stearyl amine acetate and lauryl trimethylammonium chloride, amphoteric surfactants such as lauryl dimethylamine oxide, lauryl and carboxymethylhydroxyethyl imidazolium betaine, nonionic surfactants such as polyoxyethylene lauryl ether, polyoxyethylene stearyl ether, and sorbitan monostearate, silicone surfactants having the skeleton of polydimethylsiloxane, and fluorosurfactants, and exemplary commercially available products include BYK-302, BYK-333, BYK-350, and BYK-392 (all of these manufactured by BYK-Chemie).

In an exemplary method for preparing the photosensitive composition, a pigment dispersion liquid containing at least a yellow pigment having the benzimidazolone structure represented by the structural formula (1) is preliminarily prepared as the light-shielding material (a), and then other components including the photosensitizer (b) are added followed by stirring and optional filtration.

The pigment dispersion liquid may be prepared by mixing the pigment, the dispersant, the solvent, and other optional components and subjecting the mixture to a wet media dispersion treatment. By considering the nature of each type of pigments in the light-shielding material (a), the pigment dispersion liquid may be prepared by preparing the pigment dispersion for each pigment and mixing the thus prepared pigment dispersions, or alternatively, by simultaneous dispersion wherein two or more pigments are simultaneously mixed and dispersed.

Examples of the dispersion equipment for wet media dispersion treatment include horizontal or vertical bead mill and roll mill such as "DYNO-MILL" (Registered Trademark) (manufactured by Willy A. Bachofen), "Spike Mill" (Registered Trademark) (manufactured by INOUE MFG., INC.), and "Sand Grinder" (Registered Trademark) (manufactured by DuPont). The medium used for such dispersion equipment includes zirconia beads, zircon beads, and alkali-free glass beads, and the beads are preferably free from the component which would be source of metal and metal ion impurities to thereby avoid loss of the light-emitting reliability through contamination by breakage and abrasion. The beads may preferably have a diameter of 0.03 to 5 mm, and a higher sphericity is preferable. The condition used in the operation of the dispersion equipment may be adequately determined by considering the beads hardness, handling convenience, productivity, and the like so that average particle diameter and viscosity after the pigment dispersion would be within the desired range.

In the pigment dispersion liquid, average dispersion particle diameter of the pigment in the light-shielding material (a) is preferably at least 40 nm in view of the coating properties and storage stability. In the meanwhile, the average dispersion particle diameter is preferably up to 200 nm in view of improving the pattern straightness of the pixel division layer and/or the planarization layer. The average dispersion particle diameter of the pigment as used herein is the number average that can be measured by a particle diameter distribution measuring apparatus. Examples of the particle diameter distribution measuring apparatus include particle diameter distribution measuring apparatus using dynamic light scattering "SZ-100" (manufactured by HORIBA) and particle diameter distribution measuring apparatus using laser diffraction and scattering "MT-3000" (manufactured by Microtrac).

Next, film properties and film formation process preferable for the pixel division layer and/or the planarization layer of the organic EL display device of the present invention are described. The pixel division layer and/or the planarization layer of the organic EL display device of the present invention is a cured film obtained by curing a photosensitive composition having a negative or positive photosensitivity.

The pixel division layer and/or the planarization layer of the organic EL display device of the present invention may preferably have an optical density per 1.0 µm of the film thickness of at least 0.5, more preferably at least 0.8, and still more preferably at least 1.0 in view of reducing the reflection of exterior light and improving the value as a display device. The term "optical density" as used herein is the value measured by forming a cured film on the light transmitting substrate by using the photosensitive composition to a film thickness of 1.0 m and measuring the intensity of the incident light and the intensity of the transmitted light by using an optical densitometer (X-rite 361T manufactured by X-Rite) and calculating by the following equation, and a higher optical density corresponds to higher light-shielding properties.

Optical density=$\log_{10}(I_0/i)$ $I_0$: intensity of the incident light
I: intensity of the transmitted light The difference between the light transmittance at the wavelength of 550 nm and the maximum light transmittance in the wavelength region of 380 to 450 nm is preferably less than 30%, more preferably less than 25%, and still more preferably less than 20%. The term "light transmittance" as used herein may be determined by forming a cured film on a light transmitting substrate to a film thickness of 1.0 µm, and measuring the value by suing "UV-260" (manufactured by Shimadzu Corporation) which is a UV-Vis spectrophotometer. Preferable light transmitting substrate is "TEMPAX" (manufactured by AGC TECHNO GLASS Co., Ltd.) which is a light transmitting glass substrate.

In view of the optical properties, it is preferable to simultaneously satisfy the requirements for the difference between the light transmittance at the wavelength of 550 nm and the maximum light transmittance in the wavelength region of 380 to 450 nm and the optical density.

The permittivity of the pixel division layer and/or the planarization layer of the organic EL display device of the present invention is preferably as low as possible in view of improving the light-emitting reliability and the driving stability of the organic EL display device. The "permittivity" as used herein is a dielectric constant, and the permittivity at the frequency of 1 kHz is preferably up to 7.0, more preferably up to 5.0, and more preferably up to 4.0 for both the pixel division layer and the planarization layer. The permittivity may be measured by using a permittivity-measuring apparatus such as a LCR meter manufactured by Agilent Technologies.

In the pixel division layer of the organic EL display device of the present invention, the pixel division layer in the display area may preferably have an opening rate of up to 30% and more preferably up to 20% in view of increasing the definition of the display area and improving the display quality of the picture or image, and hence to improve the value as a display device. The "opening rate" as used herein is the area percentage of the opening of the pixel division layer relative to the area of the pixel division layer. A lower opening rate corresponds to a larger area of the pixel division layer formed in the display area, and therefore, the opening rate has large influence on the optical properties and the light-emitting reliability of the pixel division layer. In other words, the merits of the present invention will contribute to a larger degree when the organic EL display device has a display area with a lower opening rate and higher definition.

The pixel division layer and/or the planarization layer of the organic EL display device of the present invention may be formed, for example, by a method including the coating step, the prebaking step, the exposure step, the development step, and the curing step in this order. In view of improving the productivity, the production may be accomplished by multiple formation wherein several organic EL display devices are arranged and formed per one substrate.

In the coating step, the photosensitive composition is coated on the substrate to obtain a coated film. In the case of top emission organic EL display device, for example, the substrate may be a glass substrate or a flexible substrate, and a reflective layer containing a patterned silver/copper alloy or the like and a similarly patterned ITO electrode may be deposited in this order on the surface of such substrate. The substrate is preferably the one having a high heat resistance and flexibility, and among others, the preferred is the one wherein a polyimide film is secured to the surface of a glass substrate which is a temporary support.

In the coating step, the photosensitive composition is coated to obtain the coated film. Examples of the coater apparatus used in the coating step include slit coater, spin coater, gravure coater, dip coater, curtain flow coater, roll coater, spray coater, screen printer, and ink jet printer. The pixel division layer and the planarization layer are generally formed to a thickness of approximately 0.5 to 3 µm, and therefore, the preferred are slit coater and spin coater in view of the suitability for the thin film coating and preventing the coating defects, film thickness consistency, and the productivity, and excellent film thickness consistency and productivity and the more preferred is the slit coater in view of the economy of the coating solution.

In the prebaking step, the solvent in the coated film is volatilized by heating to obtain the prebaked film. The heating apparatus used may be, for example, a hot air oven, a hot plate, or a far-infrared oven (IR oven), and the prebaking may be accomplished by pin gap prebaking or contact prebaking. The prebaking is preferably accomplished at a temperature of 50° C. to 150° C. and the prebaking may be conducted preferably for 30 seconds to several hours. Also acceptable is the prebaking in two or more stages, for example, 80° C. for 2 minutes followed by 120° C. for 2 minutes. In order to improve the film thickness consistency, a part of the solvent in the coated film may be volatilized by a vacuum/reduced pressure dryer after the coating step and the prebaking step may be conducted by heating.

In the exposure step, an actinic ray is applied through a photomask to the film surface of the prebaked film to obtain the exposed film. The exposure system used in the exposure step may be, for example, a stepper, a mirror projection mask aligner (MPA), or a parallel light mask aligner (PLA), and the actinic ray to use in the exposure may be, for example, UV light, visible light, electron beam, X ray, KrF (wavelength 248 nm) laser, or ArF (wavelength 193 nm) laser. Of these, the preferred are j-line (wavelength 313 nm), i-line (wavelength 365 nm), h-line (wavelength 405 nm), or g-line (wavelength 436 nm) of a mercury lamp, and the more preferred is a mixed ray thereof. Amount of the exposure is typically about 10 to 4000 mJ/cm$^2$ (converted in terms of i-line). Exemplary masks to use include those wherein a thin film of a metal such as chromium or a black organic resin having light shielding properties for the exposure light is formed in a pattern on one surface of a substrate of a glass, quartz, or a film which has light transmitting property at the wavelength used for the exposure. In the formation of the pixel division layer and/or the planarization layer, either a negative or a positive mask may be used, and an exposed film is obtained by a patterned exposure wherein the actinic ray is allowed to pass through only the openings in the mask.

In the development step, when the photosensitive composition has a negative photosensitivity, the unexposed part is removed by the development to leave the patterned developed film. When the photosensitive composition has a positive photosensitivity, the exposed part is removed by the development to leave the patterned developed film. Exemplary methods used for the development include those wherein the exposed film is immersed in an organic or inorganic alkaline aqueous solution which is the developer for 10 seconds to 10 minutes by showering, dipping, puddling, or the like.

In the exposed film, the difference in the solubility of the exposed part/unexposed part to the developer solution may be used to obtain the patterned developed film. The "exposed part" as used herein means the part where the exposure light was irradiated through the opening in the mask, while the "unexposed part" is the part not irradiated with the exposure light.

When the photosensitive composition has negative photosensitivity, the unexposed part becomes the pattern opening, and when the photosensitive composition has positive photosensitivity, the exposed part becomes the pattern opening. More specifically, in forming the pixel division layer, the opening finally becomes the light emitting pixel part in the organic EL display device, and in forming the planarization layer, the opening finally becomes the contact hole in the organic EL display device.

Examples of the developer that can be used in the development step include aqueous solution of an organic alkali and aqueous solution of an inorganic alkali, which are generally used at a certain temperature in the range of 15° C. to 35° C. at atmospheric pressure. Examples of the aqueous solution of an organic alkali include aqueous solution of tetramethylammonium hydroxide (hereinafter referred to as "TMAH"), aqueous solution of diethanolamine, aqueous solution of dimethylaminoethanol, aqueous solution of diethylaminoethanol, aqueous solution of triethylamine, and aqueous solution of diethylamine. Examples of the aqueous solution of an inorganic alkali include aqueous solution of potassium hydroxide (hereinafter referred to as "KOH"), aqueous solution of sodium hydrogencarbonate, and aqueous solution of sodium hydroxide. Of these, use of TMAH aqueous solution is preferable in view of the ease of volatilizing the developer that had been impregnated in the surface layer or in the interior of the developed film during the development step in the subsequent curing step, and the more preferred is use of a TMAH aqueous solution having a concentration of at least 1% by weight in view of improving the developer ability and shortening the production tact time. The developer used for the formation of the pixel division layer or the planarization layer is typically a 2.38% by weight aqueous solution of TMAH. The 2.38% by weight TMAH aqueous solution used may be a commercially available product or one prepared by diluting a TMAH aqueous solution of a higher concentration, and they may be used for the developer after adding a minute amount of a nonionic surfactant to the extent not adversely affecting the light-emitting reliability. In addition, a washing treatment by the shower of deionized water and/or draining treatment by air spraying may be optionally conducted after the development.

In the curing step, the developed film is thermally cured by heating, and simultaneously, components such as moisture and remaining developer are volatilized to obtain the cured film. The cured film obtained after the curing step corresponds to the pixel division layer or the planarization layer in the organic EL display device of the present invention. The heating apparatus used may be, for example, a hot air oven or an IR oven. In order to improve the light-emitting reliability, the heating is preferably conducted at a temperature of 200° C. to 280° C. for the time of 15 to 90 minutes. Also, the heating is preferably conducted in air or nitrogen atmosphere under atmospheric pressure.

EXAMPLES

Next, the present invention is described in detail by referring to the Examples and the Comparative Examples, which by no means limit the scope of the present invention. The pigments described in the Examples and Comparative Examples were only untreated pigments not intentionally containing other components such as surface treating agent.

First, the methods used for evaluation in the Examples and Comparative Examples are described.

<Calculation of Minimum Necessary Exposure Amount>

A thin film of a silver/copper alloy (volume ratio 10:1) was formed to a thickness of 10 nm on the entire surface of an alkali-free glass substrate (100 mm×100 mm) by sputtering, and a patterned metal reflective layer was formed by etching. And then, an ITO transparent electroconductive film was formed on the entire surface to a thickness of 10 nm by sputtering to prepare a substrate for evaluating the minimum necessary exposure amount.

On the surface of the thus obtained substrate for evaluating the minimum necessary exposure amount, the photosensitive composition was coated using a spin coater by adjusting the rotation speed so that the thickness of the resulting cured film was 1.0 µm to thereby obtain the coated film, and the coated film was then prebaked at atmospheric pressure at 100° C. for 120 seconds by using a hot plate (SCW-636 manufactured by DAINIPPON SCREEN MFG. CO., LTD.) to obtain the prebaked film. The prebaked film was irradiated with the mixed ray from an ultra-high-pressure mercury lamp including j-line (313 nm), i-line (wavelength 365 nm), h-line (wavelength 405 nm), and g-line (wavelength 436 nm) through a gray scale mask for sensitivity measurement (MDRM MODEL 4000-5-FS manufactured by Opto-Line International) by using an opposite-surface alignment single-surface exposure system (Mask Aligner PEM-6M manufactured by Union Optical Co., LTD.) for patterned exposure, and the film was developed with 2.38% by weight aqueous solution of TMAH by using a small size developer apparatus for photolithography (AD-2000 manufactured by Takizawa Sangyo K.K.) to obtain the developed film. Next, resolution pattern of the thus prepared developed film was observed by using FPD microscope (MX-61L manufactured by Olympus), and the amount of exposure (mJ/cm$^2$, the value of the i line) at which the pattern line width to the pitch width was formed at 1 to 1 in the line-and-space-pattern was used as the minimum necessary exposure amount (sensitivity) of the photosensitive composition.

(1) Evaluation of Optical Properties (i) Optical Density

The optical density (OD value) of the substrates for evaluating the optical properties having the cured film on the surface of the TEMPAX obtained in Examples 1 to 31 and Comparative Examples 1 to 34 was measured from the film surface side at 3 locations in the surface by using an optical densitometer (X-Rite 361T manufactured by X-Rite). The average of the measurements was rounded off to the first decimal place to obtain the value to the first decimal place, and this value was divided by the thickness (µm) of the cured film to calculate the OD value (OD/µm) per 1.0 µm of the cured film thickness. In the meanwhile, since the OD value inherent to the TEMPAX substrate without the formation of the cured film was separately measured to be 0.00, the OD value of the substrate for the optical properties evaluation was regarded as the OD value of the cured film. It is to be noted that the thickness of the cured film was measured at 3 locations in the surface by using probe-type film thickness measurement apparatus (SURFCOM manufactured by TOKYO SEIMITSU CO., LTD.), and its average was rounded off to the first decimal place to obtain the value to the first decimal place.

(ii) Difference Between the Maximum Light Transmittance in the Wavelength Range of 380 to 450 nm and the Light Transmittance at the Wavelength of 550 nm The light transmittance in the visible light region of 380 to 780 nm was measured at an increment in the wavelength of 1 nm for the substrates for evaluating the optical properties having the cured film on the surface of the TEMPAX obtained in Examples 1 to 31 and Comparative Examples 1 to 34 by using "UV-260 (manufactured by Shimadzu Corporation)" which is a UV-Vis spectrophotometer, and the value of the light transmittance (%) at the wavelength of 550 nm was subtracted from the value of the maximum light transmittance (%) in the wavelength region of 380 to 450 nm to calculate the difference of the light transmittance. The cured film having smaller difference between the maximum light transmittance in the wavelength region of 380 to 450 nm and the light transmittance at the wavelength of 550 nm has higher optical properties, and the results were evaluated according to the criteria as described below. A to C were evaluated "pass" and D to E were evaluated "fail". It is to be noted that, in all Examples and Comparative Examples, no substrate exhibited a minus light transmittance difference value in the evaluation of the optical properties.

A: less than 20%
B: at least 20% and less than 25%
C: at least 25% and less than 30%
D: at least 30% and less than 35%
E: at least 35%

(2) Evaluation of Permittivity

The permittivity at a frequency of 1 kHz was measured for the substrate for the permittivity evaluation including comprising the aluminum substrate, the cured film, and the aluminum thin film in this order obtained in Examples 1 to 31 and Comparative Examples 1 to 34 by using "LCR meter 4294A" (manufactured by Agilent Technologies) which is a permittivity measurement apparatus, and its average was rounded off to the first decimal place to obtain the value to the first decimal place. It is to be noted that the thickness of the cured film was measured at 4 locations in the surface by using probe-type film thickness measurement apparatus (SURFCOM manufactured by TOKYO SEIMITSU CO., LTD.), and its average was rounded off to the first decimal place to obtain the value to the first decimal place.

(3) Evaluation of Light-Emitting Reliability

The organic EL display device obtained in Examples 1 to 31 and Comparative Examples 1 to 34 was placed on a hot plate heated to 80° C. with the light emitting surface facing upward while maintaining the light emission at 10 mA/cm$^2$ DC, and area percentage of the light emitting part after 1 hour in relation to the area of the light emitting pixel (area percentage of the light emitting pixel) was measured after 1 hour, 500 hours, and 1000 hours. The light-emitting reliability was evaluated by using the area percentage of the light emitting pixel after 1 hour as reference, and the light-emitting reliability was evaluated to be high when the high area percentage of the light emitting pixel was maintained. The results were evaluated according to the criteria as described below. A to C were evaluated "pass" and D to E were evaluated "fail".

A: at least 90%
B: at least 85% and less than 90%
C: at least 80% and less than 85%
D: at least 60% and less than 80%
E: less than 60%
F: at least one light emitting pixel part which is not "ON" is present immediately after turning on the organic EL display device.

Synthesis Example: Synthesis of Polyimide Resin Solution A

In dry nitrogen stream, 150.15 g of 2,2-bis(3-amino-4-hydroxyphenyl)hexafluoropropane (0.41 mol), 6.20 g of 1,3-bis(3-aminopropyl)tetramethyldisiloxane (0.02 mol), and 13.65 g of 3-aminophenol (0.13 mol) (an end-capping agent) were dissolved in 500 g of N-methyl-2-pyrrolidone (hereinafter referred to as "NMP") (a solvent), and 155.10 g of bis(3,4-dicarboxyphenyl) ether dianhydride (0.50 mol) and 150 g of NMP were added to this solution. After stirring at 20° C. for 1 hour, the stirring was continued for another 4 hours at 180° C. while removing the water. After the completion of the reaction, 10 L of water was added, and the resulting precipitate was collected by filtration, washed 5 times with water, and dried in a vacuum dryer at 80° C. for 20 hours to synthesize a powder of an alkali-soluble polyimide resin which is a resin having the structural unit represented by the general formula (28). This resin was dissolved in PGMEA (a solvent) to prepare a polyimide resin solution A having a solid content of 30% by weight. The polyimide resin powder obtained had a weight average molecular weight (Mw) of 25,000 and a solid content acid value of 160 (mg KOH/g), and the powder was easily soluble in PGMEA.

Synthesis Example: Synthesis of Quinonediazide Compound a

In dry nitrogen, 21.23 g (0.05 mol) of TrisP-PA (manufactured by Honshu Chemical Industry) (a compound having phenolic hydroxy group) and 33.58 g (0.125 mol) of 5-naphthoquinone diazide sulfonyl chloride were dissolved in 450.00 g of 1,4-dioxane, and the solution was adjusted to room temperature. To this solution, 12.65 g (0.125 mol) of triethylamine which had been mixed with 50.00 g of 1,4-dioxane was added dropwise while maintaining the system to 25 to 35° C. After the dropwise addition, the solution was stirred at 30° C. for 2 hours. Next, the triethylamine salt was filtered, and the filtrate was added to water to collect the precipitated precipitate by filtration. This precipitate was dried in a vacuum dryer to obtain quinone diazide compound which is represented by the structural formula (29).

[Chemical formula 17]

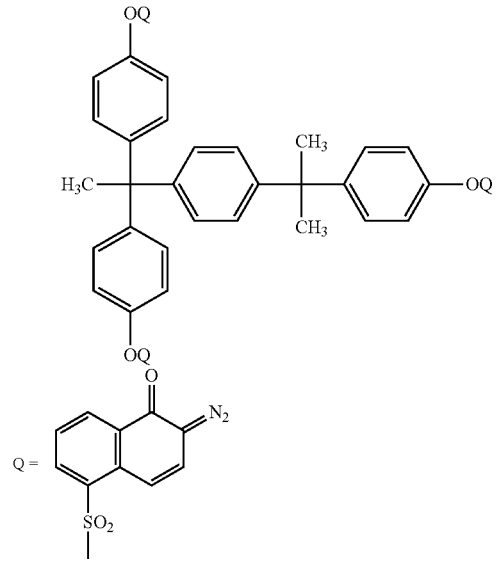

(29)

Preparation Example 1

37.50 g of SOLSPERSE 20000 (a polyether polymer dispersant having tertiary amino group at the molecule end as a basic adsorbing group) (a dispersant) was mixed with 850.00 g of PGMEA (a solvent), and after stirring the mixture for 10 minutes, 112.50 g of C.I. Pigment Yellow 192 (a yellow pigment having the benzimidazolone structure represented by the structural formula (1)) was injected. After stirring for 30 minutes, the mixture was subjected to wet media dispersion treatment by circulation system in a horizontal bead mill filled with zirconia beads (diameter, 0.4 mm) for 30 minutes, and then, wet media dispersion treatment by circulation system in a horizontal bead mill filled with zirconia beads (diameter, 0.05 mm) for 1 hour to prepare pigment dispersion liquid 1 having a solid content 15% by weight. The amounts (g) of the starting materials used are shown in Table 1.

TABLE 1

| | | Pigment | | | Dispersant (SOLSPERSE 20000) Weight (g) | Solvent (PGMEA) Weight (g) |
| | Pigment dispersion liquid | Colour Index Generic name | Benzimidazolone structure represented by structural formula (1) | Weight (g) | | |
|---|---|---|---|---|---|---|
| Preparation Example 1 | Pigment dispersion liquid 1 | Pigment Yellow 192 | Yes | 112.50 | 37.50 | 850.00 |
| Preparation Example 2 | Pigment dispersion liquid 2 | Pigment Yellow 120 | Yes | 112.50 | 37.50 | 850.00 |
| Preparation Example 3 | Pigment dispersion liquid 3 | Pigment Yellow 181 | Yes | 112.50 | 37.50 | 850.00 |
| Preparation Example 4 | Pigment dispersion liquid 4 | Pigment Yellow 194 | Yes | 112.50 | 37.50 | 850.00 |
| Preparation Example 5 | Pigment dispersion liquid 5 | Pigment Yellow 151 | Yes | 112.50 | 37.50 | 850.00 |
| Preparation Example 6 | Pigment dispersion liquid 6 | Pigment Yellow 175 | Yes | 112.50 | 37.50 | 850.00 |
| Preparation Example 7 | Pigment dispersion liquid 7 | Pigment Yellow 180 | Yes | 112.50 | 37.50 | 850.00 |
| Preparation Example 8 | Pigment dispersion liquid 8 | Pigment Yellow 147 | No | 112.50 | 37.50 | 850.00 |
| Preparation Example 9 | Pigment dispersion liquid 9 | Pigment Yellow 155 | No | 112.50 | 37.50 | 850.00 |
| Preparation Example 10 | Pigment dispersion liquid 10 | Pigment Yellow 55 | No | 112.50 | 37.50 | 850.00 |
| Preparation Example 11 | Pigment dispersion liquid 11 | Pigment Yellow 74 | No | 112.50 | 37.50 | 850.00 |
| Preparation Example 12 | Pigment dispersion liquid 12 | Pigment Yellow 83 | No | 112.50 | 37.50 | 850.00 |
| Preparation Example 13 | Pigment dispersion liquid 13 | Pigment Yellow 138 | No | 112.50 | 37.50 | 850.00 |
| Preparation Example 14 | Pigment dispersion liquid 14 | Pigment Yellow 139 | No | 112.50 | 37.50 | 850.00 |
| Preparation Example 15 | Pigment dispersion liquid 15 | Pigment Yellow 150 | No | 112.50 | 37.50 | 850.00 |
| Preparation Example 16 | Pigment dispersion liquid 16 | Pigment Orange 13 | No | 112.50 | 37.50 | 850.00 |
| Preparation Example 17 | Pigment dispersion liquid 17 | Pigment Orange 62 | Yes | 112.50 | 37.50 | 850.00 |
| Preparation Example 18 | Pigment dispersion liquid 18 | Pigment Orange 64 | Yes | 112.50 | 37.50 | 850.00 |

Preparation Examples 2 to 18

The procedure of Preparation Example 1 was repeated except that C.I. Pigment Yellow 120, 181, 194, 151, 175, or 180 (a yellow pigment having the benzimidazolone structure represented by the structural formula (1)) was used instead of the C.I. Pigment Yellow 192 to prepare pigment dispersion liquids 2 to 7.

Also, the procedure of Preparation Example 1 was repeated except that C.I. Pigment Yellow 147, 155, 55, 74, 83, 138, 139, or 150 (a yellow pigment not having the benzimidazolone structure represented by the structural formula (1)) was used instead of the C.I. Pigment Yellow 192 to prepare pigment dispersion liquids 8 to 15.

Furthermore, the procedure of Preparation Example 1 was repeated except that C.I. Pigment Orange 13, 62, or 64 was used instead of the C.I. Pigment Yellow 192 to prepare pigment dispersion liquids 16 to 18.

The amounts (g) of the starting materials used are shown in Table 1.

Preparation Examples 19 to 32

The procedure of Preparation Example 1 was repeated except that C.I. Pigment Blue 15:6, 60, or 16 was used instead of the C.I. Pigment Yellow 192 to prepare pigment dispersion liquids 19 to 21.

The procedure of Preparation Example 1 was repeated except that C.I. Pigment Red 123, 149, 179, 190, or 254 was used instead of the C.I. Pigment Yellow 192 to prepare pigment dispersion liquids 22 to 26.

The procedure of Preparation Example 1 was repeated except that C.I. Pigment Violet 19, 29, 37, or 23 was used instead of the C.I. Pigment Yellow 192 to prepare pigment dispersion liquids 27 to 30.

The procedure of Preparation Example 1 was repeated except that C.I. Pigment Green 7 was used instead of the C.I. Pigment Yellow 192 to prepare pigment dispersion liquid 31.

The procedure of Preparation Example 1 was repeated except that C.I. Pigment Black 7 was used instead of the C.I. Pigment Yellow 192 to prepare pigment dispersion liquid 32. The C.I. Pigment Black 7 used was acidic carbon black produced by furnace method.

The amounts (g) of the starting materials used are shown in Table 2.

TABLE 2

| | | Pigment | | | Dispersant (SOLSPERSE 20000) Weight (g) | Dispersant (Tego dispers 655) Weight (g) | Solvent (PGMEA) Weight (g) |
|---|---|---|---|---|---|---|---|
| | Pigment dispersion liquid | Colour Index Generic name | Benzimidazolone structure represented by structural formula (1) | Weight (g) | | | |
| Preparation Example 19 | Pigment dispersion liquid 19 | Pigment Blue 15:6 | No | 112.50 | 37.50 | — | 850.00 |
| Preparation Example 20 | Pigment dispersion liquid 20 | Pigment Blue 60 | No | 112.50 | 37.50 | — | 850.00 |
| Preparation Example 21 | Pigment dispersion liquid 21 | Pigment Blue 16 | No | 112.50 | 37.50 | — | 850.00 |
| Preparation Example 22 | Pigment dispersion liquid 22 | Pigment Red 123 | No | 112.50 | 37.50 | — | 850.00 |
| Preparation Example 23 | Pigment dispersion liquid 23 | Pigment Red 149 | No | 112.50 | 37.50 | — | 850.00 |
| Preparation Example 24 | Pigment dispersion liquid 24 | Pigment Red 179 | No | 112.50 | 37.50 | — | 850.00 |
| Preparation Example 25 | Pigment dispersion liquid 25 | Pigment Red 190 | No | 112.50 | 37.50 | — | 850.00 |
| Preparation Example 26 | Pigment dispersion liquid 26 | Pigment Red 254 | No | 112.50 | 37.50 | — | 850.00 |
| Preparation Example 27 | Pigment dispersion liquid 27 | Pigment Violet 19 | No | 112.50 | 37.50 | — | 850.00 |
| Preparation Example 28 | Pigment dispersion liquid 28 | Pigment Violet 29 | No | 112.50 | 37.50 | — | 850.00 |
| Preparation Example 29 | Pigment dispersion liquid 29 | Pigment Violet 37 | No | 112.50 | 37.50 | — | 850.00 |
| Preparation Example 30 | Pigment dispersion liquid 30 | Pigment Violet 23 | No | 112.50 | 37.50 | — | 850.00 |
| Preparation Example 31 | Pigment dispersion liquid 31 | Pigment Green 7 | No | 112.50 | 37.50 | — | 850.00 |
| Preparation Example 32 | Pigment dispersion liquid 32 | Pigment Black 7 | No | 112.50 | 37.50 | — | 850.00 |
| Preparation Example 33 | Pigment dispersion liquid 33 | Pigment Yellow 192 | Yes | 112.50 | — | 37.50 | 850.00 |
| Preparation Example 34 | Pigment dispersion liquid 34 | Pigment Yellow 150 | No | 112.50 | — | 37.50 | 850.00 |
| Preparation Example 35 | Pigment dispersion liquid 35 | Pigment Blue 60 | No | 112.50 | — | 37.50 | 850.00 |
| Preparation Example 36 | Pigment dispersion liquid 36 | Pigment Blue 179 | No | 112.50 | — | 37.50 | 850.00 |
| Preparation Example 37 | Pigment dispersion liquid 37 | Pigment Blue 29 | No | 112.50 | — | 37.50 | 850.00 |

Preparation Example 33

The procedure of Preparation Example 1 was repeated except that Tego dispers 655 (ethylene oxide/styrene oxide polymer dispersant having a phosphoric acid group at the molecule end as an acidic adsorption group) was used as the dispersant instead of the SOLSPERSE 20000 to prepare pigment dispersion liquid 33.

The amounts (g) of the starting materials used are shown in Table 2.

Preparation Examples 34 to 37

The procedure of Preparation Example 1 was repeated except that Tego dispers 655 was used as the dispersant instead of the SOLSPERSE 20000 and C.I. Pigment Yellow 150, C.I. Pigment Blue 60, C.I. Pigment Red 179, or C.I. Pigment Violet 29 was used instead of the Pigment Yellow 192 to prepare pigment dispersion liquids 34 to 37.

The amounts (g) of the starting materials used are shown in Table 2.

Preparation Example 38

6.60 g of pigment dispersion liquid 1, 8.80 g of pigment dispersion liquid 20, and 6.60 g of pigment dispersion liquid 24 were mixed, and after stirring, 5.63 g of polyimide resin solution A, 1.69 g of ε-caprolactone-added acrylate of dipentaerythritol which is a compound having 2 or more radical-polymerizable groups (KAYARAD DPCA-60 manufactured by Nippon Kayaku Co., Ltd.), 0.45 g of "ADEKA ARKLS" (Registered Trademark) NCI-831 (manufactured by ADEKA) (a photoinitiator), 0.38 g of VG-3101L which is a compound having 3 epoxy groups in the molecule (a thermal crosslinking agent), and 11.36 g of PGMEA and 8.50 g of MBA (solvents) were mixed, and after tight sealing, the mixture was stirred for 30 minutes on a shaker to prepare a negative photosensitive composition 1 having a solid content of 15% by weight. The amounts (g) of the starting materials used are shown in Table 3.

TABLE 3

| | Composition | Pigment dispersion liquid Name | Pigment dispersion liquid Weight (g) | Polyimide resin solution A Weight (g) | Compound having 2 or more radical-polymerizable groups (DPCA-60) Weight (g) | Photo-initiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|
| Preparation Example 38 | Negative photosensitive composition 1 | Pigment dispersion liquid 1 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 39 | Negative photosensitive composition 2 | Pigment dispersion liquid 2 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 40 | Negative photosensitive composition 3 | Pigment dispersion liquid 3 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 41 | Negative photosensitive composition 4 | Pigment dispersion liquid 4 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 42 | Negative photosensitive composition 5 | Pigment dispersion liquid 5 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 43 | Negative photosensitive composition 6 | Pigment dispersion liquid 6 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 44 | Negative photosensitive composition 7 | Pigment dispersion liquid 7 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 45 | Negative photosensitive composition 8 | Pigment dispersion liquid 1 | 2.20 | 5.63 | 1.69 | 0.45 | 0.38 | 11.36 | 8.50 |
| | | Pigment dispersion liquid 20 | 11.00 | | | | | | |
| | | Pigment dispersion liquid 24 | 8.80 | | | | | | |
| Preparation Example 46 | Negative photosensitive composition 9 | Pigment dispersion liquid 1 | 8.80 | 5.63 | 1.69 | 0.45 | 0.38 | 11.36 | 8.50 |
| | | Pigment dispersion liquid 20 | 8.80 | | | | | | |
| | | Pigment dispersion liquid 24 | 4.40 | | | | | | |
| Preparation Example 47 | Negative photosensitive composition 10 | Pigment dispersion liquid 1 | 3.30 | 5.63 | 1.69 | 0.45 | 0.38 | 11.36 | 8.50 |
| | | Pigment dispersion liquid 8 | 3.30 | | | | | | |
| | | Pigment dispersion liquid 20 | 8.80 | | | | | | |
| | | Pigment dispersion liquid 24 | 6.60 | | | | | | |

Preparation Examples 39 to 54

Negative photosensitive compositions 2 to 17 having a solid content of 15% by weight were respectively prepared by using the starting materials of the type and amount (g) shown in Tables 3 to 4.

TABLE 4

| | Composition | Pigment dispersion liquid Name | Weight (g) | Polyimide resin solution A Weight (g) | WR-301 (cardo resin solution) Weight (g) |
|---|---|---|---|---|---|
| Preparation Example 48 | Negative Photosensitive composition 11 | Pigment dispersion liquid 1<br>Pigment dispersion liquid 9<br>Pigment dispersion liquid 20<br>Pigment dispersion liquid 24 | 3.30<br>3.30<br>8.80<br>6.60 | 5.63 | — |
| Preparation Example 49 | Negative photosensitive composition 12 | Pigment dispersion liquid 1<br>Pigment dispersion liquid 19<br>Pigment dispersion liquid 24 | 6.60<br>8.80<br>6.60 | 5.63 | — |
| Preparation Example 50 | Negative photosensitive composition 13 | Pigment dispersion liquid 1<br>Pigment dispersion liquid 21<br>Pigment dispersion liquid 24 | 6.60<br>8.80<br>6.60 | 5.63 | — |
| Preparation Example 51 | Negative photosensitive composition 14 | Pigment dispersion liquid 1<br>Pigment dispersion liquid 19<br>Pigment dispersion liquid 22 | 6.60<br>8.80<br>6.60 | 5.63 | — |
| Preparation Example 52 | Negative photosensitive composition 15 | Pigment dispersion liquid 1<br>Pigment dispersion liquid 19<br>Pigment dispersion liquid 23 | 6.60<br>8.80<br>6.60 | 5.63 | — |
| Preparation Example 53 | Negative photosensitive composition 16 | Pigment dispersion liquid 1<br>Pigment dispersion liquid 19<br>Pigment dispersion liquid 25 | 6.60<br>8.80<br>6.60 | 5.63 | — |
| Preparation Example 54 | Negative photosensitive composition 17 | Pigment dispersion liquid 1<br>Pigment dispersion liquid 19<br>Pigment dispersion liquid 26 | 6.60<br>8.80<br>6.60 | 5.63 | — |
| Preparation Example 55 | Negative photosensitive composition 18 | Pigment dispersion liquid 1<br>Pigment dispersion liquid 20<br>Pigment dispersion liquid 24 | 6.60<br>8.80<br>6.60 | — | 5.11 |
| Preparation Example 56 | Negative photosensitive composition 19 | Pigment dispersion liquid 1<br>Pigment dispersion liquid 20<br>Pigment dispersion liquid 24 | 6.60<br>8.80<br>6.60 | 3.38 | 2.30 |

| | Compound having 2 or more radical-polymerizable groups (DPCA-60) Weight (g) | Photoinitiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|
| Preparation Example 48 | 1.69 | 0.45 | 0.38 | 11.36 | 8.50 |
| Preparation Example 49 | 1.69 | 0.45 | 0.38 | 11.36 | 8.50 |
| Preparation Example 50 | 1.69 | 0.45 | 0.38 | 11.36 | 8.50 |
| Preparation Example 51 | 1.69 | 0.45 | 0.38 | 11.36 | 8.50 |
| Preparation Example 52 | 1.69 | 0.45 | 0.38 | 11.36 | 8.50 |
| Preparation Example 53 | 1.69 | 0.45 | 0.38 | 11.36 | 8.50 |
| Preparation Example 54 | 1.69 | 0.45 | 0.38 | 11.36 | 8.50 |
| Preparation Example 55 | 1.13 | 0.45 | 0.38 | 12.44 | 8.50 |
| Preparation Example 56 | 1.35 | 0.45 | 0.38 | 11.65 | 8.50 |

Preparation Example 55

6.60 g of pigment dispersion liquid 1, 8.80 g of pigment dispersion liquid 20, and 6.60 g of pigment dispersion liquid 24 were mixed, and after stirring, 5.11 g of an a alkali-soluble resin "ADEKA ARKLS" (Registered Trademark) WR-301 manufactured by ADEKA (a resin solution containing 44% by weight of a cardo resin obtained by reacting a resin obtained by ring-opening addition of an aromatic compound having epoxy group and an unsaturated carboxylic acid with a carboxylic anhydride and 56% by weight of PGMEA), 1.13 g of KAYARAD DPCA-60 which is a compound having 2 or more radical-polymerizable groups, 0.45 g of NCI-831 (a photoinitiator), 0.38 g of VG-3101L which is a compound having 3 epoxy groups in the molecule (a thermal crosslinking agent), and 12.44 g of PGMEA and 8.50 g of MBA (solvents) were mixed, and after tight sealing, the mixture was stirred for 30 minutes on a shaker to prepare a negative photosensitive composition 18 having a solid content of 15% by weight. The amounts (g) of the starting materials used are shown in Table 4. It is to be noted that the WR-301 had a solid content acid value of 99 (mg KOH/g) and a weight average molecular weight of 5700.

Preparation Examples 56 to 88 and 90 to 95

Negative photosensitive compositions 19 to 57 having a solid content of 15% by weight were respectively prepared by using the starting materials of the type and amount (g) shown in Tables 4 to 9.

TABLE 5

| | Composition | Pigment dispersion liquid Name | Weight (g) | Polyimide resin solution A Weight (g) | WR-301 (cardo resin solution) Weight (g) | Compound having 2 or more radical-polymerizable groups (DPCA-60) Weight (g) | Photo-initiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|---|
| Preparation Example 57 | Negative photosensitive composition 20 | Pigment dispersion liquid 1 | 7.70 | 5.63 | — | 1.69 | 0.45 | 0.38 | 11.36 | 8.50 |
| | | Pigment dispersion liquid 27 | 14.30 | | | | | | | |
| Preparation Example 58 | Negative photosensitive composition 21 | Pigment dispersion liquid 1 | 7.70 | 5.63 | — | 1.69 | 0.45 | 0.38 | 11.36 | 8.50 |
| | | Pigment dispersion liquid 28 | 14.30 | | | | | | | |
| Preparation Example 59 | Negative photosensitive composition 22 | Pigment dispersion liquid 1 | 7.70 | 5.63 | — | 1.69 | 0.45 | 0.38 | 11.36 | 8.50 |
| | | Pigment dispersion liquid 29 | 14.30 | | | | | | | |
| Preparation Example 60 | Negative photosensitive composition 23 | Pigment dispersion liquid 1 | 7.70 | 5.63 | — | 1.69 | 0.45 | 0.38 | 11.36 | 8.50 |
| | | Pigment dispersion liquid 30 | 14.30 | | | | | | | |
| Preparation Example 61 | Negative photosensitive composition 24 | Pigment dispersion liquid 1 | 7.70 | — | 5.11 | 1.13 | 0.45 | 0.38 | 12.44 | 8.50 |
| | | Pigment dispersion liquid 28 | 14.30 | | | | | | | |
| Preparation Example 62 | Negative photosensitive composition 25 | Pigment dispersion liquid 1 | 7.70 | 3.38 | 2.30 | 1.35 | 0.45 | 0.38 | 11.65 | 8.50 |
| | | Pigment dispersion liquid 28 | 14.30 | | | | | | | |
| Preparation Example 63 | Negative photosensitive composition 26 | Pigment dispersion liquid 1 | 7.70 | 5.63 | — | 1.69 | 0.45 | 0.38 | 11.36 | 8.50 |
| | | Pigment dispersion liquid 28 | 9.90 | | | | | | | |
| | | Pigment dispersion liquid 19 | 4.40 | | | | | | | |

TABLE 6

| | Composition | Pigment dispersion liquid Name | Weight (g) | Polyimide resin solution A Weight (g) | Compound having 2 or more radical-polymerizable groups (DPCA-60) Weight (g) | Photo-initiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|
| Preparation Example 64 | Negative photosensitive composition 27 | Pigment dispersion liquid 8 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 65 | Negative photosensitive composition 28 | Pigment dispersion liquid 9 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 66 | Negative photosensitive composition 29 | Pigment dispersion liquid 10 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 67 | Negative photosensitive composition 30 | Pigment dispersion liquid 11 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |
| Preparation Example 68 | Negative photosensitive composition 31 | Pigment dispersion liquid 12 | 6.60 | 5.63 | 1.69 | 0.45 | 0.38 | 11.36 | 8.50 |
| | | Pigment dispersion liquid 20 | 8.80 | | | | | | |
| | | Pigment dispersion liquid 24 | 6.60 | | | | | | |

TABLE 6-continued

| | | Pigment dispersion liquid | | Polyimide resin solution A Weight (g) | Compound having 2 or more radical-polymerizable groups (DPCA-60) Weight (g) | Photo-initiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|
| | Composition | Name | Weight (g) | | | | | | |
| Preparation Example 69 | Negative photosensitive composition 32 | Pigment dispersion liquid 13 Pigment dispersion liquid 20 Pigment dispersion liquid 24 | 6.60 8.80 6.60 | 5.63 | 1.69 | 0.45 | 0.38 | 11.36 | 8.50 |
| Preparation Example 70 | Negative photosensitive composition 33 | Pigment dispersion liquid 14 Pigment dispersion liquid 20 Pigment dispersion liquid 24 | 6.60 8.80 6.60 | 5.63 | 1.69 | 0.45 | 0.38 | 11.36 | 8.50 |
| Preparation Example 71 | Negative photosensitive composition 34 | Pigment dispersion liquid 15 Pigment dispersion liquid 20 Pigment dispersion liquid 24 | 6.60 8.80 6.60 | 5.63 | 1.69 | 0.45 | 0.38 | 11.36 | 8.50 |

TABLE 7

| | | Pigment dispersion liquid | | Polyimide resin solution A Weight (g) | Compound having 2 or more radical-polymerizable groups (DPCA-60) Weight (g) | Photo-initiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|
| | Composition | Name | Weight (g) | | | | | | |
| Preparation Example 72 | Negative photosensitive composition 35 | Pigment dispersion liquid 16 Pigment dispersion liquid 20 Pigment dispersion liquid 24 | 6.60 8.80 6.60 | 5.63 | 1.69 | 0.45 | 0.38 | 11.36 | 8.50 |
| Preparation Example 73 | Negative photosensitive composition 36 | Pigment dispersion liquid 17 Pigment dispersion liquid 20 Pigment dispersion liquid 24 | 6.60 8.80 6.60 | 5.63 | 1.69 | 0.45 | 0.38 | 11.36 | 8.50 |
| Preparation Example 74 | Negative photosensitive composition 37 | Pigment dispersion liquid 18 Pigment dispersion liquid 20 Pigment dispersion liquid 24 | 6.60 8.80 6.60 | 5.63 | 1.69 | 0.45 | 0.38 | 11.36 | 8.50 |
| Preparation Example 75 | Negative photosensitive composition 38 | Pigment dispersion liquid 32 Pigment dispersion liquid 20 Pigment dispersion liquid 24 | 5.00 5.00 6.67 | 6.70 | 2.01 | 0.54 | 0.45 | 15.15 | 8.50 |

TABLE 8

| | | Pigment dispersion liquid | | Polyimide resin solution A Weight (g) | Compound having 2 or more radical-polymerizable groups (DPCA-60) Weight (g) | Photo-initiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|
| | Composition | Name | Weight (g) | | | | | | |
| Preparation Example 76 | Negative photosensitive composition 39 | Pigment dispersion liquid 8 Pigment dispersion liquid 28 | 7.70 14.30 | 5.63 | 1.69 | 0.45 | 0.38 | 11.36 | 8.50 |
| Preparation Example 77 | Negative photosensitive composition 40 | Pigment dispersion liquid 9 Pigment dispersion liquid 28 | 7.70 14.30 | 5.63 | 1.69 | 0.45 | 0.38 | 11.36 | 8.50 |
| Preparation Example 78 | Negative photosensitive composition 41 | Pigment dispersion liquid 10 Pigment dispersion liquid 28 | 7.70 14.30 | 5.63 | 1.69 | 0.45 | 0.38 | 11.36 | 8.50 |
| Preparation Example 79 | Negative photosensitive composition 42 | Pigment dispersion liquid 11 Pigment dispersion liquid 28 | 7.70 14.30 | 5.63 | 1.69 | 0.45 | 0.38 | 11.36 | 8.50 |
| Preparation Example 80 | Negative photosensitive composition 43 | Pigment dispersion liquid 12 Pigment dispersion liquid 28 | 7.70 14.30 | 5.63 | 1.69 | 0.45 | 0.38 | 11.36 | 8.50 |
| Preparation Example 81 | Negative photosensitive composition 44 | Pigment dispersion liquid 13 Pigment dispersion liquid 28 | 7.70 14.30 | 5.63 | 1.69 | 0.45 | 0.38 | 11.36 | 8.50 |

TABLE 8-continued

| | Pigment dispersion liquid | | | Polyimide resin solution A | Compound having 2 or more radical-polymerizable groups (DPCA-60) | Photo-initiator (NCI-831) | Thermal crosslinking agent (VG-3101L) | Solvent (PGMEA) | Solvent (MBA) Weight |
|---|---|---|---|---|---|---|---|---|---|
| | Composition | Name | Weight (g) | Weight (g) | Weight (g) | Weight (g) | Weight (g) | Weight (g) | (g) |
| Preparation Example 82 | Negative photosensitive composition 45 | Pigment dispersion liquid 14<br>Pigment dispersion liquid 28 | 7.70<br>14.30 | 5.63 | 1.69 | 0.45 | 0.38 | 11.36 | 8.50 |
| Preparation Example 83 | Negative photosensitive composition 46 | Pigment dispersion liquid 15<br>Pigment dispersion liquid 28 | 7.70<br>14.30 | 5.63 | 1.69 | 0.45 | 0.38 | 11.36 | 8.50 |
| Preparation Example 84 | Negative photosensitive composition 47 | Pigment dispersion liquid 16<br>Pigment dispersion liquid 28 | 7.70<br>14.30 | 5.63 | 1.69 | 0.45 | 0.38 | 11.36 | 8.50 |
| Preparation Example 85 | Negative photosensitive composition 48 | Pigment dispersion liquid 17<br>Pigment dispersion liquid 28 | 7.70<br>14.30 | 5.63 | 1.69 | 0.45 | 0.38 | 11.36 | 8.50 |

TABLE 9

| | Pigment dispersion liquid | | | Polyimide resin solution A | WR-301 (cardo resin solution) | Compound having 2 or more radical-polymerizable groups (DPCA-60) | Photoinitiator (NCI-831) | Thermal crosslinking agent (VG-3101L) | Solvent (PGMEA) | Solvent (MBA) |
|---|---|---|---|---|---|---|---|---|---|---|
| | Composition | Name | Weight (g) | Weight (g) | Weight (g) | Weight (g) | Weight (g) | Weight (g) | Weight (g) | Weight (g) |
| Preparation Example 86 | Negative photosensitive composition 49 | Pigment dispersion liquid 18<br>Pigment dispersion liquid 28 | 7.70<br>14.30 | 5.63 | — | 1.69 | 0.45 | 0.38 | 11.36 | 8.50 |
| Preparation Example 87 | Negative photosensitive composition 50 | Pigment dispersion liquid 31<br>Pigment dispersion liquid 28 | 7.70<br>14.30 | 5.63 | — | 1.69 | 0.45 | 0.38 | 11.36 | 8.50 |
| Preparation Example 88 | Negative photosensitive composition 51 | Pigment dispersion liquid 15<br>Pigment dispersion liquid 28 | 7.70<br>14.30 | 5.63 | — | 1.69 | 0.45 | 0.38 | 11.36 | 8.50 |
| Preparation Example 90 | Negative photosensitive composition 52 | Pigment dispersion liquid 32 | 10.56 | 7.92 | — | 2.38 | 0.63 | 0.53 | 19.48 | 8.50 |
| Preparation Example 91 | Negative photosensitive composition 53 | Pigment dispersion liquid 19<br>Pigment dispersion liquid 26 | 11.00<br>11.00 | 5.63 | — | 1.69 | 0.45 | 0.38 | 11.36 | 8.50 |
| Preparation Example 92 | Negative photosensitive composition 54 | Pigment dispersion liquid 20<br>Pigment dispersion liquid 24 | 11.00<br>11.00 | 5.63 | — | | | | | |
| Preparation Example 93 | Negative photosensitive composition 55 | Pigment dispersion liquid 19<br>Pigment dispersion liquid 24 | 11.00<br>11.00 | 5.63 | — | | | | | |
| Preparation Example 94 | Negative photosensitive composition 56 | Pigment dispersion liquid 19<br>Pigment dispersion liquid 24 | 8.80<br>13.20 | 5.63 | — | | | | | |
| Preparation Example 95 | Negative photosensitive composition 57 | Pigment dispersion liquid 19<br>Pigment dispersion liquid 24 | 13.20<br>8.80 | 5.63 | — | | | | | |

TABLE 9-continued

| | | | | | |
|---|---|---|---|---|---|
| Preparation Example 92 | 1.69 | 0.45 | 0.38 | 11.36 | 8.50 |
| Preparation Example 93 | 1.69 | 0.45 | 0.38 | 11.36 | 8.50 |
| Preparation Example 94 | 1.69 | 0.45 | 0.38 | 11.36 | 8.50 |
| Preparation Example 95 | 1.69 | 0.45 | 0.38 | 11.36 | 8.50 |

Preparation Example 96

3.24 g of pigment dispersion liquid 33, 4.31 g of pigment dispersion liquid 35, and 3.24 g of pigment dispersion liquid 36 were mixed, and after stirring, 16.34 g of polyimide resin solution A, 0.98 g of quinone diazide compound a (a photosensitizer), and 13.40 g of PGMEA and 8.50 g of MBA (solvents) were mixed, and after tight sealing, the mixture was stirred for 30 minutes on a shaker to prepare a positive photosensitive composition 1 having a solid content of 15% by weight. The amounts (g) of the starting materials used are shown in Table 10.

TABLE 10

| | | Pigment dispersion liquid | | Polyimide resin solution A | Quinone-diazide compound a | Solvent (PGMEA) | Solvent (MBA) |
|---|---|---|---|---|---|---|---|
| | Composition | Name | Weight (g) | Weight (g) | Weight (g) | Weight (g) | Weight (g) |
| Preparation Example 96 | Positive photosensitive composition 1 | Pigment dispersion liquid 33<br>Pigment dispersion liquid 35<br>Pigment dispersion liquid 36 | 3.24<br>4.31<br>3.24 | 16.34 | 0.98 | 13.40 | 8.50 |
| Preparation Example 97 | Positive photosensitive composition 2 | Pigment dispersion liquid 33<br>Pigment dispersion liquid 37 | 3.77<br>7.01 | 16.34 | 0.98 | 13.40 | 8.50 |
| Preparation Example 98 | Positive photosensitive composition 3 | Pigment dispersion liquid 34<br>Pigment dispersion liquid 35<br>Pigment dispersion liquid 36 | 3.24<br>4.31<br>3.24 | 16.34 | 0.98 | 13.40 | 8.50 |
| Preparation Example 99 | Positive photosensitive composition 4 | Pigment dispersion liquid 34<br>Pigment dispersion liquid 37 | 3.77<br>7.01 | 16.34 | 0.98 | 13.40 | 8.50 |

Preparation Example 97 to 99

Positive photosensitive compositions 2 to 4 having a solid content of 15% by weight were respectively prepared by using the starting materials of the type and amount (g) shown in Table 10.

Example 1

Negative photosensitive composition 1 was coated on the surface of the TEMPAX (light-transmitting glass substrate of 50 mm×50 mm) with a spin coater by adjusting the rotation speed so that the thickness of the resulting cured film was 1.0 µm, and the coated film was prebaked at 100° C. for 120 seconds in atmospheric pressure by using a hot plate (SCW-636 manufactured by DAINIPPON SCREEN MFG. CO., LTD.) to obtain a prebaked film. The entire surface of the thus obtained prebaked film was irradiated with a minimum necessary exposure amount of the mixed ray from an ultra-high-pressure mercury lamp including j-line (313 nm), i-line (wavelength 365 nm), h-line (wavelength 405 nm), and g-line (wavelength 436 nm) for the exposure by using an opposite-surface alignment single-surface exposure system to obtain the exposed film. Next, the exposed film was developed for 60 seconds with 2.38% by weight aqueous solution of TMAH by using a small size developer apparatus for photolithography (AD-2000 manufactured by Takizawa Sangyo K.K.), and the film was rinsed for 30 seconds with deionized water to obtain a developed film. The developed film was heated at 250° C. for 60 minutes in nitrogen atmosphere by using a high-temperature inert gas oven (INH-9CD-S manufactured by Koyo Thermo Systems Co., Ltd.) to form a cured film having a thickness of 1.0 µm on the TEMPAX. By using the substrate for evaluating the optical properties prepared as described above, optical properties of the cured film were evaluated. The results are shown in Table 11.

Next, negative photosensitive composition 1 was coated on the surface of an aluminum substrate (70 mm×70 mm) having a thickness of 0.5 mm using a spin coater by adjusting the rotation speed so that the thickness of the resulting cured film was 2.0 µm to produce the coated film. The coated film was then prebaked at atmospheric pressure at 100° C. for 120 seconds by using a hot plate to obtain the prebaked film. The entire surface of the thus obtained prebaked film was irradiated with a minimum necessary exposure amount of the mixed ray from an ultra-high-pressure mercury lamp including j-line (313 nm), i-line (wavelength 365 nm), h-line (wavelength 405 nm), and g-line (wavelength 436 nm) for the exposure by using an opposite-surface alignment single-surface exposure system to obtain the exposed film. The exposed film was heated to 250° C. for 60 minutes in nitrogen atmosphere by using a high temperature inert gas oven to prepare a cured film having a thickness of 2.0 µm on the aluminum substrate. An aluminum thin film was formed in a pattern to a thickness of 70 nm on the surface of the cured film to obtain a substrate for evaluating the permittivity. The results of permittivity evaluation of the cured film are shown in Table 11. It is to be noted that the hot plate, the opposite-surface alignment single-surface exposure system, and the high temperature inert gas oven were the same as those used in the preparation of the substrate for evaluating the optical properties.

TABLE 11

| | Composition | Light shielding material (a) (mixing ratio in all pigment components in light shielding material (a) (weight %)) | | | (1) Evaluation of optical properties | | (2) Evaluation of permittivity (1 kHz) |
|---|---|---|---|---|---|---|---|
| | | | | | (i) Optical density (OD value) | (ii) Difference between maximum light transmittance in wavelength range of 380 to 450 nm and light transmittance at wavelength of 550 nm | |
| Example 1 | Negative photosensitive composition 1 | Pigment Yellow 192 (30) | Pigment Blue 60 (40) | Pigment Red 179 (30) | 1.0 | A | 3.6 |
| Example 2 | Negative photosensitive composition 2 | Pigment Yellow 120 (30) | Pigment Blue 60 (40) | Pigment Red 179 (30) | 1.0 | A | 3.6 |
| Example 3 | Negative photosensitive composition 3 | Pigment Yellow 181 (30) | Pigment Blue 60 (40) | Pigment Red 179 (30) | 1.0 | A | 3.6 |
| Example 4 | Negative photosensitive composition 4 | Pigment Yellow 194 (30) | Pigment Blue 60 (40) | Pigment Red 179 (30) | 1.0 | A | 3.6 |
| Example 5 | Negative photosensitive composition 5 | Pigment Yellow 151 (30) | Pigment Blue 60 (40) | Pigment Red 179 (30) | 1.0 | A | 3.6 |
| Example 6 | Negative photosensitive composition 6 | Pigment Yellow 175 (30) | Pigment Blue 60 (40) | Pigment Red 179 (30) | 1.0 | A | 3.6 |
| Example 7 | Negative photosensitive composition 7 | Pigment Yellow 180 (30) | Pigment Blue 60 (40) | Pigment Red 179 (30) | 1.0 | A | 3.6 |
| Example 8 | Negative photosensitive composition 8 | Pigment Yellow 192 (10) | Pigment Blue 60 (50) | Pigment Red 179 (40) | 1.1 | C | 3.6 |
| Example 9 | Negative photosensitive composition 9 | Pigment Yellow 192 (40) | Pigment Blue 60 (40) | Pigment Red 179 (20) | 0.8 | A | 3.6 |

Next, an organic EL display device for evaluating the light-emitting reliability having the cured film obtained by curing the negative photosensitive composition 1 as the pixel division layer was prepared by the procedure as described below.

Figure 3:
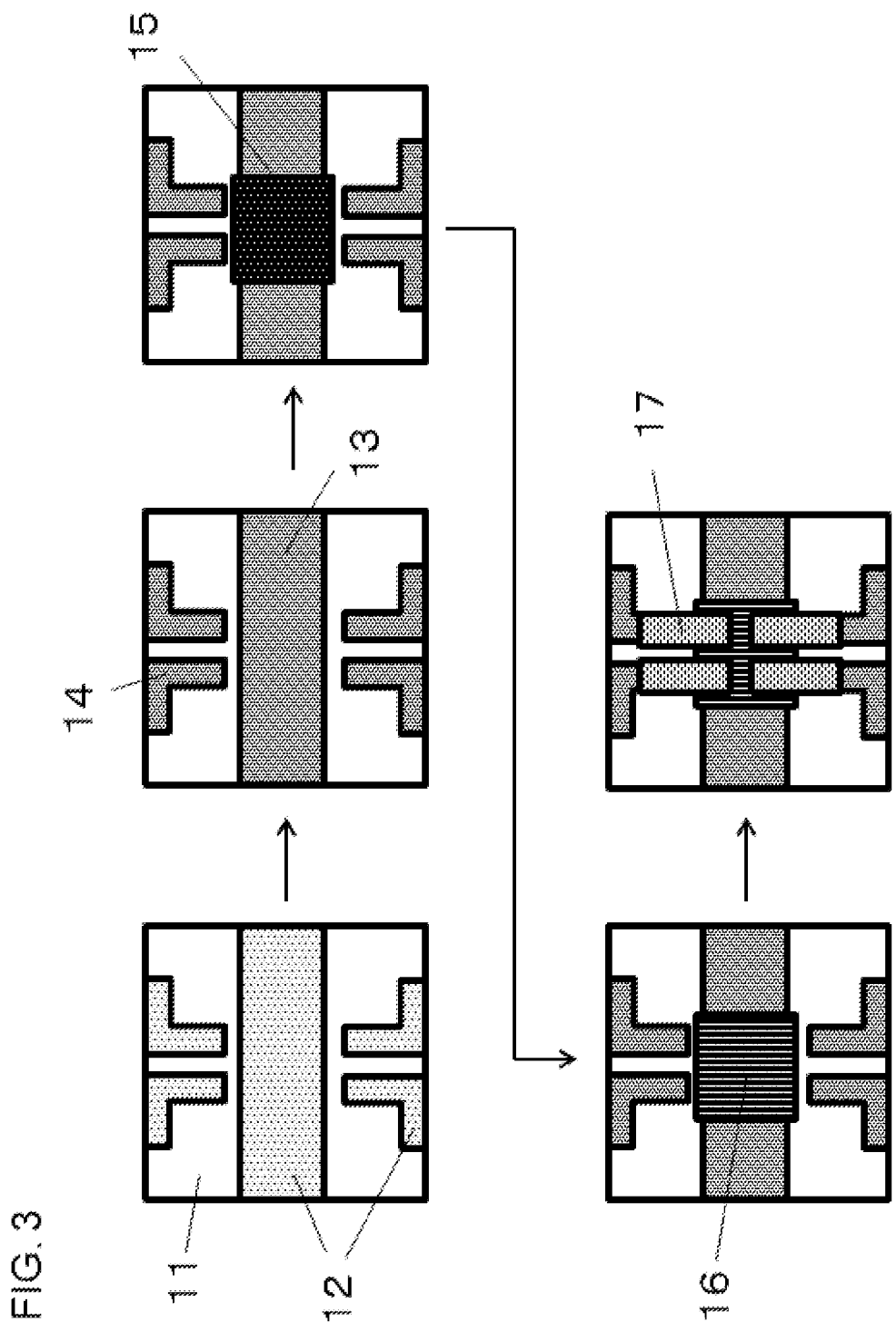
FIG. 3 is a schematic view showing production method of the organic EL display device of the present invention in the Examples.

FIG. 3 shows production steps of an organic EL display device having the pixel division layer.

A silver/copper alloy thin film (volume ratio, 10:1) having a thickness of 10 nm was formed on the entire surface of an alkali-free glass substrate (11) (38 mm×46 mm) by sputtering, and a patterned metal reflective layer (12) was formed by etching. Next, an ITO transparent electro-conductive film having a thickness of 10 nm was formed on the entire surface by sputtering, and a similarly patterned second electrode (13) and an auxiliary electrode (14) as the lead electrode were formed by etching, and ultrasonic washing was conducted by "Semico Clean" (Registered Trademark) 56 (manufactured by Furuuchi Chemical Corporation) for 10 minutes and washing with ultrapure water was conducted to obtain the substrate with the electrodes formed thereon.

Negative photosensitive composition 1 was coated on the substrate formed with the electrode using a spin coater (MS-A100 manufactured by Mikasa) by adjusting the rotation speed so that the thickness of the resulting pixel division layer was 1.0 μm to thereby obtain the coated film. The coated film was then prebaked at atmospheric pressure at 100° C. for 120 seconds by using a hot plate (SCW-636 manufactured by DAINIPPON SCREEN MFG. CO., LTD.) to obtain the prebaked film.

The prebaked film was irradiated with a minimum necessary exposure amount of the mixed ray from an ultra-high-pressure mercury lamp including j-line (313 nm), i-line (wavelength 365 nm), h-line (wavelength 405 nm), and g-line (wavelength 436 nm) for the exposure in a pattern by using an opposite-surface alignment single-surface exposure system (Mask Aligner PEM-6M manufactured by Union Optical Co., LTD.) through a negative exposure mask to obtain the exposed film. Next, the exposed film was developed for 60 seconds with 2.38% by weight aqueous solution of TMAH by using a small size developer apparatus for photolithography (AD-2000 manufactured by Takizawa Sangyo K.K.), and the film was rinsed for 30 seconds with deionized water to obtain a developed film.

In addition, the developed film was heated to 250° C. for 60 minutes in nitrogen atmosphere by using a high temperature inert gas oven to prepare the cured film to thereby obtain a substrate 1 having the pixel division layer (15) having a thickness of 1.0 μm formed thereon wherein openings (each having the size of 70 μm in transverse direction and 260 μm in longitudinal direction) were arranged in the area of 16 mm in longitudinal direction and 16 mm in transverse direction at the center of the substrate with the electrodes formed thereon. The opening rate was 25%. It is to be noted that this opening was the part which would finally be the light emitting pixel part of the organic EL display device after the process as described below.

Next, an organic EL display device was prepared by using the substrate 1 having the pixel division layer formed thereon. In order to form a light emitting pixel (16) including the light-emitting layer by vacuum deposition, first, the substrate 1 having the pixel division layer formed thereon was rotated against the vacuum deposition source under the deposition condition of the vacuum degree of up to $1\times10^{-3}$ Pa to deposit compound (HT-1) to a film thickness of 10 nm as the hole injection layer, and then, compound (HT-2) to a film thickness of 50 nm as the hole transport layer. Next, on the light-emitting layer, compound (GH-1) as the host material and compound (GD-1) as the dopant material were deposited by vapor deposition so that the film thickness was 40 nm. Subsequently, compound (ET-1) and compound (LiQ) were laminated at a volume ratio of 1:1 to a film thickness of 40 nm as the electron carrier material.

Next, the compound (LiQ) was deposited by vapor deposition to a film thickness of 2 nm, and a silver/magnesium alloy (volume ratio, 10:1) was deposited by vapor deposition to a film thickness of 10 nm for use as the first electrode (17). Subsequently, the sealing was accomplished by adhering a cap-shaped glass plate using the epoxy resin adhesive in a low humidity/nitrogen atmosphere to produce the organic EL display device 1. The thickness as used herein is the value displayed on the quartz oscillating film thickness monitor.

The chemical structure of the group of compounds (HT-1, HT-2, GD-1, GH-1, LiQ, and ET-1) used for the formation of the light emitting pixel are as shown below.

[Chemical formula 18]

HT-1

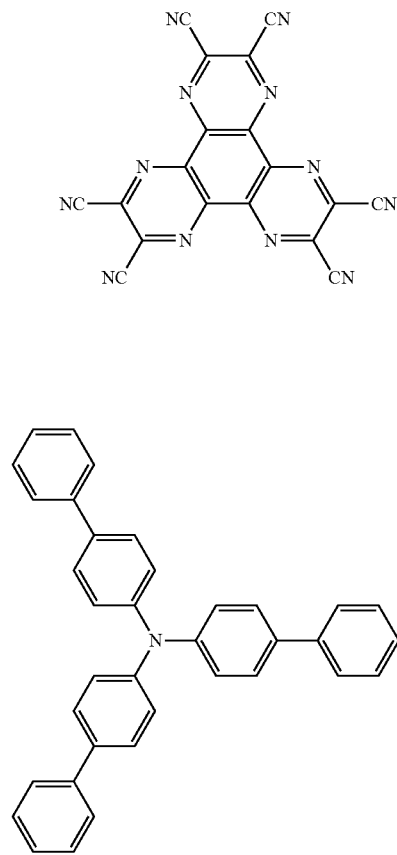

HT-2

[Chemical formula 19]

GD-1

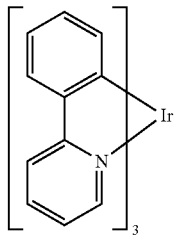

GH-1

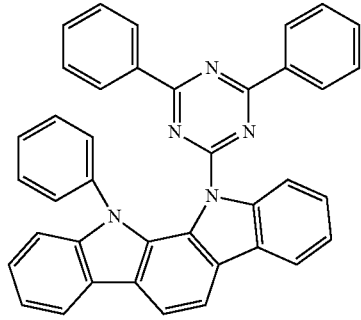

[Chemical formula 20]

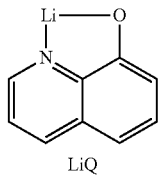

LiQ

ET-1

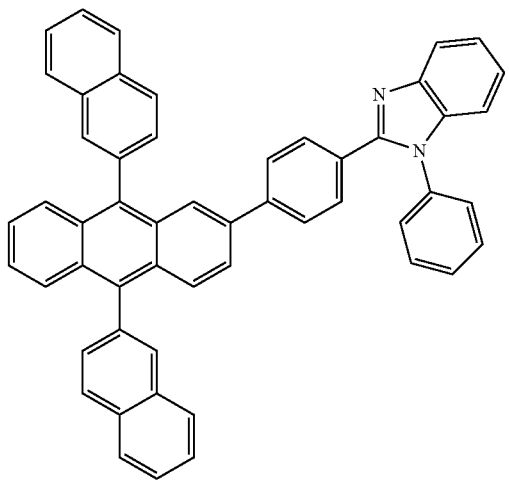

Next, the same procedure was repeated while changing the opening rate of the negative exposure mask to produce organic EL display device 2 having a pixel division layer having an opening rate of 18%.

The organic EL display devices 1 and 2 were evaluated for the light-emitting reliability by the procedure as described above, and the results of the evaluation are shown in Table 12.

TABLE 12

| | | (3) Evaluation of light-emitting reliability | | | | | | | | |
|---|---|---|---|---|---|---|---|---|---|---|
| | | Organic EL display device having pixel division layer | | | | | | Organic EL display device having pixel division layer and planarization layer | | |
| | | Evaluation at pixel division layer opening rate of 25% | | | Evaluation at pixel division layer opening rate of 18% | | | Evaluation at pixel division layer opening rate of 18% | | |
| | Composition | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Example 1 | Negative photosensitive composition 1 | A | A | A | A | A | B | A | A | B |
| Example 2 | Negative photosensitive composition 2 | A | A | B | A | A | B | A | B | C |
| Example 3 | Negative photosensitive composition 3 | A | A | B | A | A | B | A | B | B |
| Example 4 | Negative photosensitive composition 4 | A | A | B | A | A | B | A | A | C |
| Example 5 | Negative photosensitive composition 5 | A | A | B | A | A | C | A | B | C |
| Example 6 | Negative photosensitive composition 6 | A | A | B | A | A | C | A | B | C |
| Example 7 | Negative photosensitive composition 7 | A | A | B | A | A | C | A | A | C |
| Example 8 | Negative photosensitive composition 8 | A | A | A | A | A | B | A | A | B |
| Example 9 | Negative photosensitive composition 9 | A | A | A | A | A | B | A | A | B |

Next, an organic EL display device for evaluating the a light-emitting reliability having the cured films obtained by curing the negative photosensitive composition 1 as the pixel division layer and the planarization layer was prepared by the procedure as described below.

Figure 4:
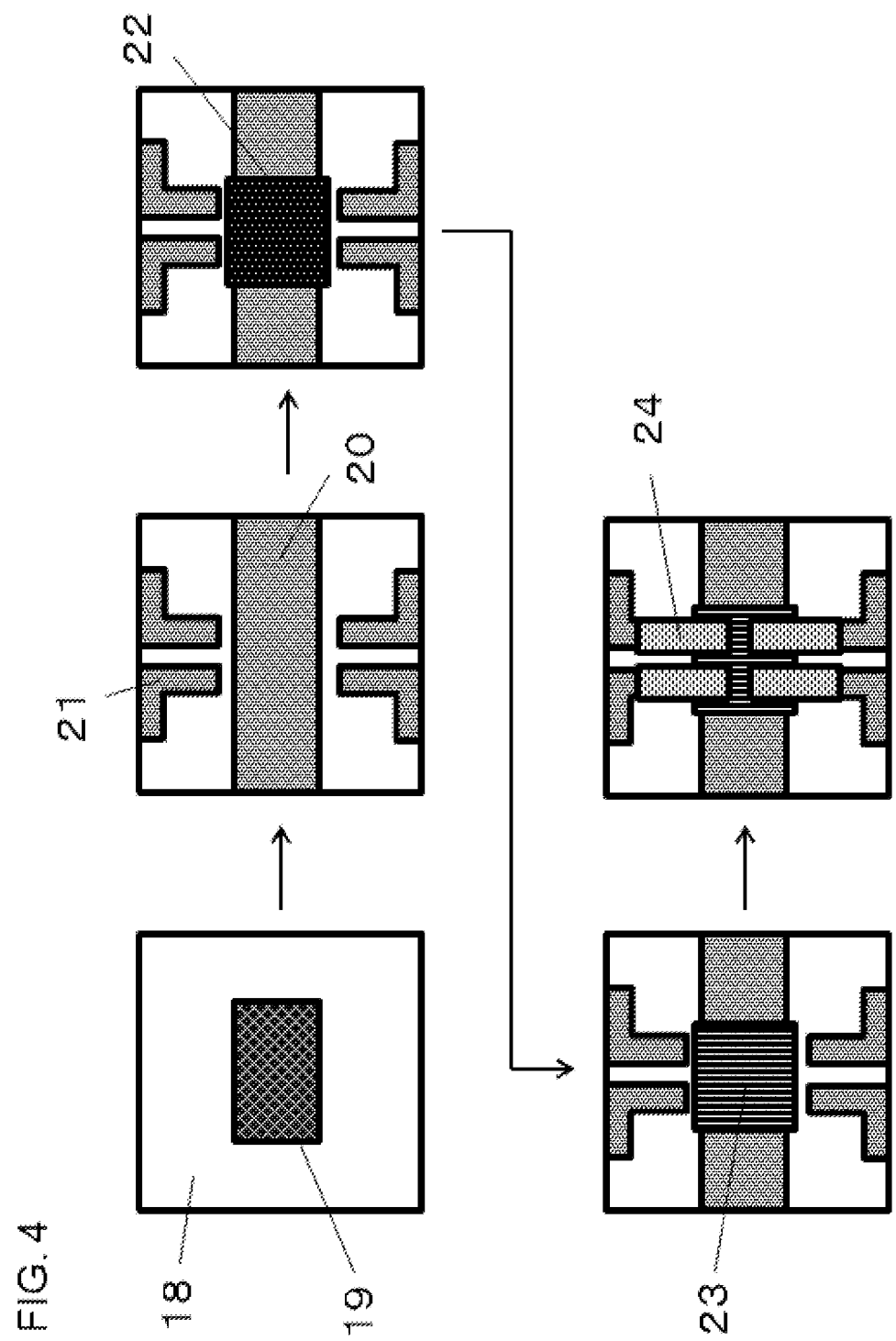
FIG. 4 is a schematic view showing another production method of the organic EL display device of the present invention in the Examples.

FIG. 4 shows the production steps of the organic EL display device having the pixel division layer and the planarization layer.

Negative photosensitive composition 1 was coated on the surface of the alkali-free glass substrate (18) with the size of 38 mm×46 mm using a spin coater by adjusting the rotation speed so that the thickness of the resulting planarization layer was 1.5 µm to produce the coated film. The coated film was then prebaked at atmospheric pressure at 100° C. for 120 seconds by using a hot plate to obtain the prebaked film. The prebaked film was irradiated with a minimum necessary exposure amount of the mixed ray from an ultra-high-pressure mercury lamp including j-line (313 nm), i-line (wavelength 365 nm), h-line (wavelength 405 nm), and g-line (wavelength 436 nm) for the exposure in a pattern by using an opposite-surface alignment single-surface exposure system through a negative exposure mask to obtain the exposed film. Next, the exposed film was developed for 60 seconds with 2.38% by weight aqueous solution of TMAH by using a small size developer apparatus for photolithography, and the film was rinsed for 30 seconds with deionized water to obtain a developed film. The developed film was heated to 250° C. for 60 minutes in nitrogen atmosphere by using a high temperature inert gas oven to prepare the cured film, namely, to prepare a planarization layer (19) in the form of a solid film having no opening in the surface in the center of the alkali-free glass substrate.

Next, on the entire surface of the planarization layer (19), a silver/copper alloy thin film (volume ratio, 10:1) having a thickness of 10 nm and an ITO transparent electroconductive film having a thickness of 10 nm were formed by sputtering in this order. These two layers, namely, the silver/copper alloy thin film and the ITO transparent electroconductive film were simultaneously etched for patterned formation of a metal reflective layer/second electrode (20) and a metal reflective layer/auxiliary electrode (21), and ultrasonic washing was conducted by "Semico Clean" 56 for 10 minutes and washing with ultrapure water was conducted to obtain the substrate with the electrodes formed thereon. It is to be noted that, by forming the laminated pattern including the metal reflective layer/the second electrode so that the opening rate is 70% of the effective light emitting area of the resulting organic EL display device, the state wherein, of the surface area of the planarization layer (19), 30% of the film surface is covered by the laminated pattern and 70% of the film surface is left exposed was realized. The following steps were conducted by repeating the procedure of preparing the organic EL display device 2 as described above to form a pixel division layer (22) using negative photosensitive composition 1 and a light emitting pixel (23) and a first electrode

(24) in this order, and after potting, organic EL display device 3 having a pixel division layer having a film thickness of 1.0 μm and an opening rate of 18% and a planarization layer having a film thickness of 1.5 μm and an opening rate of 0% was produced. The light-emitting reliability was evaluated by the procedure as described above. The results of the evaluation are shown in Table 12.

Examples 2 to 26 and Comparative Examples 1 to 31

The procedure of Example 1 was repeated except that the negative photosensitive composition 1 was respectively replaced with negative photosensitive compositions 2 to 57 to conduct the formation of the cured film and the production of the organic EL display device, and the optical properties, the permittivity, and the light-emitting reliability were evaluated by the procedure as described above. The negative photosensitive compositions used and the evaluation results are together shown in Tables 11 to 24. It is to be notated that, in Examples 2 to 26 and Comparative Examples 1 to 31, the procedure of Example 1 was repeated while using the same photosensitive composition to form the pixel division layer and the planarization layer of the organic EL display device.

TABLE 13

| | Composition | Type of light shielding material (a) (mixing ratio in light shielding material (a) (weight %)) | | | |
|---|---|---|---|---|---|
| Example 10 | Negative photosensitive composition 10 | Pigment Yellow 147 (15) | Pigment Yellow 192 (15) | Pigment Blue 60 (40) | Pigment Red 179 (30) |
| Example 11 | Negative photosensitive composition 11 | Pigment Yellow 155 (15) | Pigment Yellow 192 (15) | Pigment Blue 60 (40) | Pigment Red 179 (30) |
| Example 12 | Negative photosensitive composition 12 | Pigment Yellow 192 (30) | Pigment Blue 15:6 (40) | Pigment Red 179 (30) | — |
| Example 13 | Negative photosensitive composition 13 | Pigment Yellow 192 (30) | Pigment Blue 16 (40) | Pigment Red 179 (30) | — |
| Example 14 | Negative photosensitive composition 14 | Pigment Yellow 192 (30) | Pigment Blue 15:6 (40) | Pigment Red 123 (30) | — |
| Example 15 | Negative photosensitive composition 15 | Pigment Yellow 192 (30) | Pigment Blue 15:6 (40) | Pigment Red 149 (30) | — |
| Example 16 | Negative photosensitive composition 16 | Pigment Yellow 192 (30) | Pigment Blue 15:6 (40) | Pigment Red 190 (30) | — |
| Example 17 | Negative photosensitive composition 17 | Pigment Yellow 192 (30) | Pigment Blue 15:6 (40) | Pigment Red 254 (30) | — |
| Example 18 | Negative photosensitive composition 18 | Pigment Yellow 192 (30) | Pigment Blue 60 (40) | Pigment Red 179 (30) | — |
| Example 19 | Negative photosensitive composition 19 | Pigment Yellow 192 (30) | Pigment Blue 60 (40) | Pigment Red 179 (30) | — |

| | (1) Evaluation of optical properties | | |
|---|---|---|---|
| | (i) Optical density (OD value) | (ii) Difference between maximum light transmittance in wavelength range of 380 to 450 nm and light transmittance at wavelength of 550 nm | (2) Evaluation of permittivity (1 kHz) |
| Example 10 | 1.0 | A | 3.6 |
| Example 11 | 1.0 | A | 3.6 |
| Example 12 | 1.1 | A | 3.8 |
| Example 13 | 1.0 | A | 3.6 |
| Example 14 | 1.0 | A | 3.8 |
| Example 15 | 1.0 | A | 3.8 |
| Example 16 | 1.1 | A | 3.8 |
| Example 17 | 0.9 | A | 3.8 |
| Example 18 | 1.0 | A | 3.5 |
| Example 19 | 1.0 | A | 3.6 |

TABLE 14

| | Composition | Type of light shielding material (a) (mixing ratio in light sheilding material (a) (weight %)) | | | | (3) Evaluation of light-emitting reliability Organic EL display device having pixel division layer Evaluation at pixel division layer opening rate of 25% | | |
|---|---|---|---|---|---|---|---|---|
| | | | | | | Area percentage of light emitting part after 1 hour | Area percentage of light emitting part after 500 hours | Area percentage of light emitting part after 1000 hours |
| Example 10 | Negative photosensitive composition 10 | Pigment Yellow 147 (15) | Pigment Yellow 192 (15) | Pigment Blue 60 (40) | Pigment Red 179 (30) | A | A | B |
| Example 11 | Negative photosensitive composition 11 | Pigment Yellow 155 (15) | Pigment Yellow 192 (15) | Pigment Blue 60 (40) | Pigment Red 179 (30) | A | A | B |
| Example 12 | Negative photosensitive composition 12 | Pigment Yellow 192 (30) | Pigment Blue 15:6 (40) | Pigment Red 179 (30) | — | A | A | A |
| Example 13 | Negative photosensitive composition 13 | Pigment Yellow 192 (30) | Pigment Blue 16 (40) | Pigment Red 179 (30) | — | A | A | B |
| Example 14 | Negative photosensitive composition 14 | Pigment Yellow 192 (30) | Pigment Blue 15:6 (40) | Pigment Red 123 (30) | — | A | A | A |
| Example 15 | Negative photosensitive composition 15 | Pigment Yellow 192 (30) | Pigment Blue 15:6 (40) | Pigment Red 149 (30) | — | A | A | A |
| Example 16 | Negative photosensitive composition 16 | Pigment Yellow 192 (30) | Pigment Blue 15:6 (40) | Pigment Red 190 (30) | — | A | A | A |
| Example 17 | Negative photosensitive composition 17 | Pigment Yellow 192 (30) | Pigment Blue 15:6 (40) | Pigment Red 254 (30) | — | A | B | C |
| Example 18 | Negative photosensitive composition 18 | Pigment Yellow 192 (30) | Pigment Blue 60 (40) | Pigment Red 179 (30) | — | A | A | C |
| Example 19 | Negative photosensitive composition 19 | Pigment Yellow 192 (30) | Pigment Blue 60 (40) | Pigment Red 179 (30) | — | A | A | B |

| | (3) Evaluation of light-emitting reliability | | | | | |
|---|---|---|---|---|---|---|
| | Organic EL display device having pixel division layer Evaluation at pixel division layer opening rate of 18% | | | Organic EL display device having pixel division layer and planarization layer Evaluation at pixel division layer opening rate of 18% | | |
| | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Example 10 | A | B | C | A | B | C |
| Example 11 | A | B | C | A | B | C |
| Example 12 | A | A | B | A | A | B |
| Example 13 | A | A | C | A | A | C |
| Example 14 | A | A | B | A | A | B |
| Example 15 | A | A | B | A | A | B |
| Example 16 | A | A | B | A | A | B |
| Example 17 | A | B | C | A | B | C |

TABLE 14-continued

| | | | | | | |
|---|---|---|---|---|---|---|
| Example 18 | A | A | C | A | A | C |
| Example 19 | A | A | C | A | A | C |

TABLE 15

| | Composition | Type of light shielding material (a) (mixing ratio in light shielding material (a) (weight %)) | | |
|---|---|---|---|---|
| Example 20 | Negative photosensitive composition 20 | Pigment Yellow 192 (35) | Pigment Violet 19 (65) | — |
| Example 21 | Negative photosensitive composition 21 | Pigment Yellow 192 (35) | Pigment Violet 29 (65) | — |
| Example 22 | Negative photosensitive composition 22 | Pigment Yellow 192 (35) | Pigment Violet 37 (65) | — |
| Example 23 | Negative photosensitive composition 23 | Pigment Yellow 192 (35) | Pigment Violet 23 (65) | — |
| Example 24 | Negative photosensitive composition 24 | Pigment Yellow 192 (35) | Pigment Violet 29 (65) | — |
| Example 25 | Negative photosensitive composition 25 | Pigment Yellow 192 (35) | Pigment Violet 29 (65) | — |
| Example 26 | Negative photosensitive composition 26 | Pigment Yellow 192 (35) | Pigment Violet 29 (45) | Pigment Blue 15:6 (20) |

| | (1) Evaluation of optical properties | | (2) Evaluation of permittivity (1 kHz) |
|---|---|---|---|
| | (i) Optical density (OD value) | (ii) Difference between maximum light transmittance in wavelength range of 380 to 450 nm and light transmittance at wavelength of 550 nm | |
| Example 20 | 1.0 | B | 3.6 |
| Example 21 | 1.1 | B | 3.6 |
| Example 22 | 1.3 | B | 3.6 |
| Example 23 | 1.3 | B | 3.6 |
| Example 24 | 1.1 | B | 3.6 |
| Example 25 | 1.1 | B | 3.6 |
| Example 26 | 1.1 | A | 3.7 |

TABLE 16

| | Composition | Type of light shielding material (a) (mixing ratio in light shielding material (a) (weight %)) | | | (3) Evaluation of light-emitting reliability Organic EL display device having pixel division layer Evaluation at pixel division layer opening rate of 25% | | |
|---|---|---|---|---|---|---|---|
| | | | | | Area percentage of light emitting part after 1 hour | Area percentage of light emitting part after 500 hours | Area percentage of light emitting part after 1000 hours |
| Example 20 | Negative photosensitive composition 20 | Pigment Yellow 192 (35) | Pigment Violet 19 (65) | — | A | A | A |
| Example 21 | Negative photosensitive composition 21 | Pigment Yellow 192 (35) | Pigment Violet 29 (65) | — | A | A | A |
| Example 22 | Negative photosensitive composition 22 | Pigment Yellow 192 (35) | Pigment Violet 37 (65) | — | A | A | B |
| Example 23 | Negative photosensitive composition 23 | Pigment Yellow 192 (35) | Pigment Violet 23 (65) | — | A | A | B |
| Example 24 | Negative photosensitive composition 24 | Pigment Yellow 192 (35) | Pigment Violet 29 (65) | — | A | A | C |

TABLE 16-continued

| | Composition | Type of light shielding material (a) (mixing ratio in light shielding material (a) (weight %)) | | | | | |
|---|---|---|---|---|---|---|---|
| Example 25 | Negative photosensitive composition 25 | Pigment Yellow 192 (35) | Pigment Violet 29 (65) | — | A | A | C |
| Example 26 | Negative photosensitive composition 26 | Pigment Yellow 192 (35) | Pigment Violet 29 (45) | Pigment Blue 15:6 (20) | A | A | B |

| | (3) Evaluation of light-emitting reliability | | | | | |
|---|---|---|---|---|---|---|
| | Organic EL display device having pixel division layer Evaluation at pixel division layer opening rate of 18% | | | Organic EL display device having pixel division layer and planarization layer Evaluation at pixel division layer opening rate of 18% | | |
| | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Example 20 | A | A | B | A | A | B |
| Example 21 | A | A | B | A | A | B |
| Example 22 | A | A | B | A | A | B |
| Example 23 | A | B | C | A | B | C |
| Example 24 | A | A | C | A | A | C |
| Example 25 | A | A | C | A | A | C |
| Example 26 | A | A | C | A | A | C |

TABLE 17

| | Composition | Type of light shielding material (a) (mixing ratio in light shielding material (a) (weight %)) | | | (1) Evaluation of optical properties | | (2) Evaluation of permittivity (1 kHz) |
|---|---|---|---|---|---|---|---|
| | | | | | (i) Optical density (OD value) | (ii) Difference between maximum light transmittance in wavelength range of 380 to 450 nm and light transmittance at wavelength of 550 nm | |
| Comparative Example 1 | Negative photosensitive composition 27 | Pigment Yellow 147 (30) | Pigment Blue 60 (40) | Pigment Red 179 (30) | 1.0 | A | 3.6 |
| Comparative Example 2 | Negative photosensitive composition 28 | Pigment Yellow 155 (30) | Pigment Blue 60 (40) | Pigment Red 179 (30) | 1.0 | A | 3.6 |
| Comparative Example 3 | Negative photosensitive composition 29 | Pigment Yellow 55 (30) | Pigment Blue 60 (40) | Pigment Red 179 (30) | 1.0 | A | 3.6 |
| Comparative Example 4 | Negative photosensitive composition 30 | Pigment Yellow 74 (30) | Pigment Blue 60 (40) | Pigment Red 179 (30) | 1.0 | B | 3.6 |
| Comparative Example 5 | Negative photosensitive composition 31 | Pigment Yellow 83 (30) | Pigment Blue 60 (40) | Pigment Red 179 (30) | 1.0 | A | 3.6 |
| Comparative Example 6 | Negative photosensitive composition 32 | Pigment Yellow 138 (30) | Pigment Blue 60 (40) | Pigment Red 179 (30) | 1.0 | A | 3.6 |
| Comparative Example 7 | Negative photosensitive composition 33 | Pigment Yellow 139 (30) | Pigment Blue 60 (40) | Pigment Red 179 (30) | 1.0 | B | 3.6 |
| Comparative Example 8 | Negative photosensitive composition 34 | Pigment Yellow 150 (30) | Pigment Blue 60 (40) | Pigment Red 179 (30) | 1.0 | B | 4.0 |

TABLE 18

| | Composition | Type of light shielding material (a) (mixing ratio in light shielding material (a) (weight %)) | | | (3) Evaluation of light-emitting reliability Organic EL display device having pixel division layer Evaluation at pixel division layer opening rate of 25% | | |
|---|---|---|---|---|---|---|---|
| | | | | | Area percentage of light emitting part after 1 hour | Area percentage of light emitting part after 500 hours | Area percentage of light emitting part after 1000 hours |
| Comparative Example 1 | Negative photosensitive composition 27 | Pigment Yellow 147 (30) | Pigment Blue 60 (40) | Pigment Red 179 (30) | A | B | D |
| Comparative Example 2 | Negative photosensitive composition 28 | Pigment Yellow 155 (30) | Pigment Blue 60 (40) | Pigment Red 179 (30) | A | B | D |
| Comparative Example 3 | Negative photosensitive composition 29 | Pigment Yellow 55 (30) | Pigment Blue 60 (40) | Pigment Red 179 (30) | A | C | D |
| Comparative Example 4 | Negative photosensitive composition 30 | Pigment Yellow 74 (30) | Pigment Blue 60 (40) | Pigment Red 179 (30) | A | C | D |
| Comparative Example 5 | Negative photosensitive composition 31 | Pigment Yellow 83 (30) | Pigment Blue 60 (40) | Pigment Red 179 (30) | A | C | D |
| Comparative Example 6 | Negative photosensitive composition 32 | Pigment Yellow 138 (30) | Pigment Blue 60 (40) | Pigment Red 179 (30) | A | B | D |
| Comparative Example 7 | Negative photosensitive composition 33 | Pigment Yellow 139 (30) | Pigment Blue 60 (40) | Pigment Red 179 (30) | A | D | E |
| Comparative Example 8 | Negative photosensitive composition 34 | Pigment Yellow 150 (30) | Pigment Blue 60 (40) | Pigment Red 179 (30) | A | D | E |

| | (3) Evaluation of light-emitting reliability | | | | | |
|---|---|---|---|---|---|---|
| | Organic EL display device having pixel division layer Evaluation at pixel division layer opening rate of 18% | | | Organic EL display device having pixel division layer and planarization layer Evaluation at pixel division layer opening rate of 18% | | |
| | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Comparative Example 1 | A | C | D | A | C | E |
| Comparative Example 2 | A | C | D | A | C | E |
| Comparative Example 3 | A | C | E | A | C | E |
| Comparative Example 4 | A | C | E | A | C | E |
| Comparative Example 5 | A | C | E | A | D | E |
| Comparative Example 6 | A | C | E | A | C | E |
| Comparative Example 7 | A | D | E | A | E | E |
| Comparative Example 8 | A | D | E | A | E | E |

TABLE 19

| | Composition | Type of light shielding material (a) (mixing ratio in light shielding material (a) (weight %)) | | | (i) Optical density (OD value) | (1) Evaluation of optical properties (ii) Difference between maximum light transmittance in wavelength range of 380 to 450 nm and light transmittance at wavelength of 550 nm | (2) Evaluation of permittivity (1 kHz) |
|---|---|---|---|---|---|---|---|
| Comparative Example 9 | Negative photosensitive composition 35 | Pigment Orange 13 (30) | Pigment Blue 60 (40) | Pigment Red 179 (30) | 1.0 | B | 3.6 |
| Comparative Example 10 | Negative photosensitive composition 36 | Pigment Orange 62 (30) | Pigment Blue 60 (40) | Pigment Red 179 (30) | 1.0 | B | 3.6 |
| Comparative Example 11 | Negative photosensitive composition 37 | Pigment Orange 64 (30) | Pigment Blue 60 (40) | Pigment Red 179 (30) | 1.0 | C | 3.6 |
| Comparative Example 12 | Negative photosensitive composition 38 | Pigment Black 7 (30) | Pigment Blue 60 (30) | Pigment Red 179 (40) | 1.0 | A | 5.9 |

TABLE 20

| | Composition | Type of light shielding material (a) (mixing ratio in light shielding material (a) (weight %)) | | | (3) Evaluation of light-emitting reliability Organic EL display device having pixel division layer Evaluation at pixel division layer opening rate of 25% | | |
|---|---|---|---|---|---|---|---|
| | | | | | Area percentage of light emitting part after 1 hour | Area percentage of light emitting part after 500 hours | Area percentage of light emitting part after 1000 hours |
| Comparative Example 9 | Negative photosensitive composition 35 | Pigment Orange 13 (30) | Pigment Blue 60 (40) | Pigment Red 179 (30) | A | D | E |
| Comparative Example 10 | Negative photosensitive composition 36 | Pigment Orange 62 (30) | Pigment Blue 60 (40) | Pigment Red 179 (30) | A | D | E |
| Comparative Example 11 | Negative photosensitive composition 37 | Pigment Orange 64 (30) | Pigment Blue 60 (40) | Pigment Red 179 (30) | A | D | E |
| Comparative Example 12 | Negative photosensitive composition 38 | Pigment Black 7 (30) | Pigment Blue 60 (40) | Pigment Red 179 (30) | F | F | F |

| (3) Evaluation of light-emitting reliability | | | | | |
|---|---|---|---|---|---|
| Organic EL display device having pixel division layer Evaluation at pixel division layer opening rate of 18% | | | Organic EL display device having pixel division layer and planarization layer Evaluation at pixel division layer opening rate of 18% | | |
| Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |

TABLE 20-continued

| | | | | | | |
|---|---|---|---|---|---|---|
| Comparative Example 9 | A | D | E | B | D | E |
| Comparative Example 10 | A | D | E | A | D | E |
| Comparative Example 11 | A | E | E | B | E | E |
| Comparative Example 12 | F | F | F | F | F | F |

TABLE 21

| | | | | (1) Evaluation of optical properties | | |
|---|---|---|---|---|---|---|
| | Composition | Type of light shielding material (a) (mixing ratio in light shielding material (a) (weight %)) | | (i) Optical density (OD value) | (ii) Difference between maximum light transmittance range of 380 to 450 nm and light transmittance at wavelength of 550 nm | (2) Evaluation of permittivity (1 kHz) |
| Comparative Example 13 | Negative photosensitive composition 39 | Pigment Yellow 147 (35) | Pigment Violet 29 (65) | 1.0 | B | 3.6 |
| Comparative Example 14 | Negative photosensitive composition 40 | Pigment Yellow 155 (35) | Pigment Violet 29 (65) | 1.0 | B | 3.6 |
| Comparative Example 15 | Negative photosensitive composition 41 | Pigment Yellow 55 (35) | Pigment Violet 29 (65) | 1.1 | B | 3.6 |
| Comparative Example 16 | Negative photosensitive composition 42 | Pigment Yellow 74 (35) | Pigment Violet 29 (65) | 1.1 | B | 3.6 |
| Comparative Example 17 | Negative photosensitive composition 43 | Pigment Yellow 83 (35) | Pigment Violet 29 (65) | 1.1 | B | 3.6 |
| Comparative Example 18 | Negative photosensitive composition 44 | Pigment Yellow 138 (35) | Pigment Violet 29 (65) | 1.1 | B | 3.6 |
| Comparative Example 19 | Negative photosensitive composition 45 | Pigment Yellow 139 (30) | Pigment Violet 29 (65) | 1.1 | C | 3.6 |
| Comparative Example 20 | Negative photosensitive composition 46 | Pigment Yellow 150 (35) | Pigment Violet 29 (65) | 1.1 | C | 4.1 |
| Comparative Example 21 | Negative photosensitive composition 47 | Pigment Orange 13 (35) | Pigment Violet 29 (65) | 1.1 | B | 3.6 |
| Comparative Example 22 | Negative photosensitive composition 48 | Pigment Orange 62 (35) | Pigment Violet 29 (65) | 1.1 | B | 3.6 |

TABLE 22

| | | | | (3) Evaluation of light-emitting reliability Organic EL display device having pixel division layer Evaluation at pixel division layer opening rate of 25% | | |
|---|---|---|---|---|---|---|
| | Composition | Type of light shielding material (a) (mixing ratio in light shielding material (a) (weight %)) | | Area percentage of light emitting part after 1 hour | Area percentage of light emitting part after 500 hours | Area percentage of light emitting part after 1000 hours |
| Comparative Example 13 | Negative photosensitive composition 39 | Pigment Yellow 147 (35) | Pigment Violet 29 (65) | A | B | D |

TABLE 22-continued

| | | | | | | |
|---|---|---|---|---|---|---|
| Comparative Example 14 | Negative photosensitive composition 40 | Pigment Yellow 155 (35) | Pigment Violet 29 (65) | A | B | D |
| Comparative Example 15 | Negative photosensitive composition 41 | Pigment Yellow 55 (35) | Pigment Violet 29 (65) | A | C | D |
| Comparative Example 16 | Negative photosensitive composition 42 | Pigment Yellow 74 (35) | Pigment Violet 29 (65) | A | C | D |
| Comparative Example 17 | Negative photosensitive composition 43 | Pigment Yellow 83 (35) | Pigment Violet 29 (65) | A | C | D |
| Comparative Example 18 | Negative photosensitive composition 44 | Pigment Yellow 138 (35) | Pigment Violet 29 (65) | A | B | D |
| Comparative Example 19 | Negative photosensitive composition 45 | Pigment Yellow 139 (30) | Pigment Violet 29 (65) | A | D | E |
| Comparative Example 20 | Negative photosensitive composition 46 | Pigment Yellow 150 (35) | Pigment Violet 29 (65) | A | D | E |
| Comparative Example 21 | Negative photosensitive composition 47 | Pigment Orange 13 (35) | Pigment Violet 29 (65) | A | D | E |
| Comparative Example 22 | Negative photosensitive composition 48 | Pigment Orange 62 (35) | Pigment Violet 29 (65) | A | D | E |

(3) Evaluation of light-emitting reliability

| | Organic EL display device having pixel division layer Evaluation at pixel division layer opening rate of 18% | | | Organic EL display device having pixel division layer and planarization layer Evaluation at pixel division layer opening rate of 18% | | |
|---|---|---|---|---|---|---|
| | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Comparative Example 13 | A | C | D | A | C | D |
| Comparative Example 14 | A | C | D | A | C | D |
| Comparative Example 15 | A | C | E | A | C | E |
| Comparative Example 16 | A | C | E | A | C | E |
| Comparative Example 17 | A | C | E | C | D | E |
| Comparative Example 18 | A | C | E | A | E | E |
| Comparative Example 19 | A | D | E | A | E | E |
| Comparative Example 20 | A | D | E | A | E | E |
| Comparative Example 21 | A | D | E | A | D | E |
| Comparative Example 22 | A | D | E | A | D | E |

TABLE 23

| | Composition | Type of light shielding material (a) (mixing ratio in light shielding material (a) (weight %)) | | (1) Evaluation of optical properties | | (2) Evaluation of permittivity (1 kHz) |
|---|---|---|---|---|---|---|
| | | | | (i) Optical density (OD value) | (ii) Difference between maximum light transmittance in wavelength range of 380 to 450 nm and light transmittance at wavelength of 550 nm | |
| Comparative Example 23 | Negative photosensitive composition 49 | Pigment Orange 64 (35) | Pigment Violet 29 (65) | 1.1 | C | 3.6 |
| Comparative Example 24 | Negative photosensitive composition 50 | Pigment Green 7 (35) | Pigment Violet 29 (65) | 1.1 | B | 4.1 |
| Comparative Example 25 | Negative photosensitive composition 51 | Pigment Yellow 150 (35) | Pigment Violet 29 (65) | 1.1 | C | 4.1 |
| Comparative Example 26 | Negative photosensitive composition 52 | Pigment Black 7 (100) | — | 1.0 | A | 15.4 |
| Comparative Example 27 | Negative photosensitive composition 53 | Pigment Blue 15:6 (50) | Pigment Red 254 (50) | 1.1 | E | 4.1 |
| Comparative Example 28 | Negative photosensitive composition 54 | Pigment Blue 60 (50) | Pigment Red 179 (50) | 1.1 | E | 3.6 |
| Comparative Example 29 | Negative photosensitive composition 55 | Pigment Blue 15:6 (50) | Pigment Red 179 (50) | 1.1 | E | 4.1 |
| Comparative Example 30 | Negative photosensitive composition 56 | Pigment Blue 15:6 (40) | Pigment Red 179 (60) | 1.1 | E | 4.0 |
| Comparative Example 31 | Negative photosensitive composition 57 | Pigment Blue 15:6 (60) | Pigment Red 179 (40) | 1.2 | E | 4.2 |

TABLE 24

| | Composition | Type of light shielding material (a) (mixing ratio in light shielding material (a) (weight %)) | | (3) Evaluation of light-emitting reliability Organic EL display device having pixel division layer Evaluation at pixel division layer opening rate of 25% | | |
|---|---|---|---|---|---|---|
| | | | | Area percentage of light emitting part after 1 hour | Area percentage of light emitting part after 500 hours | Area percentage of light emitting part after 1000 hours |
| Comparative Example 23 | Negative photosensitive composition 49 | Pigment Orange 64 (35) | Pigment Violet 29 (65) | A | D | E |
| Comparative Example 24 | Negative photosensitive composition 50 | Pigment Green 7 (35) | Pigment Violet 29 (65) | B | C | D |
| Comparative Example 25 | Negative photosensitive composition 51 | Pigment Yellow 150 (35) | Pigment Violet 29 (65) | A | D | E |

TABLE 24-continued

| | | | | | | | |
|---|---|---|---|---|---|---|---|
| Comparative Example 26 | Negative photosensitive composition 52 | Pigment Black 7 (100) | — | F | F | F | |
| Comparative Example 27 | Negative photosensitive composition 53 | Pigment Blue 15:6 (50) | Pigment Red 254 (50) | A | A | A | |
| Comparative Example 28 | Negative photosensitive composition 54 | Pigment Blue 60 (50) | Pigment Red 179 (50) | A | A | A | |
| Comparative Example 29 | Negative photosensitive composition 55 | Pigment Blue 15:6 (50) | Pigment Red 179 (50) | A | A | A | |
| Comparative Example 30 | Negative photosensitive composition 56 | Pigment Blue 15:6 (40) | Pigment Red 179 (60) | A | A | A | |
| Comparative Example 31 | Negative photosensitive composition 57 | Pigment Blue 15:6 (60) | Pigment Red 179 (40) | A | A | A | |

(3) Evaluation of light-emitting reliability

| | Organic EL display device having pixel division layer Evaluation at pixel division layer opening rate of 18% | | | Organic EL display device having pixel division layer and planarization layer Evaluation at pixel division layer opening rate of 18% | | |
|---|---|---|---|---|---|---|
| | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Comparative Example 23 | A | E | E | A | E | E |
| Comparative Example 24 | A | C | E | B | C | E |
| Comparative Example 25 | A | D | E | A | E | E |
| Comparative Example 26 | F | F | F | F | F | F |
| Comparative Example 27 | A | B | C | A | B | D |
| Comparative Example 28 | A | A | B | A | A | B |
| Comparative Example 29 | A | A | B | A | A | B |
| Comparative Example 30 | A | A | B | A | A | C |
| Comparative Example 31 | A | A | B | A | A | C |

Figure 2:
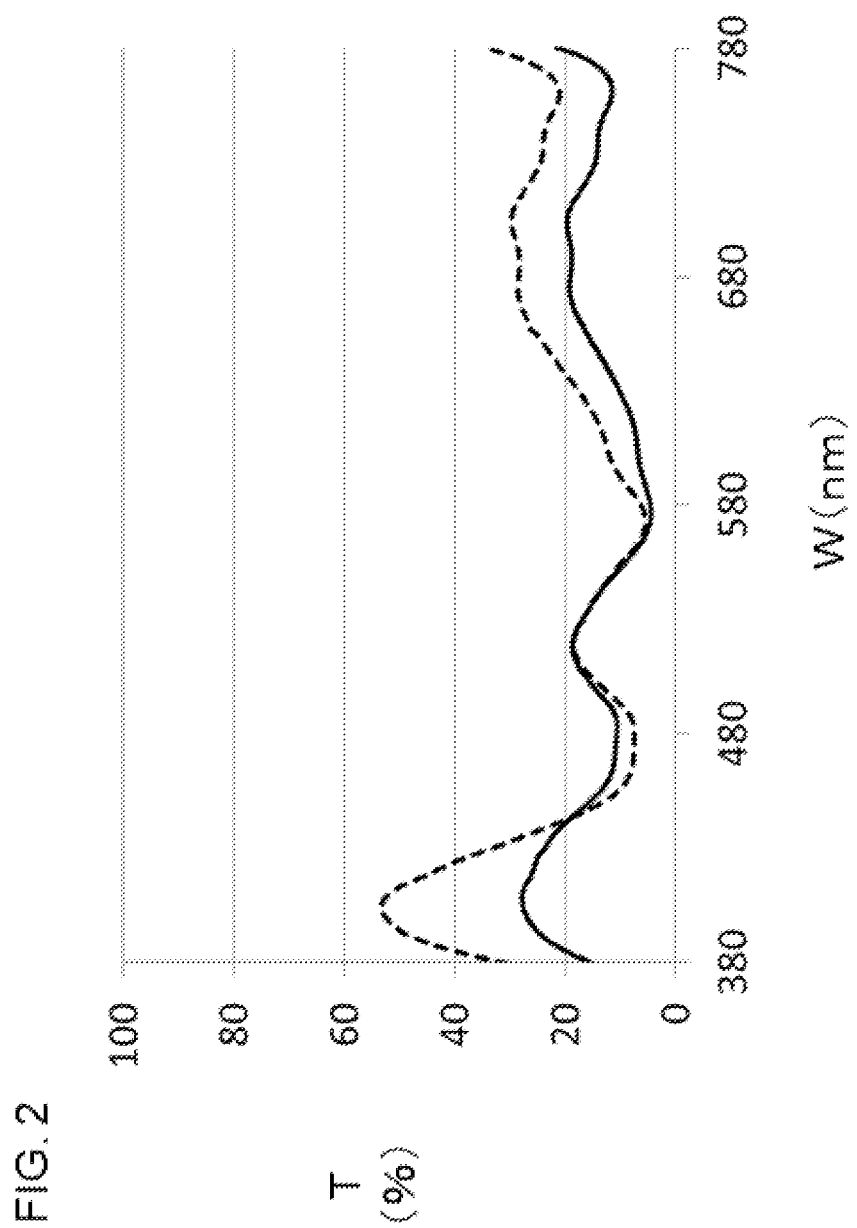
FIG. 2 is a view showing the light transmittance spectrum of the cured film of Example 12 by a solid line and a light transmittance spectrum of the cured film of Comparative Example 29 by a broken line.

Spectrum of the light transmittance T (%) in relation to the wavelength W (nm) is shown in FIG. 2. The light transmittance spectrum of the cured film in Example 12 is shown by a solid line, and the light transmittance spectrum of the cured film in Comparative Example 29 is shown by a broken line. Compared to the cured film of Comparative Example 29, the cured film of Example 12 exhibits smaller difference between the maximum light transmittance in the wavelength region of 380 to 450 nm and the light transmittance at the wavelength of 550 nm, and hence, a much superior optical properties despite the equivalent optical density.

Examples 27 and 28 and Comparative Examples 32 and 33

The procedure of Example 1 was repeated except that the negative photosensitive composition 1 was respectively replaced with positive photosensitive compositions 1 to 4, and a positive exposure mask wherein the opening and the light shielding part were switched from the negative exposure mask was used to produce the cured films and the organic EL display device, and the optical properties, the permittivity, and the light-emitting reliability were evaluated by the procedure as described above. The positive photosensitive compositions and the evaluation results are shown in Tables 25 and 26. It is to be noted that, in Examples 27 and 28 and Comparative Examples 32 and 33, the procedure of Example 1 was repeated using the photosensitive composition to respectively form the pixel division layer and planarization layer of the organic EL display device by using the same photosensitive composition.

TABLE 25

| | Composition | Type of light shielding material (a) (mixing ratio in light shielding material (a) (weight %)) | | | (1) Evaluation of optical properties | | (2) Evaluation of permittivity (1 kHz) |
|---|---|---|---|---|---|---|---|
| | | | | | (i) Optical density (OD value) | (ii) Difference between maximum light transmittance in wavelength range of 380 to 450 nm and light transmittance at wavelength of 550 nm | |
| Example 27 | Positive photosensitive composition 1 | Pigment Yellow 192 (30) | Pigment Blue 60 (40) | Pigment Red 179 (30) | 0.6 | B | 3.6 |
| Example 28 | Positive photosensitive composition 2 | Pigment Yellow 192 (35) | Pigment Violet 29 (65) | — | 0.6 | B | 3.6 |
| Comparative Example 32 | Positive photosensitive composition 3 | Pigment Yellow 150 (30) | Pigment Blue 60 (40) | Pigment Red 179 (30) | 0.6 | B | 4.1 |
| Comparative Example 33 | Positive photosensitive composition 4 | Pigment Yellow 150 (35) | Pigment Violet 29 (65) | — | 0.6 | B | 4.1 |

TABLE 26

| | Composition | Type of light shielding material (a) (mixing ratio in light shielding material (a) (weight %)) | | | (3) Evaluation of light-emitting reliability Organic EL display device having pixel division layer Evaluation at pixel division layer opening rate of 25% | | |
|---|---|---|---|---|---|---|---|
| | | | | | Area percentage of light emitting part after 1 hour | Area percentage of light emitting part after 500 hours | Area percentage of light emitting part after 1000 hours |
| Example 27 | Positive photosensitive composition 1 | Pigment Yellow 192 (30) | Pigment Blue 60 (40) | Pigment Red 179 (30) | A | A | A |
| Example 28 | Positive photosensitive composition 2 | Pigment Yellow 192 (35) | Pigment Violet 29 (65) | — | A | A | A |
| Comparative Example 32 | Positive photosensitive composition 3 | Pigment Yellow 150 (30) | Pigment Blue 60 (40) | Pigment Red 179 (30) | A | D | E |
| Comparative Example 33 | Positive photosensitive composition 4 | Pigment Yellow 150 (35) | Pigment Violet 29 (65) | — | A | D | E |

| | (3) Evaluation of light-emitting reliability | | | | | |
|---|---|---|---|---|---|---|
| | Organic EL display device having pixel division layer Evaluation at pixel division layer opening rate of 18% | | | Organic EL display device having pixel division layer and planarization layer Evaluation at pixel division layer opening rate of 18% | | |
| | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Example 27 | A | A | B | A | A | B |
| Example 28 | A | A | B | A | A | B |
| Comparative Example 32 | A | D | E | A | D | E |

TABLE 26-continued

| Comparative Example 33 | A | D | E | A | D | E |

Preparation Example 100

37.50 g of SOLSPERSE 20000 was mixed with 850.00 g of PGMEA, and after stirring the mixture for 10 minutes, 32.63 g of C.I. Pigment Yellow 192 which is a yellow pigment having the benzimidazolone structure represented by the structural formula (1), 1.13 g of monosulfonation product of C.I. Pigment Yellow 192 represented by the structural formula (14), 45.00 g of C.I. Pigment Blue 60, and 33.75 g of C.I. Pigment Red 179 were injected. After stirring for 30 minutes, the mixture was subjected to wet media dispersion treatment by circulation system in a horizontal bead mill filled with zirconia beads (diameter, 0.4 mm) for 30 minutes, and then, wet media dispersion treatment by circulation system in a horizontal bead mill filled with zirconia beads (diameter, 0.05 mm) for 1 hour to prepare pigment dispersion liquid 38 having a solid content 15% by weight. The amounts (g) of the starting materials used are shown in Table 27.

following structural formula (30), 45.00 g of C.I. Pigment Blue 60, and 33.75 g of C.I. Pigment Red 179 were injected. After stirring for 30 minutes, the mixture was subjected to wet media dispersion treatment by circulation system in a horizontal bead mill filled with zirconia beads (diameter, 0.4 mm) for 30 minutes, and then, wet media dispersion treatment by circulation system in a horizontal bead mill filled with zirconia beads (diameter, 0.05 mm) for 1 hour to prepare pigment dispersion liquid 40 having a solid content 15% by weight. The amounts (g) of the starting materials used are shown in Table 27. It is to be noted that the C.I. Pigment Yellow 154 is a yellow pigment having the benzimidazolone structure represented by the structural formula (1) and containing fluorine atom as the halogen in the molecule.

TABLE 27

| | Pigment dispersion liquid | Colour Index Generic name | Benzimidazolone structure represented by structural formula (1) | Weight (g) | Dispersant (SOLSPERSE 20000) Weight (g) | Solvent (PGMEA) Weight (g) |
|---|---|---|---|---|---|---|
| Preparation Example 100 | Pigment dispersion liquid 38 | Pigment Yellow 192 | Yes | 32.63 | 37.50 | 850.00 |
| | | Monosulfonation product of pigment Yellow 192 | Monosulfonation product of pigment Yellow 192 | 1.13 | | |
| | | Pigment Blue 60 | No | 45.00 | | |
| | | Pigment Red 179 | No | 33.75 | | |
| Preparation Example 101 | Pigment dispersion liquid 39 | Pigment Yellow 194 | Yes | 32.63 | 37.50 | 850.00 |
| | | Monosulfonation product of pigment Yellow 194 | Yes | 1.13 | | |
| | | Pigment Blue 60 | No | 45.00 | | |
| | | Pigment Red 179 | No | 33.75 | | |
| Preparation Example 102 | Pigment dispersion liquid 40 | Pigment Yellow 154 | Yes | 33.75 | 37.50 | 850.00 |
| | | Pigment Blue 60 | No | 45.00 | | |
| | | Pigment Red 179 | No | 33.75 | | |
| Preparation Example 103 | Pigment dispersion liquid 41 | Pigment Yellow 150 | No | 33.75 | 37.50 | 850.00 |
| | | Pigment Blue 60 | No | 45.00 | | |
| | | Pigment Red 179 | No | 33.75 | | |

Preparation Example 101

The procedure of Preparation Example 100 was repeated except that C.I. Pigment Yellow 194 was used instead of C.I. Pigment Yellow 192, and monosulfonation product of C.I. Pigment Yellow 194 represented by the structural formula (13) was used instead of the monosulfonation product of C.I. Pigment Yellow 192 represented by the structural formula (14) to prepare pigment dispersion liquid 39 having a solid content of 15% by weight. The amounts (g) of the starting materials used are shown in Table 27.

Preparation Example 102

37.50 g of SOLSPERSE 20000 was mixed with 850.00 g of PGMEA, and after stirring the mixture for 10 minutes, 33.75 g of C.I. Pigment Yellow 154 represented by the

[Chemical formula 21]

(30)

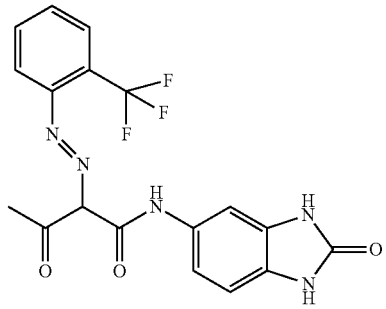

Preparation Example 103

The procedure of Preparation Example 102 was repeated except that C.I. Pigment Yellow 150 represented by the following structural formula (31) which is a nickel-containing organic metal complex yellow pigment not having the benzimidazolone structure represented by the structural formula (1) was used instead of C.I. Pigment Yellow 154 to prepare pigment dispersion liquid 41 having a solid content of 15% by weight. The amounts (g) of the starting materials used are shown in Table 27.

[Chemical formula 22]

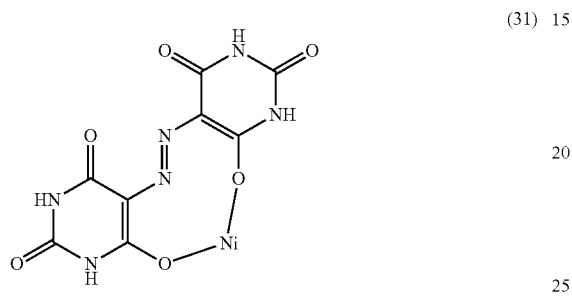

(31)

Preparation Example 104

22.00 g of pigment dispersion liquid 38, 5.63 g of polyimide resin solution A, 1.69 g of DPCA-60, 0.45 g of NCI-831, 0.38 g of VG-3101L, and 11.36 g of PGMEA and 8.50 g of MBA were mixed, and after tight sealing, the mixture was stirred for 30 minutes on a shaker to prepare a negative photosensitive composition 58 having a solid content of 15% by weight. The amounts (g) of the starting materials used are shown in Table 28.

TABLE 28

| | Composition | Pigment dispersion liquid Name | Pigment dispersion liquid Weight (g) | Polyimide resin solution A Weight (g) | Compound having 2 or more radical-polymerizable groups (DPCA-60) Weight (g) | Photoinitiator (NCI-831) Weight (g) | Thermal crosslinking agent (VG-3101L) Weight (g) | Solvent (PGMEA) Weight (g) | Solvent (MBA) Weight (g) |
|---|---|---|---|---|---|---|---|---|---|
| Preparation Example 104 | Negative photosensitive composition 58 | Pigment dispersion liquid 38 | 22.00 | 5.63 | 1.69 | 0.45 | 0.38 | 11.36 | 8.50 |
| Preparation Example 105 | Negative photosensitive composition 59 | Pigment dispersion liquid 39 | 22.00 | 5.63 | 1.69 | 0.45 | 0.38 | 11.36 | 8.50 |
| Preparation Example 106 | Negative photosensitive composition 60 | Pigment dispersion liquid 40 | 22.00 | 5.63 | 1.69 | 0.45 | 0.38 | 11.36 | 8.50 |
| Preparation Example 107 | Negative photosensitive composition 61 | Pigment dispersion liquid 41 | 22.00 | 5.63 | 1.69 | 0.45 | 0.38 | 11.36 | 8.50 |

Preparation Example 105 to 107

The procedure of Preparation Example 104 was repeated except that pigment dispersion liquids 39 to 41 were respectively used instead of the pigment dispersion liquid 38 to prepare negative photosensitive compositions 59 to 61 having a solid content of 15% by weight. The amounts (g) of the starting materials used are shown in Table 28.

Example 29

The procedure of Example 1 was repeated except that negative photosensitive composition 58 was used instead of the negative photosensitive composition 1 to prepare a cured film and an organic EL display device, and the optical properties, the permittivity, and the light-emitting reliability were evaluated by the procedures as described above. The results of the evaluation are shown in Tables 29 and 30.

TABLE 29

| | Composition | Type of light shielding material (a) (mixing ratio in the light shielding material (a) (weight %)) | | | | (1) Evaluation of optical properties | | (2) Evaluation of permittivity (1 kHz) |
|---|---|---|---|---|---|---|---|---|
| | | | | | | (i) Optical density (OD value) | (ii) Difference between the maximum light transmittance in wavelength range of 380 to 450 nm and light transmittance at wavelength of 550 nm | |
| Example 29 | Negative photosensitive composition 58 | Pigment Yellow 192 (29) | Monosulfonation product of pigment Yellow 192 (1) | Pigment Blue 60 (40) | Pigment Red 179 (30) | 1.0 | A | 3.6 |
| Example 30 | Negative photosensitive composition 59 | Pigment Yellow 194 (29) | Monosulfonation product of pigment Yellow 194 (1) | Pigment Blue 60 (40) | Pigment Red 179 (30) | 1.0 | A | 3.6 |
| Example 31 | Negative photosensitive composition 60 | Pigment Yellow 154 (30) | — | Pigment Blue 60 (40) | Pigment Red 179 (30) | 1.0 | A | 3.6 |
| Comparative Example 34 | Negative photosensitive composition 61 | Pigment Yellow 150 (30) | — | Pigment Blue 60 (40) | Pigment Red 179 (30) | 1.0 | B | 3.9 |

TABLE 30

| | Composition | Type of light shielding material (a) (mixing ratio in light shielding material (a) (weight %)) | | | | (3) Evaluation of light-emitting reliability Organic EL display device having pixel division layer Evaluation at pixel division layer opening rate of 25% | | |
|---|---|---|---|---|---|---|---|---|
| | | | | | | Area percentage of light emitting part after 1 hour | Area percentage of light emitting part after 500 hours | Area percentage of light emitting part after 1000 hours |
| Example 29 | Negative photosensitive composition 58 | Pigment Yellow 192 (29) | Monosulfonation product of pigment Yellow 192 (1) | Pigment Blue 60 (40) | Pigment Red 179 (30) | A | A | A |
| Example 30 | Negative photosensitive composition 59 | Pigment Yellow 194 (29) | Monosulfonation product of pigment Yellow 194 (1) | Pigment Blue 60 (40) | Pigment Red 179 (30) | A | A | B |
| Example 31 | Negative photosensitive composition 60 | Pigment Yellow 154 (30) | — | Pigment Blue 60 (40) | Pigment Red 179 (30) | A | B | C |
| Comparative Example 34 | Negative photosensitive composition 61 | Pigment Yellow 154 (30) | — | Pigment Blue 60 (40) | Pigment Red 179 (30) | A | D | E |

TABLE 30-continued

|  | (3) Evaluation of light-emitting reliability | | | | | |
|---|---|---|---|---|---|---|
|  | Organic EL display device having pixel division layer Evaluation at pixel division layer opening rate of 18% | | | Organic EL display device having pixel division layer and planarization layer Evaluation at pixel division layer opening rate of 18% | | |
|  | Area percentage of light emitting part after 1 hour | Area percentage of light emitting part after 500 hours | Area percentage of light emitting part after 1000 hours | Area percentage of light emitting part after 1 hour | Area percentage of light emitting part after 500 hours | Area percentage of light emitting part after 1000 hours |
| Example 29 | A | A | B | A | A | B |
| Example 30 | A | A | B | A | A | C |
| Example 31 | A | B | C | A | C | C |
| Comparative Example 34 | A | D | E | A | E | E |

Examples 30 and 31 and Comparative Example 34

The procedure of Example 1 was repeated except that negative photosensitive compositions 59 to 61 were respectively used instead of the negative photosensitive composition 1 to prepare a cured film and an organic EL display device, and the optical properties, the permittivity, and the light-emitting reliability were evaluated by the procedures as described above. The results of the evaluation are shown in Tables 29 and 30.

The results of Examples 1 to 31 reveal that excellent optical properties and a high light-emitting reliability can be simultaneously realized by improving light-shielding properties in the wavelength region of 380 to 450 nm by using a yellow pigment having the benzimidazolone structure represented by the structural formula (1). Of these Examples, particularly high light-emitting reliability was achieved in Examples 1, 8, and 9 prepared by using C.I. Pigment Yellow 192.

The results also demonstrate that, compared to Example 17 using C.I. Pigment Red 254, higher light-emitting reliability is realized in Examples 12 and 14 to 16 using C.I. Pigment Red 179, 123, 149, and 190 which are perylene red pigments.

The results also demonstrate that, compared to Example 23 using C.I. Pigment Violet 23 having chlorine atom as the halogen in the molecule, higher light-emitting reliability is realized in Examples 20 to 22 using a violet pigment such as C.I. Pigment Reds 19, 29, and 37 not having the halogen in the molecule.

The results of Examples 1, 18, 19, 20, 24, and 25 reveal that, compared to the cardo resin, a higher light-emitting reliability was realized by using a polyimide resin having the structural unit represented by the general formula (28).

The results of Comparative Examples 1 to 8 reveal that, the light-emitting reliability was inferior to Comparative Examples 27 to 31 due to the improvement in the light-shielding properties in the wavelength region of 380 to 450 nm by using a yellow pigment not having the benzimidazolone structure represented by the structural formula (1).

The results of Comparative Examples 9 to 11 reveal that the light-emitting reliability was inferior when the light-shielding properties in the wavelength region of 380 to 450 nm was improved by using an orange pigment irrespective of the presence of the benzimidazolone structure represented by the structural formula (1). In addition, comparison with the Examples reveals that the problems of the invention cannot be solved unless the pigment having the benzimidazolone structure represented by the structural formula (1) is used as the yellow pigment.

The results of Comparative Examples 12 to 26 reveal that the initial light-emitting properties are adversely affected by the excessively increased permittivity as a result of developing of light-shielding properties in the wavelength region of 380 to 450 nm by using carbon black.

The results of Comparative Examples 13 to 22 reveal that no improvement is realized in the light-emitting properties even if the pigment used by mixing with the yellow pigment or the orange pigment not having the benzimidazolone structure was changed to a violet pigment.

The results of Comparative Example 24 reveal that, when compared with Comparative Examples 27 to 31, the light-emitting reliability was inferior due to improvement in the light-shielding properties in the wavelength region of 380 to 450 nm by using C.I. Pigment Green 7 which is a polychlorinated copper phthalocyanine.

The results of Comparative Examples 27 to 31 reveal that while the problem in the light-emitting reliability is not observed when an organic blue pigment and an organic red pigment are solely mixed, the optical properties were inferior due to the insufficient light-shielding properties in the wavelength region of 380 to 450 nm.

As demonstrated by the results as described above, in the organic EL display device including a first electrode, a pixel division layer, a light emitting pixel, a second electrode, a planarization layer, and a substrate, excellent optical properties and excellent light-emitting properties are simultaneously realized and the problems of the invention are solved by the organic EL display device wherein the pixel division layer and/or the planarization layer contains a yellow pigment having a benzimidazolone structure represented by the structural formula (1).

INDUSTRIAL APPLICABILITY

The organic EL display device of the present invention can be used in the applications where a high visibility and a high light-emitting reliability are required, for example, in electronic appliances such as smart phone, TV, and personal computers.

EXPLANATION OF NUMERALS

1: TFT
2: wiring line
3: TFT insulating film
4: planarization layer
5: second electrode
6: substrate
7: contact hole
8: pixel division layer
9: light emitting pixel (organic EL layer)
10: first electrode
11: alkali-free glass substrate
12: metal reflective layer
13: second electrode (ITO electrode)
14: auxiliary electrode (ITO electrode)
15: pixel division layer
16: light emitting pixel (organic EL layer)
17: first electrode
18: alkali-free glass substrate
19: planarization layer
20: second electrode (ITO electrode)
21: auxiliary electrode (ITO electrode)
22: pixel division layer
23: light emitting pixel (organic EL layer)
24: first electrode

The invention claimed is:

1. An organic EL display device comprising a first electrode, a pixel division layer, a light emitting pixel, a second electrode, a planarization layer, and a substrate, wherein
the pixel division layer and/or the planarization layer contains a yellow pigment having a benzimidazolone structure represented by the following structural formula (1):

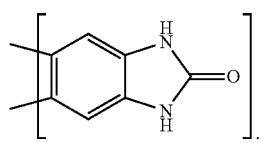

(1)

2. The organic EL display device according to claim 1, wherein the yellow pigment having a benzimidazolone structure represented by the structural formula (1) contains C.I. Pigment Yellow 192 represented by the following structural formula (7):

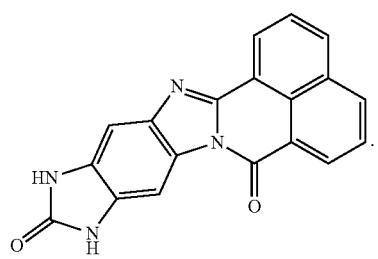

(7)

3. The organic EL display device according to claim 1, wherein the pixel division layer and/or the planarization layer has a permittivity at frequency of 1 kHz of up to 4.0 and an optical density per 1.0 μm of film thickness of at least 0.5.

4. The organic EL display device according to claim 1, wherein the pixel division layer and/or the planarization layer further comprises a blue pigment and a red pigment, the blue pigment being at least one member selected from the group consisting of C.I. Pigment Blue 15:3, C.I. Pigment Blue 15:4, C.I. Pigment Blue 15:6, and C.I. Pigment Blue 60, and the red pigment being at least one member selected from the group consisting of C.I. Pigment Red 123, C.I. Pigment Red 149, C.I. Pigment Red 177, C.I. Pigment Red 179, and C.I. Pigment Red 190.

5. The organic EL display device according to claim 1, wherein the pixel division layer and/or the planarization layer further comprises a violet pigment, the violet pigment being at least one member selected from the group consisting of C.I. Pigment Violet 19, C.I. Pigment Violet 29, and C.I. Pigment Violet 37.

6. The organic EL display device according to claim 1, wherein display area of the pixel division layer has an opening rate of up to 20%.

7. The organic EL display device according to claim 1, wherein the pixel division layer and/or the planarization layer comprises a cured product of a photosensitive composition having negative photosensitivity or positive photosensitivity, the photosensitive composition comprising a photosensitizer and a polyimide resin having a structural unit represented by the following general formula (28):

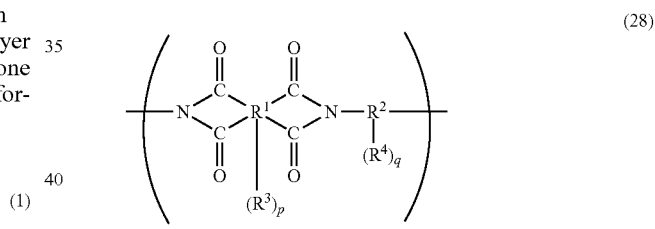

(28)

wherein, in the general formula (28), $R^1$ represents a tetravalent to decavalent organic group, $R^2$ represents divalent to octavalent organic group, $R^3$ and $R^4$ independently represent a phenolic hydroxy group, sulfonate group, or thiol group, and p and q independently represent a number in the range of 0 to 6.

8. The organic EL display device according to claim 7, wherein the photosensitizer contains a photoinitiator and the photosensitizer has negative photosensitivity.

9. The organic EL display device according to claim 8, wherein the photosensitive composition further contains a cardo resin.

10. The organic EL display device according to claim 7, wherein, in the photosensitive composition, the content of the yellow pigment in the entire pigment is 10% by weight to 40% by weight, and content of the yellow pigment having the benzimidazolone structure represented by the structural formula (1) in the entire yellow pigment is at least 50% by weight.

11. The organic EL display device according to claim 7, wherein the photosensitizer contains a photo acid generator, and the photosensitizer has positive photosensitivity.

* * * * *